United States Patent
Okayama et al.

(10) Patent No.: US 8,471,289 B2
(45) Date of Patent: Jun. 25, 2013

(54) SEMICONDUCTOR LASER DEVICE, OPTICAL PICKUP DEVICE AND SEMICONDUCTOR DEVICE

(75) Inventors: Yoshio Okayama, Moriyama (JP); Yasunori Inoue, Ogaki (JP); Takenori Goto, Moriguchi (JP); Kazushi Mori, Hirakata (JP); Yuuki Ota, Ako (JP); Naoteru Matsubara, Kaiduka (JP)

(73) Assignee: Sanyo Electric Co., Ltd., Osaka (JP)

( * ) Notice: Subject to any disclaimer, the term of this patent is extended or adjusted under 35 U.S.C. 154(b) by 8 days.

(21) Appl. No.: 12/980,023

(22) Filed: Dec. 28, 2010

(65) Prior Publication Data
US 2011/0158273 A1      Jun. 30, 2011

(30) Foreign Application Priority Data

Dec. 28, 2009 (JP) .................. 2009-298415
Mar. 31, 2010 (JP) .................. 2010-083911

(51) Int. Cl.
*H01L 33/00* (2010.01)

(52) U.S. Cl.
USPC .......... 257/99; 257/731; 257/732; 257/687; 257/678; 257/686; 257/738; 257/787; 257/E23.128; 257/E33.069; 438/26; 438/27; 438/121; 438/125; 372/43.01; 372/50.1

(58) Field of Classification Search
USPC ............... 372/43.01–50.1, 36; 257/99, 731, 257/732, 687, 678, 686, 738, 787, E23.128, 257/E33.069; 438/26, 25, 121, 125
See application file for complete search history.

(56) References Cited

U.S. PATENT DOCUMENTS

| | | | |
|---|---|---|---|
| 2003/0153108 A1* | 8/2003 | Durocher et al. ............. | 438/26 |
| 2004/0208210 A1* | 10/2004 | Inoguchi ................. | 372/36 |
| 2005/0194670 A1* | 9/2005 | Kameyama et al. ......... | 257/678 |
| 2006/0193108 A1* | 8/2006 | Usui et al. ................ | 361/600 |
| 2007/0108634 A1* | 5/2007 | Higashi et al. ............ | 257/787 |
| 2007/0176303 A1* | 8/2007 | Murai et al. .............. | 257/787 |
| 2008/0079151 A1* | 4/2008 | Okayama ................. | 257/737 |
| 2008/0272473 A1* | 11/2008 | Matsumoto et al. ......... | 257/680 |
| 2009/0321119 A1* | 12/2009 | Kohara et al. ............. | 174/260 |
| 2011/0079811 A1* | 4/2011 | Lin et al. ................ | 257/98 |
| 2011/0140135 A1* | 6/2011 | Lee et al. ................ | 257/88 |
| 2011/0158273 A1* | 6/2011 | Okayama et al. ........... | 372/43.01 |
| 2011/0248311 A1* | 10/2011 | Kim et al. ................ | 257/99 |
| 2012/0138961 A1* | 6/2012 | Huang et al. .............. | 257/81 |
| 2012/0161194 A1* | 6/2012 | Matsuda et al. ............ | 257/99 |
| 2012/0286387 A1* | 11/2012 | Nabe et al. ............... | 257/433 |

FOREIGN PATENT DOCUMENTS

| | | |
|---|---|---|
| JP | 04-196189 | 7/1992 |
| JP | 2004-255487 | 9/2004 |
| JP | 2006-147751 | 6/2006 |

* cited by examiner

*Primary Examiner* — Tod T Van Roy
*Assistant Examiner* — Delma R Forde
(74) *Attorney, Agent, or Firm* — McDermott Will & Emery LLP

(57) ABSTRACT

A semiconductor laser device includes a Si(100) substrate in which a recess having an opening and a bottom face surrounded by inner wall surfaces is formed, a semiconductor laser element placed on the bottom face, and a translucent sealing glass, mounted on top of the Si(100) substrate, which seals the opening. The laser light emitted from the semiconductor laser element is reflected by a metallic reflective film formed on the inner wall surface and then transmits through the sealing glass so as to be emitted externally.

10 Claims, 38 Drawing Sheets

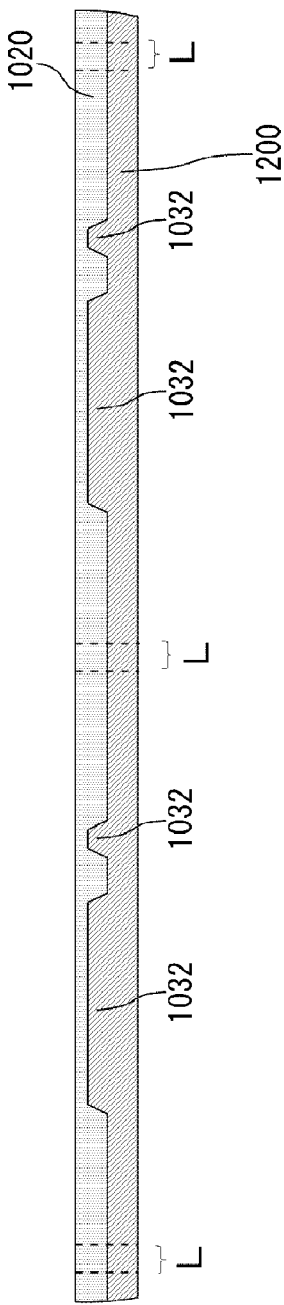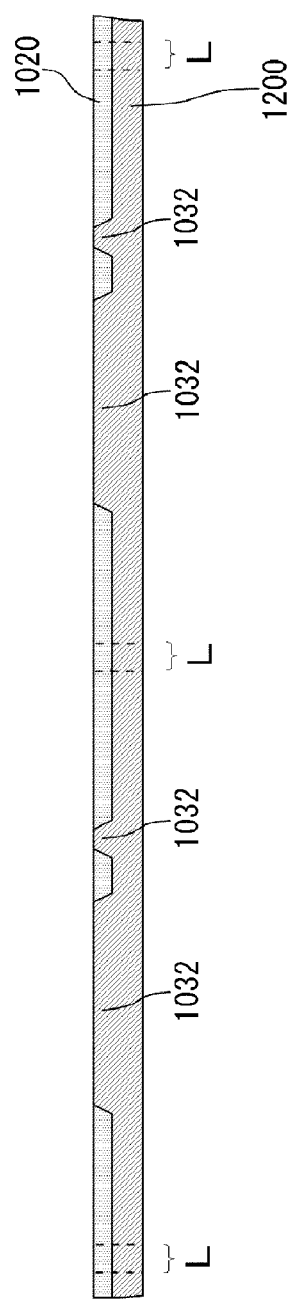
FIG.31A
FIG.31B

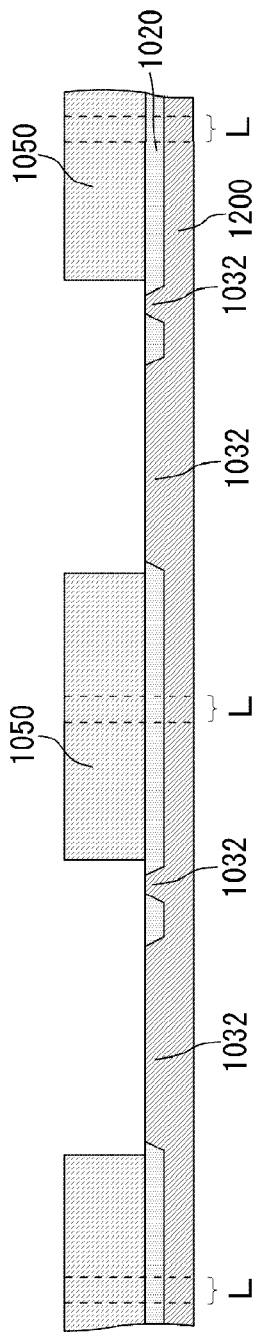
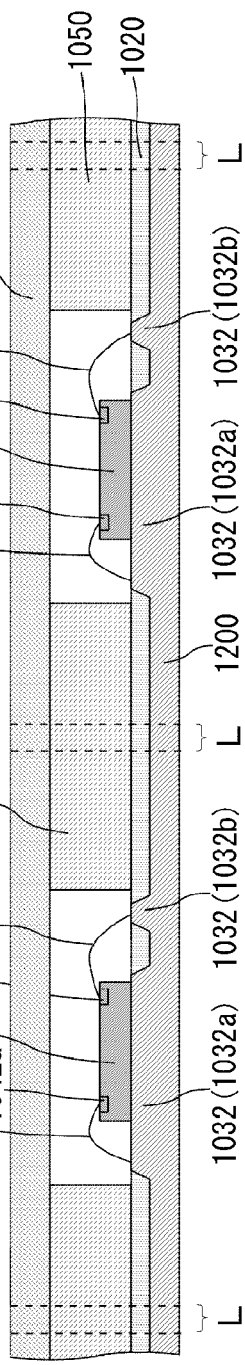
FIG.32A
FIG.32B
FIG.32C

SEMICONDUCTOR LASER DEVICE, OPTICAL PICKUP DEVICE AND SEMICONDUCTOR DEVICE

This application is based upon and claims the benefit of priority from the prior Japanese Patent Applications No. 2009-298415, filed on Dec. 28, 2009 and Japanese Patent Application No. 2010-083911, filed on Mar. 31, 2010, the entire contents of which are incorporated herein by reference.

BACKGROUND OF THE INVENTION

1. Field of the Invention

The present invention relates to a semiconductor laser device and an optical pickup device, and it particularly relates to a semiconductor laser device and an optical pickup device both employing a semiconductor laser element.

2. Description of the Related Art

The semiconductor laser element is conventionally in widespread use as a light source of an optical disk system, an optical communication system and the like. In particular, a semiconductor laser element emitting a laser light in the visible light band of about 380 nm to about 780 nm is in practical use as the light source for the recording and playback/reproduction of various types of optical disks for use in CD, DVD, BD and so forth. In recent years, along with the price reduction in the optical disk systems, it is expected nowadays that the overall size and the thickness of a light source unit built in the optical disk system be reduced.

In the conventional practice, a semiconductor laser device in which the laser light is emitted to the semiconductor laser element and reflected upward so as to be emitted externally is known as the above-described semiconductor laser device used as the light source (See Reference (1) and Reference (2) in the following Related Art List, for instance).

Reference (1) discloses a semiconductor laser device equipped with (i) a silicon substrate, on which a recess in a stepped shape is provided, and (ii) a semiconductor laser element placed on the silicon substrate. In this semiconductor laser device as cited in Reference (1), the semiconductor laser element is placed on a bottom face of the recess (stepped portions) formed in the silicon substrate. Also, a tilted side surface (reflection mirror surface) that connects a surface (top face), on which side the recess is opened, to the bottom face of the recess is formed in the silicon substrate. And the semiconductor laser element is placed so that an emission edge surface of the laser light is positioned counter to the tilted side surface (reflection mirror surface) of the silicon substrate and separately apart therefrom by a predetermined distance. In this manner, the arrangement according to Reference (1) is such that the laser light emitted from the emission edge surface is reflected upward by the tilted side surface (reflection mirror surface) and then emitted externally. In this semiconductor laser device, the top face of the semiconductor laser element is protrudingly positioned above the surface (top face) on which side the recess of the silicon substrate is opened.

Reference (2) discloses an optical semiconductor device (semiconductor laser device) including (i) a semiconductor laser element placed on the bottom face of a package, having an opening therein, made of a resin, (ii) a transparent substrate that covers the opening of the package, and (iii) a mirror bonded on an underside of the transparent substrate and mounted within the package. In this optical semiconductor device as cited in Reference (2), the emission edge surface of the laser light in the semiconductor laser element is positioned counter to the reflection surface of the mirror and separately apart therefrom by a predetermined distance. In this manner, the arrangement according to Reference (2) is such that the laser light emitted from the emission edge surface is reflected upward by the reflection surface of the mirror and then emitted externally, so that thickness of the semiconductor laser device can be reduced.

RELATED ART LIST (1) Japanese Unexamined Patent Application Publication No. Hei04-196189.
(2) Japanese Unexamined Patent Application Publication No. 2006-147751.

When the semiconductor element is constituted by a nitride-based semiconductor and also the laser element placed within the package is operated while being exposed to atmosphere, foreign particles adhere to the emission edge surface of the laser element due to the fact that moisture in the air and organic materials existent on the periphery of the package are decomposed by the short-wavelength light. In this case, as the emission edge surface degrades, the optical output of the laser light drops. Further, the reliability of the laser element deteriorates, thereby creating an undesired situation. Accordingly, required is a package structure capable of air-tightly sealing the laser element constituted of a nitride-based semiconductor.

However, in the semiconductor laser device as cited in the Reference (1), the top face of the semiconductor laser element placed on the bottom face of the recess is protrudingly positioned above the surface (top face) on which side the recess of the silicon substrate is opened. This causes a problem that the opening of the recess of the silicon substrate cannot be easily blocked by or sealed off with a translucent sealing member.

In the optical semiconductor device as cited in Reference (2), the semiconductor laser element is placed on the package but the mirror reflecting the laser light is bonded to the transparent substrate. In other words, the inconvenience is caused by the installation errors of the semiconductor element relative to the package, the transparent substrate relative to the package, and the mirror relative to the transparent substrate, respectively. As a result, a problem arises that a large shift or displacement in the optical axis occurs in the laser light emitted after the reflection by the mirror due to the above-described respective install errors.

SUMMARY OF THE INVENTION

The present invention has been made to resolve the foregoing problems, and a purpose thereof is to provide a semiconductor laser device and an optical semiconductor laser device capable of easily sealing a package and reducing the shift or displacement in the optical axis occurring in the emitted laser.

In order to achieve the purpose, a semiconductor laser device according to a first aspect of the present invention comprises: a semiconductor substrate in which a recess is formed, the recess having a first opening and a bottom face surrounded by an inner wall surface; a semiconductor laser element placed on the bottom face; and a translucent sealing member for sealing the first opening, the sealing member being mounted on top of the semiconductor substrate, wherein a laser light emitted from the semiconductor laser element is reflected by a first region of the inner wall surface and then transmits through the sealing member so as to be emitted externally.

By employing the semiconductor laser device according to the first aspect of the present invention, the semiconductor laser device is, as described above, provided with (i) the semiconductor substrate, in which the recess having the first opening and the bottom face surrounded by the inner wall surfaces is formed, (ii) the semiconductor laser element placed on the bottom face, and (iii) the translucent sealing member, mounted on top of the semiconductor substrate, for sealing the first opening. Hence, the semiconductor laser element can be operated under the conditions where the semiconductor laser element is easily air-tightly sealed by the recess in the semiconductor substrate and the sealing member. As a result, the semiconductor laser element is not subject to the moisture in the air and the organic materials existent on the periphery of the semiconductor laser device and therefore the reduction in reliability of the semiconductor laser element can be suppressed.

In the first aspect thereof, there is provided the semiconductor substrate in which the recess having the first opening and the bottom face surrounded by the inner wall surfaces is formed, and the arrangement is such that the laser light emitted from the semiconductor laser element is reflected by the first region of the inner wall surface and then transmits through the sealing member so as to be emitted externally. Hence, a part of the inner wall surface of the recess of the semiconductor substrate on which the semiconductor laser element is placed may serve also as a means for reflecting the laser light. In other words, since the accuracy of the optical axis of the laser light reflected by the reflection means depends only on the installation error caused when the semiconductor laser element is to be placed on the bottom face of the recess, the magnitude of the shift or displacement in the optical axis can be reduced by as much as the reduced number of factors causing the shift or displacement in the optical axis.

Also, in the first aspect thereof, the bottom face of the recess is integrally formed with the inner wall surfaces of the recess, so that the structure can be simplified accordingly.

A semiconductor laser device according to a second aspect of the present invention comprises: a semiconductor substrate in which a through-hole penetrating in a thickness direction is formed; a sealing member for sealing a first opening of the through-hole, the sealing member being mounted on top of the semiconductor substrate; a support base for sealing a second opening of the through-hole disposed opposite to the first opening thereof, the support base being mounted on an underside of the semiconductor substrate; and a semiconductor laser element placed within a recess, the recess having an inner wall surface of the through-hole and a bottom face constituted by a surface of the support base exposed within the second opening, wherein the semiconductor laser element is placed on the bottom face, and wherein a laser light emitted from the semiconductor laser element is reflected by a first region of the inner wall surface of the through-hole and then transmits through the sealing member so as to be emitted externally.

By employing the semiconductor laser device according to the second aspect of the present invention, the semiconductor laser device is, as described above, provided with (i) the semiconductor substrate in which the through-hole penetrating in a thickness direction is formed, (ii) the sealing member, mounted on top of the semiconductor substrate, for sealing the first opening of the through-hole, (iii) the support base, mounted on an underside of the semiconductor substrate, for sealing the second opening of the through-hole disposed opposite to the first opening thereof, and (iv) the semiconductor laser element placed within the recess having an inner wall surface of the through-hole and a bottom face constituted by a surface of the support base exposed within the second opening. Hence, the semiconductor laser element can be operated under the conditions where the semiconductor laser element is air-tightly sealed, within the through-hole, by the support base and the sealing member. As a result, the semiconductor laser element is not subject to the moisture in the air and the organic materials existent on the periphery of the semiconductor laser device and therefore the reduction in reliability of the semiconductor laser element can be suppressed.

In the second aspect thereof, there are provided the semiconductor substrate in which the through-hole penetrating in a thickness direction is formed and the support base, mounted on an underside of the semiconductor substrate, for sealing the second opening of the through-hole, and the arrangement is such that the laser light emitted from the semiconductor laser element is reflected by the first region of the inner wall surface of the through-hole and then transmits through the sealing member so as to be emitted externally. Hence, a part of the inner wall surface of the through-hole of the semiconductor substrate mounted beforehand on the support base on which semiconductor laser element is placed may serve also as a means for reflecting the laser light. In other words, since the accuracy of the optical axis of the laser light reflected by the reflection means depends only on the installation error caused when the semiconductor laser element is to be placed on the surface of the support base, the magnitude of the shift or displacement in the optical axis can be reduced by as much as the reduced number of factors causing the shift or displacement in the optical axis.

In the second aspect thereof, the recess in which the semiconductor element is placed is constituted by the through-hole of the semiconductor substrate and the surface of the support base exposed within the second opening. Hence, the support base on which the semiconductor laser element is placed can be formed as a separate member wherein the support base is formed of a material different from that of the semiconductor substrate. As a result, the strength of the semiconductor laser device can be assured by appropriately selecting the material of the support base. Also, in the fabrication process, the semiconductor substrate, in which the through-hole is formed, and the flat plate-like support base are bonded together, so that a package in which to place the semiconductor laser element can be easily formed.

In the semiconductor laser device according to the first and the second aspect thereof, the first region and the second region, which are disposed counter to each other with the semiconductor laser element disposed therebetween, each preferably has a tilted surface which is tilted in such a manner that a cross-sectional shape of the inner wall surface thereof extends from the bottom face toward the first opening, and an inclination angle formed between the tilted surface of the second region and the bottom face is preferably greater than that formed between the tilted surface of the first region and the bottom face. By implementing this structure, the semiconductor laser element can be placed on top of the bottom face of the recess while the interval between the semiconductor laser element and the inner wall surface (the second region) of the recess disposed counter to a facet opposite to the laser light emission facet of the semiconductor laser element is assured to be wider than that between the laser light emission facet of the semiconductor laser element and the inner wall surface (the first region) of the recess. As a result, a region assured in a rear part of the semiconductor laser element (opposite to the light emission facet) can be efficiently made use of, so that electrodes configured to electrically connect to the exterior can be easily formed. The laser light emission facets are distinguished by the magnitudes of light intensities of the laser light emitted from the respective facets to a pair of cavity facets formed in the semiconductor laser element. In other words, the laser light emission facet where the light intensity of the laser light emitted from the facet is relatively larger corresponds to the laser light emission facet.

In the semiconductor laser device according to the first aspect thereof, a metallic film is preferably formed on the first region. This structure differs from the case where the laser emission light emitted from the semiconductor laser element is directly irradiated to the inner wall surface (the first region) formed by the semiconductor substrate and then reflected thereby. That is, by employing the structure according to this embodiment, the laser light is irradiated to the metallic film part of the inner wall surface and reflected upward thereby. Hence, the direct effect of the heat generated during the irradiation of the laser light on the semiconductor substrate can be suppressed as much as the laser light is reflected thereby, and at the same time the laser light can be efficiently reflected by the metallic film part.

In the semiconductor laser device according to the first aspect thereof, the semiconductor laser element is preferably a nitride-based semiconductor laser element. When the semiconductor laser element is a nitride-based semiconductor element, the following inconvenience is more likely to occur in contrast to a red or infrared semiconductor laser element formed of a GaAs group or the like. That is, substances after a chemical reaction adhere to the laser emission facet and the like due to the chemical reaction between the laser light and moisture in the air and/or other organic materials. For this reason, sealing air-tightly with the sealing member as in this embodiment is extremely effective. As a result, the reliability of a nitride-based semiconductor laser element can be improved.

An optical pickup device according to a third aspect of the present invention comprises: (1) a semiconductor laser device including: (i) a semiconductor substrate in which a recess is formed, the recess having an opening and a bottom face surrounded by an inner wall surface; (ii) a semiconductor laser element placed on the bottom face; and (iii) a translucent sealing member for sealing the opening, the sealing member being mounted on top of the semiconductor substrate; (2) an optical system configured to control a light emitted by the semiconductor laser device; and (3) a photo detector configured to detect the emitted light, wherein a laser light emitted from the semiconductor laser element is reflected by a first region of the inner wall surface and then transmits through the sealing member so as to be emitted externally.

By employing the optical pickup device according to the third aspect of the present invention, the optical pickup device is, as described above, provided with (i) the semiconductor substrate, in which the recess having the first opening and the bottom face surrounded by the inner wall surfaces is formed, (ii) the semiconductor laser element placed on the bottom face, and (iii) the translucent sealing member, mounted on top of the semiconductor substrate, for sealing the first opening. Hence, the semiconductor laser element can be operated under the conditions where the semiconductor laser element is easily air-tightly sealed by the recess in the semiconductor substrate and the sealing member. As a result, the optical pickup device can be realized whereby the reduction in reliability of the semiconductor laser element is suppressed.

In the third aspect thereof, there is provided the semiconductor substrate in which the recess having the first opening and the bottom face surrounded by the inner wall surfaces is formed, and the arrangement is such that the laser light emitted from the semiconductor laser element is reflected by the first region of the inner wall surface and then transmits through the sealing member so as to be emitted externally. Hence, a part of the inner wall surface of the recess of the semiconductor substrate on which the semiconductor laser element is placed may serve also as a means for reflecting the laser light. In other words, since the accuracy of the optical axis of the laser light reflected by the reflection means depends only on the installation error caused when the semiconductor laser element is to be placed on the bottom face of the recess, the optical pickup device can be realized whereby the magnitude of the shift or displacement in the optical axis is reduced by as much as the reduced number of factors causing the shift or displacement in the optical axis.

Also, in the third aspect thereof, the bottom face of the recess is integrally formed with the inner wall surfaces of the recess, so that the structure of the semiconductor laser device can be simplified accordingly.

An optical pickup device according to a fourth aspect of the present invention comprises: (1) a semiconductor laser device including: (i) a semiconductor substrate in which a through-hole penetrating in a thickness direction is formed; (ii) a sealing member for sealing a first opening of the through-hole, the sealing member being mounted on top of the semiconductor substrate; (iii) a support base for sealing a second opening of the through-hole disposed opposite to the first opening thereof, the support base being mounted on an underside of the semiconductor substrate; and (iv) a semiconductor laser element placed within a recess, the recess having an inner wall surface of the through-hole and a bottom face constituted by a surface of the support base exposed within the second opening; (2) an optical system configured to control a light emitted by the semiconductor laser device; and (3) a photo detector configured to detect the emitted light, wherein the semiconductor laser element is placed on the bottom face, and wherein a laser light emitted from the semiconductor laser element is reflected by a first region of the inner wall surface of the through-hole and then transmits through the sealing member so as to be emitted externally.

By employing the optical pickup device according to the fourth aspect of the present invention, the optical pickup device is, as described above, provided with the semiconductor laser device including: (i) the semiconductor substrate in which the through-hole penetrating in the thickness direction is formed; (ii) the sealing member, mounted on top of the semiconductor substrate, for sealing the first opening of the through-hole; (iii) the support base, mounted on an underside of the semiconductor substrate, for sealing the second opening of the through-hole disposed opposite to the first opening thereof; and (iv) the semiconductor laser element placed within the recess having inner wall surfaces of the through-hole and the bottom face constituted by the surface of the support base exposed within the second opening. Hence, the semiconductor laser element can be operated under the conditions where the semiconductor laser element is air-tightly sealed, within the through-hole, by the support base and the sealing member. As a result, the optical pickup device can be realized whereby the reduction in reliability of the semiconductor laser element is suppressed.

In the fourth aspect thereof, there are provided the semiconductor substrate in which the through-hole penetrating in the thickness direction is formed and the support base, mounted on an underside of the semiconductor substrate, for sealing the second opening of the through-hole, and the arrangement is such that the laser light emitted from the semiconductor laser element is reflected by the first region of the inner wall surface of the through-hole and then transmits through the sealing member so as to be emitted externally. Hence, a part of the inner wall surface of the through-hole of the semiconductor substrate mounted beforehand on the support base on which semiconductor laser element is placed may serve also as a means for reflecting the laser light. In other words, since the accuracy of the optical axis of the laser light reflected by the reflection means depends only on the installation error caused when the semiconductor laser element is to be placed on the surface of the support base, the optical pickup device can be realized whereby the magnitude of the shift or displacement in the optical axis is reduced by as much as the reduced number of factors causing the shift or displacement in the optical axis.

In the fourth aspect thereof, the recess in which the semiconductor element in the semiconductor device is placed is constituted by the through-hole of the semiconductor substrate and the surface of the support base exposed within the second opening. Hence, the support base on which the semiconductor laser element is placed can be formed as a separate member wherein the support base is formed of a material different from that of the semiconductor substrate. As a result, the strength of the semiconductor laser device that constitutes the optical pickup device can be assured by appropriately selecting the material of the support base.

It is to be noted that any arbitrary combinations or rearrangement of the aforementioned structural components and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIGS. 31A and 31B are cross-sectional views showing a sequence of processes in a method for fabricating a semiconductor device according to a first example of a sixth embodiment;

FIGS. 32A to 32C are cross-sectional views showing a sequence of processes in a method for fabricating a semiconductor device according to a first example of a sixth embodiment;

DETAILED DESCRIPTION OF THE INVENTION

The invention will now be described by reference to the preferred embodiments. This does not intend to limit the scope of the present invention, but to exemplify the invention.

Hereinbelow, the embodiments will be described with reference to the accompanying drawings.

First Embodiment

Figure 1:
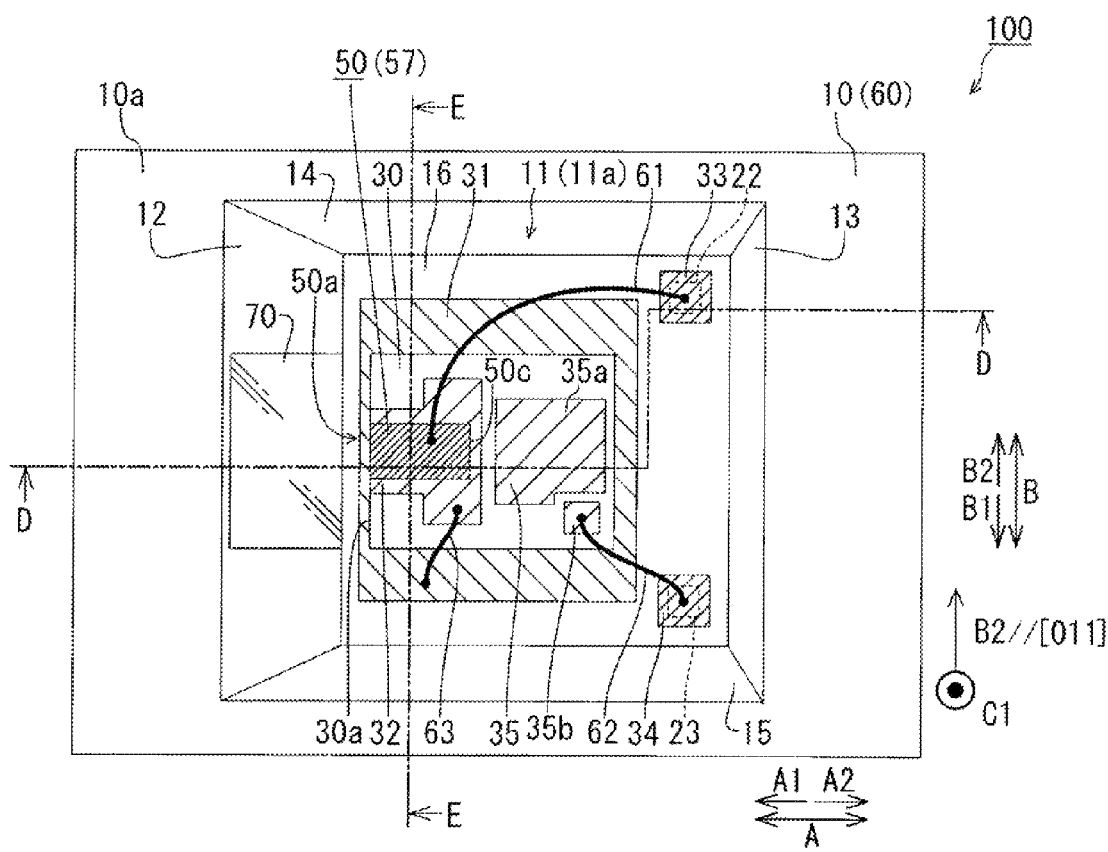
FIG. 1 is a top view showing a structure of a semiconductor laser device according to a first embodiment of the present invention.
Figure 2:
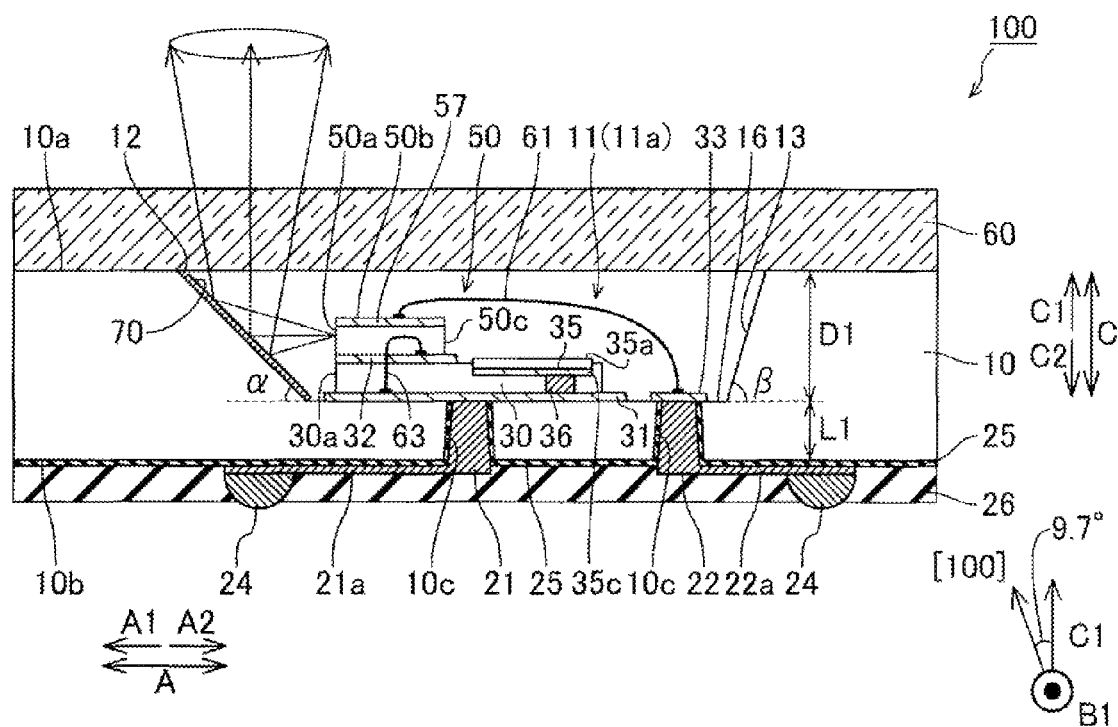
FIG. 2 is a cross-sectional view showing a structure of a semiconductor laser device according to a first embodiment of the present invention.
Figure 3:
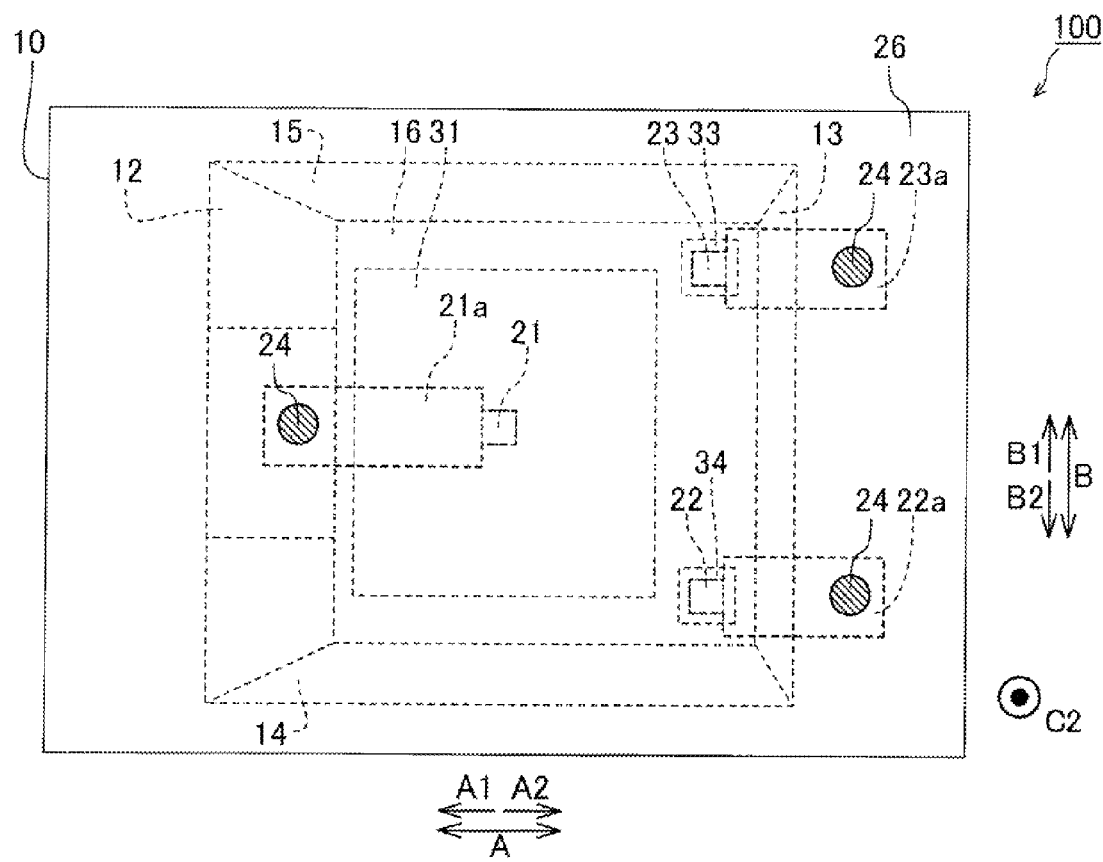
FIG. 3 is a bottom view showing a structure of a semiconductor laser device according to a first embodiment of the present invention.
Figure 4:
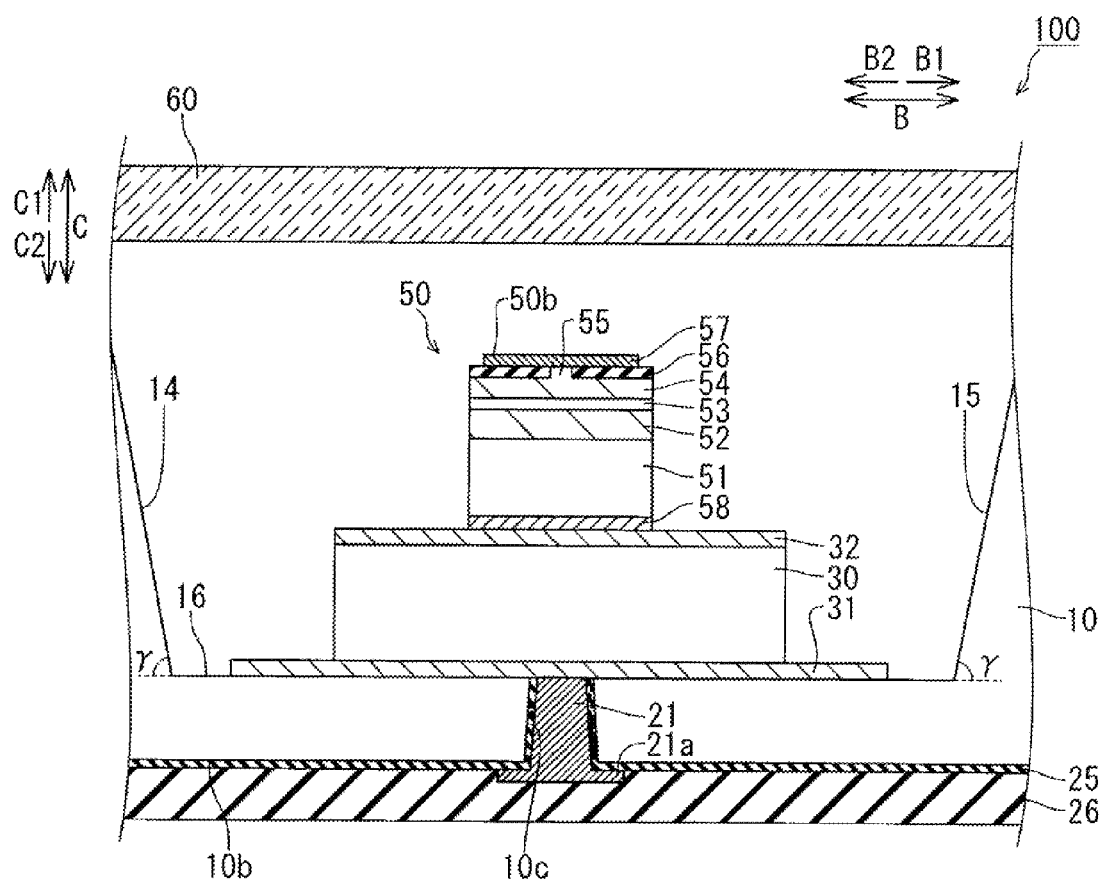
FIG. 4 is a cross-sectional view showing a structure of a semiconductor laser device according to a first embodiment of the present invention.

Referring to FIG. 1 to FIG. 4, a description is first given of a semiconductor laser device 100 according to a first embodiment of the present invention. FIG. 2 is a cross-sectional view of FIG. 1 taken along line D-D, and FIG. 4 is a cross-sectional view of FIG. 1 taken along line E-E.

As shown in FIG. 2, the semiconductor laser device 100 according to the first embodiment of the present invention includes (1) a Si(100) substrate 10, having a high resistivity, in which a recess 11 dent from above (C1 side) toward below (C2 side) is formed, (2) a semiconductor laser element 50 placed on a bottom face 16 of the recess 11 via a submount (base) 30, and (3) a translucent sealing glass 60 for blocking an opening 11a of the recess 11 wherein the sealing glass 60 is mounted on a top face 10a of the Si(100) substrate 10. Note that the Si(100) substrate 10 is an example of "semiconductor substrate" in claim phraseology (WHAT IS CLAIMED), whereas the opening 11a is an example of "first opening" in claim phraseology. Also, the sealing glass 60 is an example of "sealing member" in claim phraseology.

As shown in FIG. 1, the Si(100) substrate 10 is formed in an approximately rectangular shape such that the planar outer shape thereof has a length of about 3 mm along a cavity direction (direction A) of the semiconductor laser element 50 and has a length of about 2 mm along a width direction (direction B) orthogonal to the cavity direction of the semiconductor laser element 50. The Si(100) substrate 10 has a thickness (maximum thickness) of about 600 µm; i.e., the distance between the top face 10a and an underside 10b of the Si(100) substrate 10 is about 600 µm. Though the sealing glass 60 is placed on top (on the near side of the sheet surface of FIG. 1) of the Si(100) substrate 10, the sealing glass 60 is omitted in FIG. 1 for convenience and clarity of figure.

In the first embodiment, as shown in FIG. 1, the recess 11 of the Si(100) substrate 10 is constituted by four inner wall surfaces 12, 13, 14 and 15 and the bottom face 16 integrally formed with the four inner wall surfaces 12, 13, 14 and 15 wherein the semiconductor laser element 50 is placed on the bottom face 16 via the submount 30. Here, the inner wall surfaces 12 and 13 are provided counter to each other, with the semiconductor laser element 50 disposed therebetween, along the cavity direction (direction A), and the inner wall surfaces 14 and 15 are provided counter to each other in the width direction (direction B) of the semiconductor laser element 50. The inner wall surfaces 12 to 15 are an example of "inner wall surface" in claim phraseology (WHAT IS CLAIMED). The inner wall surface 12 is an example of "first region of an inner wall surface" and "first tilted surface" in the claim phraseology, whereas the inner wall surface 13 is an example of "second region of an inner wall surface" and "second tilted surface" in the claim phraseology.

According to the first embodiment, in a fabrication process described later, anisotropic etching is performed on the Si(100) substrate 10 having a main surface (top face 10a) tilted about 9.7 degrees relative to an approximately (100) plane, thereby forming the inner wall surfaces 12, 13, 14 and 15 in the Si(100) substrate 10. The use of the Si(100) substrate 10 having the main surface tilted about 9.7 degrees allows the formation of the inner wall surface 12 which is tilted at an inclination angle α of about 45 degrees (see FIG. 2) relative to the bottom face 16. At the same time, the use of such the Si(100) substrate 10 allows the formation of the inner wall surface 13 which is tilted at an inclination angle β of about 64.4 degrees (see FIG. 2) relative to the bottom face 16. The inner wall surfaces 14 and 15 are each formed such that each of them is tilted at an inclination angle γ of about 54.7 degrees (see FIG. 4) relative to the bottom face 16. As shown in FIG. 2, the dimensions of the recess 11 are such that the depth D1, namely the distance between the top face 10a and the bottom face 16, is about 500 µm and the thickness L1, namely the distance between the bottom face 16 and the underside 10b, is about 100 µm.

As shown in FIG. 1, in the first embodiment, a metallic reflective film 70, made of Ag, having a thickness ranging from about 100 nm to about 500 nm is formed on top of the inner wall surface 12 in an approximately central region thereof. The metallic reflective film 70 is formed in a position where the submount 30 is disposed counter to the inner wall surface 12. The metallic reflective film 70 is an example of "metallic film" in the claim phraseology.

As shown in FIG. 1, the submount 30 having a thickness of about 200 µm along the direction C is formed in an approximately rectangular shape such that the submount 30 has a length of about 800 µm along the direction A and has a length of about 600 µm along the direction B. A pad electrode 31 used to die-bond the submount 30 is formed on top of the bottom face 16 of the recess 11. With such an arrangement described as above, the submount 30 is bonded, in a position closer to an A1 side (inner wall surface 12 side) from an approximate center in the recess 11, to the pad electrode 31 on the bottom face 16 via an electrically conductive adhesion layer (not shown) whose back side (surface on a C2 side) is formed of Au—Sn solder. Here, the pad electrode 31 has a plane area larger than that of the submount 30, and the submount 30 is placed within a region where the pad electrode 31 is formed.

A pad electrode 32 used to die-bond the semiconductor laser element 50 is formed on a predetermined region of a top surface of the submount 30 on an A1 side, whereas a monitoring photo diode (PD) 35 is assembled into a predetermined region of a top surface of the submount 30 on an A2 side (inner wall surface 13 side). As shown in FIG. 2, the monitoring PD 35 is formed on the submount 30 in such a manner that a light-receiving surface 35a is exposed on a top surface side of the submount 30. As a result, as shown in FIG. 2, an arrangement is such that the laser light emitted to a light-reflecting surface 50c side of the semiconductor laser element 50 enters the light-receiving surface 35a. The monitoring PD 35 has a p-type region (not shown), a pad electrode 35b (see FIG. 1) connected to the p-type region and an n-type region 35c (see FIG. 2); the n-type region 35c and the pad electrode 31 disposed at a bottom side of the submount 30 electrically conduct to each other through an electrode 36 penetrating the submount 30 in the vertical direction (direction C). The semiconductor laser element 50 is placed on the submount 30 such that a light emission facet 50a of the semiconductor laser element 50 is aligned with an edge face 30a of the submount 30 on an A1 side, on approximately the same plane.

Here, the aforementioned light emission facet 50a and the aforementioned light-reflecting surface 50c are distinguished by the magnitudes of light intensities of the laser light emitted from the respective facets to a pair of resonator facets formed in the semiconductor laser element 50. In other words, the laser light emission facet where the light intensity of the laser light emitted from the facet is relatively larger is the light emission facet 50a, and the laser light emission facet where the light intensity thereof is relatively smaller is the light-reflecting surface 50c.

As shown in FIG. 2, in the first embodiment, the semiconductor laser element 50 is placed on the submount 30 in the state where a top surface 50b of the semiconductor laser element 50 is pressed down below the top face 10a of the Si(100) substrate 10 (C2 side). The plate-like (flat) sealing glass 60 made of a borosilicate glass (hard glass) having a thickness of about 500 μm blocks the opening 11a of the recess 11 with the sealing glass 60 covered from above the top face 10a, so that the interior of the recess 11 in which the semiconductor element 50 is placed is air-tightly sealed. The planar shape of the sealing glass 60 is constructed in a manner approximately identical to the Si(100) substrate 10.

Thus, the semiconductor laser device 100 is configured such that the laser light emitted from the light emission facet 50a of the semiconductor laser element 50 in the direction A1 is reflected upward in the inner wall surface 12 of the recess 11 (the metallic reflective film 70) and then transmits through the sealing glass 60 so as to be emitted to the outside. In the first embodiment, a means for reflecting the laser light to the exterior is constituted by the inner wall surface 12 and the metallic reflective film 70.

Also, as shown in FIG. 1, the semiconductor element 50 has a resonator length (direction A) ranging from about 250 μm to about 400 μm, and is formed as a nitride-based semiconductor laser element having an element width (direction B) ranging from about 100 μm to about 200 μm. The semiconductor element 50 has a thickness of about 100 μm (at maximum) or less.

In other words, as shown in FIG. 4, in the semiconductor laser element 50, (i) an n-type cladding layer 52 made of a Si-doped n-type AlGaN, (ii) an active layer 53 having an MQW structure where a quantum well layer made of InGaN of high In composition and a barrier layer made of GaN are alternately stacked, and (iii) a p-type cladding layer 54 made of a Mg-doped p-type AlGaN are formed on top of an n-type GaN substrate 51 in this order.

Also, a ridge (protrusion) 55 having a width of about 1.5 μm extending in a direction (direction A in FIG. 1) vertical to the sheet surface of FIG. 4 is formed in the p-type cladding layer 54, thereby forming a waveguide structure. Also, formed is a current blocking layer 56, made of $SiO_2$, which covers the top face of the p-type cladding layer 54, excluding the ridge 55, and the both sides of the ridge 55. Also, a p-side pad electrode 57 made of Au and the like is formed on top of the ridge 55 of the p-type cladding layer 54 and the current blocking layer 56.

As shown in FIG. 4, an n-side electrode 58 where an Al layer, a Pt layer and an Au layer are stacked in the order of being closer to the n-type GaN substrate 51 are formed on an approximately entire underside of the n-type GaN substrate 51. A dielectric multilayer film having a low reflectivity is formed on the light emission facet 50a of the semiconductor element 50 (See FIG. 2). And a dielectric multilayer film having a high reflectivity is formed on the light-reflecting surface 50c thereof (See FIG. 2).

In the first embodiment, the n-side electrode 58 of the semiconductor laser element 50 and the pad electrode 32 formed on the surface of the submount 30 are bonded together via an electrically conductive adhesion layer (not shown). Thus, the semiconductor laser element 50 is bonded on top of the submount 30 using a junction-up method (See FIG. 4).

As shown in FIG. 1 to FIG. 3, a through-hole 10c (See FIG. 2) that penetrates in a thickness direction from a bottom face 16 (pad electrode 31) side toward the underside 10b (surface on a C2 side) is formed in a region corresponding to an approximately central position of the submount 30 in the Si(100) substrate 10. Here, a through-hole electrode 21 made of a conductive material such as Cu or Al is provided inside the through-hole 10c. An insulating film 25 formed of $SiO_2$ or the like is formed on an inner surface of the through-hole 10c. Here, the through-hole electrode 21 is electrically connected to the pad electrode 31 in a portion thereof exposed on a bottom face 16 side of the Si(100) substrate 10.

In a region of the bottom face 16 where the pad electrode 31 is not formed, a pad electrode 33 and a pad electrode 34 both for use with wire bonding are formed; each of the pad electrode 33 and the pad electrode 34 is of a rectangular shape whose dimensions are about 100 μm×about 100 μm. More specifically, as shown in FIG. 1, the pad electrode 33 is formed in a region, interposed between the submount 30 (pad electrode 31) and the inner wall surface 13, which is situated nearer the inner wall surface 14 (B2 side), whereas the pad electrode 34 is formed in a region situated nearer the inner wall surface 15 (B1 side). As shown in FIG. 2, a through-hole 10c, which faces the underside 10b from the bottom face 16 above and penetrates in a thickness direction of the Si(100) substrate 10, are provided below the pad electrode 33; a through-hole electrode 22 made of a conductive material such as Cu or Al is provided inside the through-hole 10c. Similarly, a through-hole 10c, which faces the underside 10b from the bottom face 16 above and penetrates in a thickness direction of the Si(100) substrate 10, are provided below the pad electrode 34; a through-hole electrode 23 is provided inside the through-hole 10c. The insulating film 25 formed of $SiO_2$ or the like is formed on an inner surface of each of the through-holes 10c. The through-hole electrode 22 is electrically connected to the pad electrode 33, where as the through-hole electrode 23 is electrically connected to the pad electrode 34. The insulating film 25 is formed in such a manner as to cover not only the inner surface of each of the through-holes 10C but also the underside 10b of the Si(100) substrate 10.

For the semiconductor laser element 50, one end of a wire 61, made of Au, having an outside diameter of about 30 μm is wire-bonded to the p-side pad electrode 57, whereas the other end of the wire 61 is wire-bonded to the pad electrode 33. For the monitoring PD 35, one end of a wire 62, made of Au, having an outside diameter of about 30 μm is wire-bonded to the pad electrode 35*b*, whereas the other end of the wire 62 is wire-bonded to the pad electrode 34. For the semiconductor laser element 50, one end of a wire 63, made of Au, having an outside diameter of about 30 μm is wire-bonded to the pad electrode 32 that electrically conducts to the n-side electrode 58, whereas the other end of the wire 63 is wire-bonded to the pad electrode 31. Thereby, the n-side electrode 58 (see FIG. 4) of the semiconductor laser element 50 is electrically connected to the through-hole electrode 21 via the pad electrode 31. Also, the n-type region 35*c* (see FIG. 2) is electrically connected to the pad electrode 31 by the through-hole electrode 36.

As shown in FIG. 2, the through-hole electrode 21 has a leader wiring portion 21*a* that extends from a portion exposed on the underside 10*b* of the Si(100) substrate 10, along the underside 10*b*. Similarly, the through-hole electrodes 22 and 23 have leader wiring portions 22*a* and 23*a*, respectively, extending from portions exposed on the underside 10*b* of the Si(100) substrate 10, along the underside 10*b*. A solder ball 24 formed of Sn—Ag—Cu solder is formed on each end of the leader wiring portions 21*a*, 22*a* and 23*a*. A protective film 26, formed of $SiO_2$ or the like, which covers the leader wiring portions 21*a*, 22*a* and 23*a* and partially covers spherical parts of the solder balls 24, is formed on the underside 10*b* of the Si(100) substrate 10. Thus, as shown in FIG. 3, the arrangement is such that when the semiconductor laser device 100 is viewed from the underside thereof (C2 side), three solder balls 24 only are exposed on the surface of the protective film 26 (C2-side surface). As a result, the structure is such that the semiconductor laser device 100 can be mounted on a wiring substrate (flexible substrate) in a light source unit such as an optical pickup device.

Now, with reference to FIG. 1 through FIG. 10, a description will be given of a manufacturing process of a semiconductor laser device 100 according to the first embodiment.

Figure 5:
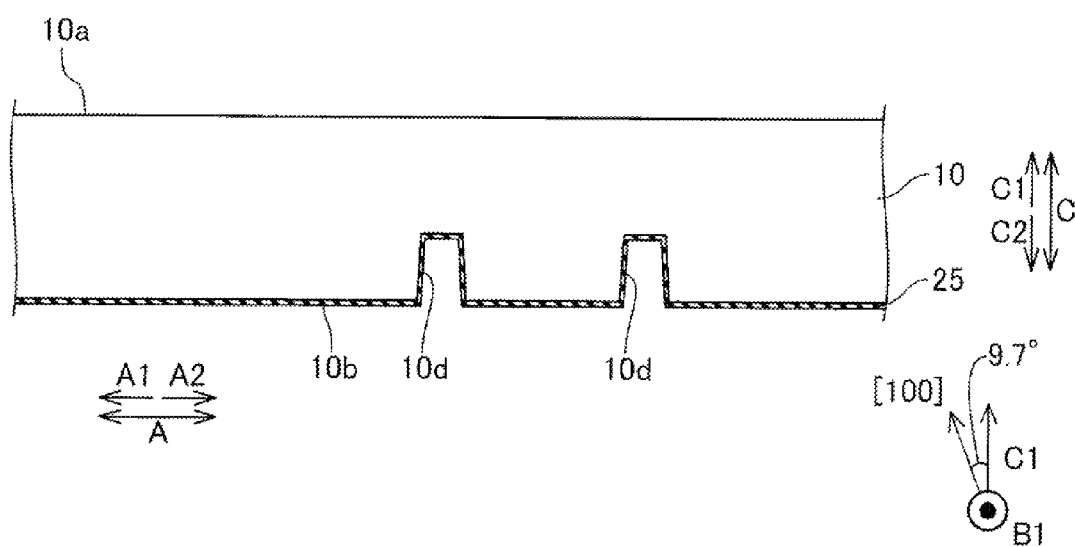
FIG. 5 is a cross-sectional view for explaining a fabrication process of a semiconductor laser device according to a first embodiment of the present invention.

As shown in FIG. 5, a wafer-level Si(100) substrate 10 having a thickness of about 600 μm and having the main surface (top face 10*a*) tilted about 9.7 degrees relative to the approximately (100) plane is first prepared. Then, a plurality of holes 10*d* in which to form the through-hole electrodes 21 to 23 (see FIG. 2) are formed in predetermined positions on the underside 10*b* of the wafer-level Si(100) substrate 10 by using photolithography and dry etching. Then an insulating film 25 having a certain thickness is formed in such a manner as to cover the inner surfaces of the holes 10*d*. In so doing, the insulating film 25 is also formed on the surface of the underside 10*b* where the holes 10*d* are not formed.

Figure 6:
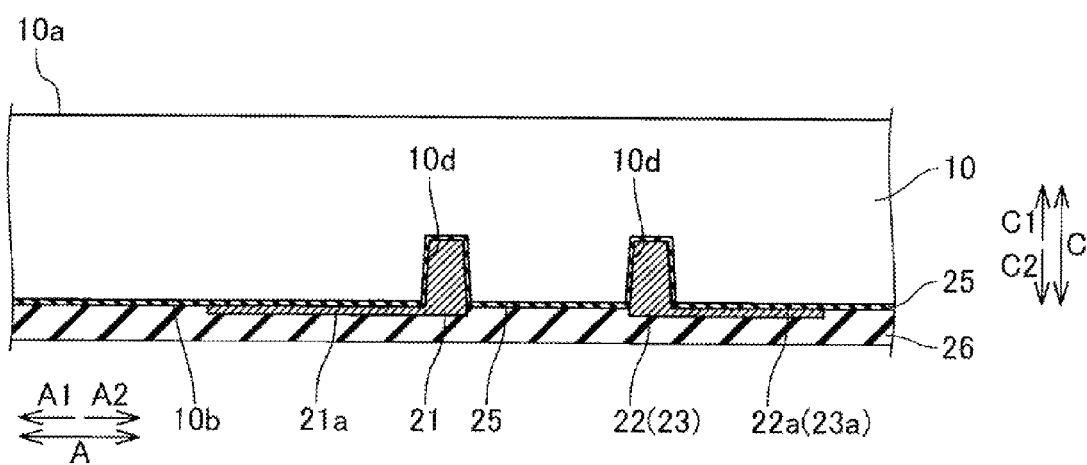
FIG. 6 is a cross-sectional view for explaining a fabrication process of a semiconductor laser device according to a first embodiment of the present invention.

Then, as shown in FIG. 6, a wiring material formed of Cu is embedded in the holes 10*d* by using a plating process. In so doing, the wiring material formed in such a manner as to cover the underside of the insulating film 25. In this state, undesired and useless portions formed on the underside of the Si(100) substrate 10 (insulating film 25) in the wiring material are removed by using photolithography and etching. Thereby, the through-hole 21 having the leader wiring portion 21*a* and the through-hole 22 having the leader wiring portion 22*a* are patterned, respectively. Then, a protective film 26, having a predetermined thickness, formed of $SiO_2$ or the like is so formed as to cover the entire underside of the insulating film 25 and the leader wiring portions 21*a* to 23*a*.

Figure 7:
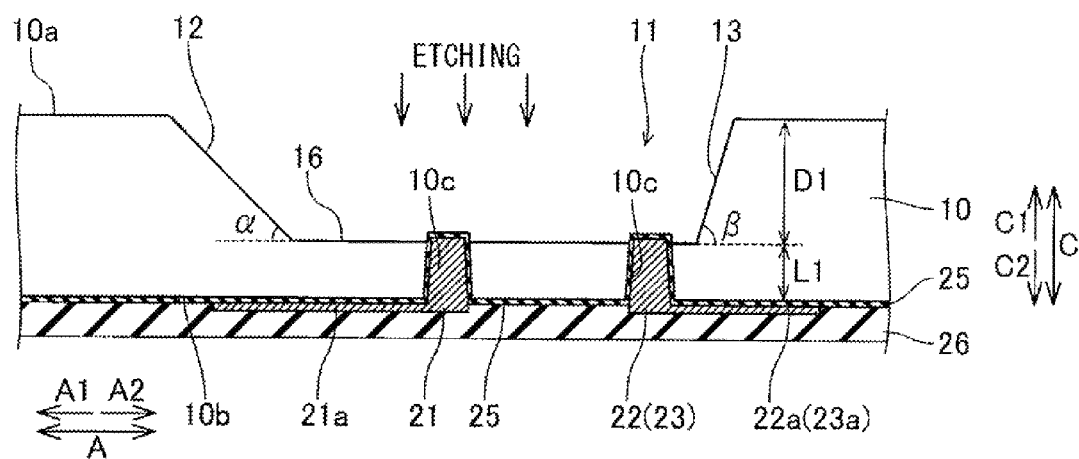
FIG. 7 is a cross-sectional view for explaining a fabrication process of a semiconductor laser device according to a first embodiment of the present invention.

Then, as shown in FIG. 7, wet etching (anisotropic etching) is performed on the Si(100) substrate 10 where an etching mask (not shown) having a predetermined mask pattern is formed on the top face 10*a*, thereby forming a recess 11 dent from the top face 10*a* (C1 side) toward the underside 10*b* (C2 side).

In the fabrication process according to the first embodiment, the wet etching is done using an etchant such as KOH (potassium hydroxide), TMAH (tetramethyl ammonium hydroxide), EDP (ethylenediamine pyrocatechol) or $N_2H_4 \cdot H_2$ (hydrous hydrazine). In this case, as the etching proceeds along the crystal orientation of Si, the recess 11 having the four inner wall surfaces 12, 13, 14 and 15 each composed of Si(100) plane is formed in the Si(100) substrate 10. The inner wall surface 12 (see FIG. 7) is an etched surface (tilted surface) tilted at an inclination of about 45 degrees (angle α) relative to the top face 10*a*. The inner wall surface 13 (see FIG. 7) is an etched surface (tilted surface) tilted at an inclination of about 64.4 degrees (angle β) relative to the top face 10*a*. The inner wall surfaces 14 and 15 (see FIG. 4) is each an etched surface tilted at an inclination of about 54.7 degrees (angle γ) relative to the top face 10*a* (see FIG. 7). The etching is stopped when the recess 11 reaches the depth D1 of about 500 mμ, thus allowing the formation of the bottom face 16 that extends in direction A and direction B in the Si(100) substrate 10. The formation of the bottom face 16 causes the holes 10*d* to be formed as the through-holes 10*c*.

Figure 8:
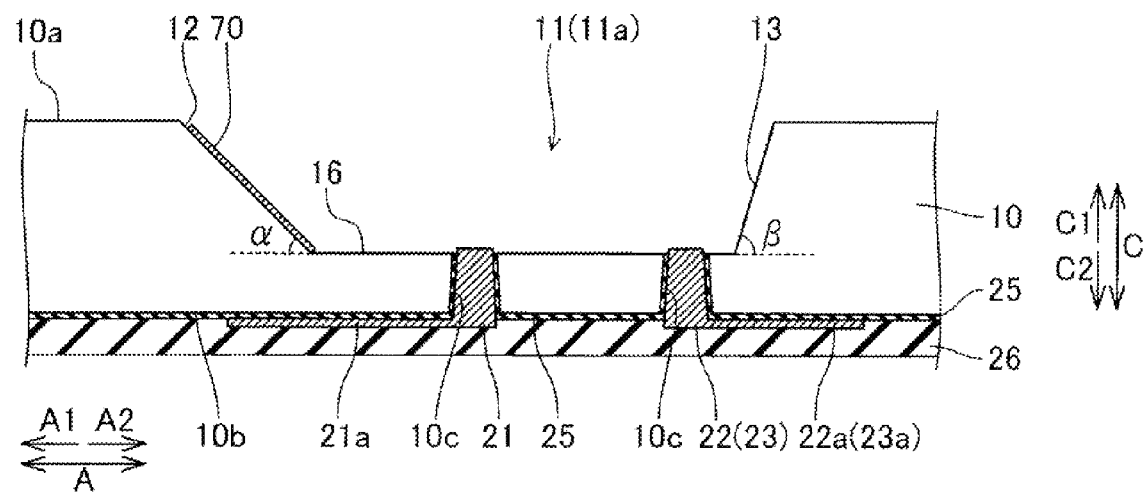
FIG. 8 is a cross-sectional view for explaining a fabrication process of a semiconductor laser device according to a first embodiment of the present invention.

Then, as shown in FIG. 8, the wet etching is done using an etchant such as HF (hydrogen fluoride) or BF (buffered hydrofluoric acid). The insulating film 25 of the through-hole electrodes 21 to 23 protruding toward the recess 11 is removed, so that the tip ends of the through-hole electrodes 21 to 23 are exposed in the recess 11 (bottom face 16). Though the tip ends of the through-hole electrodes 21 to 23, after the insulating film 25 corresponding to that protruding toward the recess 11 has been removed, are slightly protruding from the bottom face 16, FIG. 8 shows, in a somewhat exaggerated manner, how the tip ends thereof protrude.

Then, as shown in FIG. 8, a metallic reflective film 70, formed of Ag, having a thickness ranging from about 100 nm to about 500 nm is formed on a region in the inner wall surface 12 disposed counter to the light emission facet 50*a* (see FIG. 1) with the semiconductor laser element 50 being placed, using an evaporation method or sputtering method. In a process of forming the metallic reflective film 70 into a shape as shown in FIG. 1, metallic reflective films are first formed on all of regions in the respective inner wall surfaces 12 to 15, and then a resist (etching mask) is formed in the surface of a desired metallic reflective film 70 only. Then the metallic reflective films in the unwanted regions are removed by etching, thereby forming the metallic reflective film 70.

Figure 9:
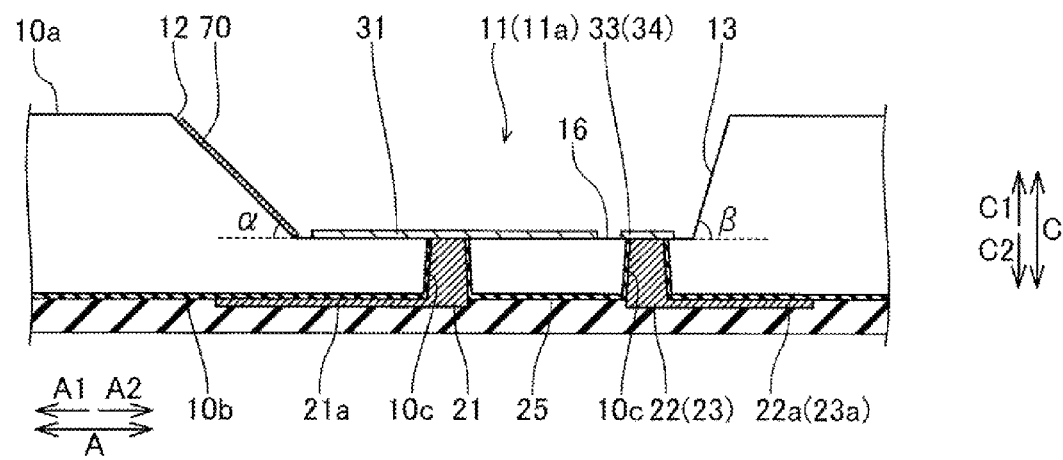
FIG. 9 is a cross-sectional view for explaining a fabrication process of a semiconductor laser device according to a first embodiment of the present invention.

Then, as shown in FIG. 9, a pad electrode 31 having a predetermined plane area is formed on the bottom face 16 so that the pad electrode 31 electrically conducts to the through-hole electrode 21 exposed in the recess 11. Also, pad electrodes 22 and 23 of predetermined dimensions are so formed as to electrically conduct to the through-hole electrodes 22 and 23, respectively.

Figure 10:
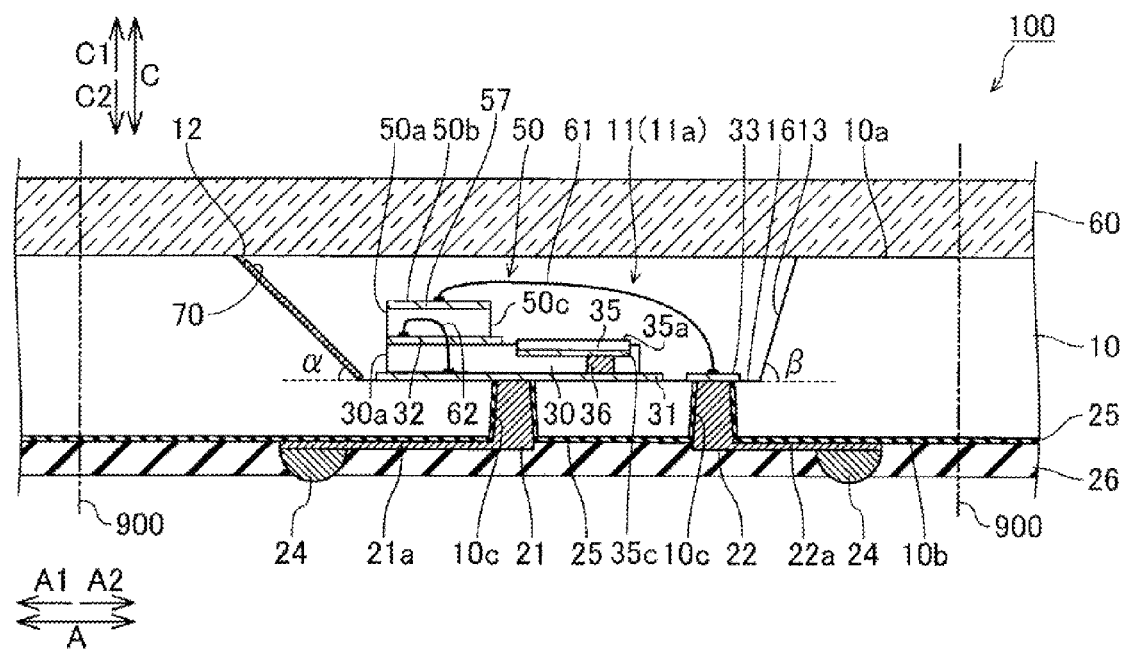
FIG. 10 is a cross-sectional view for explaining a fabrication process of a semiconductor laser device according to a first embodiment of the present invention.

Then, as shown in FIG. 10, the submount 30 is bonded on top of the pad electrode 31 via the electrically conductive adhesion layer (not shown). In so doing, the submount 30 is placed so that the pad electrode 32 formed beforehand on the submount 30 is located on an inner wall surface 12 side (A1 side) and the monitoring PD 35 is located on an inner wall surface 13 side (A2 side). Further, the semiconductor laser 50 (n-side electrode 58) is bonded onto the surface of the pad electrode 32 via the electrically conductive adhesion layer (not shown). Note that the semiconductor laser element 50 may be bonded to the submount 30 before the submount 30 is bonded onto the pad electrode 31. Then, the p-side pad electrode 57 of the semiconductor laser element 50 is connected to the pad electrode 33 using the wire 61, and the pad electrode 35*b* connected to the p-type region of the monitoring PD 35 is connected to the pad electrode 34 using the wire 62. Also, the pad electrode 32 and the pad electrode 31 are connected using the wiring 63.

Then, a part of the bottom side of the protective film 26 is removed, and a solder ball 24 is formed in each end of the leader wiring portions 21a to 23a (see FIG. 3).

Then, as shown in FIG. 10, the wafer-level sealing glass 60 having a thickness of about 500 μm is attached to the recess 11 of the Si(100) substrate 10 from above (C2 side), using thermocompression bonding. In so doing, the Si(100) substrate 10 and the sealing glass 60 are bonded together under conditions of a temperature of about 200° C. and a dry air (dehumidified air atmosphere), using a thermosetting adhesive resin (not shown) or the like. As a result, the sealing glass 60 is bonded to the Si(100) substrate 10 in the top face 10a surrounding the opening 11a of the recess 11 and therefore the interior of the recess 11 is sealed air-tightly.

Then, in a region outside the region where the recess 11 is formed, both the sealing glass 60 and the Si(100) substrate 10 are cut (diced) along a demarcation lines 900 of FIG. 10 in the direction C using a diamond blade (the blade width: about 25 nm to about 100 nm). In this manner, the semiconductor laser device 100 as shown in FIG. 1 is formed.

By employing the semiconductor laser device 100 according to the first embodiment, the semiconductor laser device 100 is, as described above, provided with (i) the Si(100) substrate 10, in which the recess 11 having the opening 11a and the bottom face 16 surrounded by the four inner wall surfaces 12, 13, 14 and 15 are formed, (ii) the semiconductor laser element 50 placed on the bottom face 16, and (iii) the translucent sealing glass 60, mounted on the top face 10a of the Si(100) substrate 10, for sealing the opening 11a. Thereby, the top face 50b of the semiconductor laser element 50 placed on the bottom face 16 of the recess does not protrude outside the opening 11a of the recess 11 (C1 side in FIG. 2). Hence, the semiconductor laser element 50 can be operated under the conditions where the semiconductor laser element 50 is easily air-tightly sealed by the recess 11 in the Si(100) substrate 10 and the sealing glass 60. As a result, the semiconductor laser element 50 is not subject to the moisture in the air and the organic materials existent on the periphery of the semiconductor laser device 100 and therefore the reduction in reliability of the semiconductor laser element 50 can be suppressed.

Also, in the first embodiment, the structure is such that the laser light emitted from the light emission facet 50a of the semiconductor laser element 50 is reflected by the metallic reflective film 70 formed on the surface of the inner wall surface 12 and then transmits through the sealing glass 60 so as to be emitted externally. Hence, a part (i.e., the inner wall surface 12) of the four inner wall surfaces of the recess 11 of the Si(100) substrate 10 on which the semiconductor laser element 50 is placed may serve also as a means for reflecting the laser light. In other words, since the accuracy of the optical axis of the laser light reflected by the metallic reflective film 70 formed on the inner wall 12 depends only on the installation error caused when the semiconductor laser element 50 is to be placed in the recess 11, the magnitude of the shift or displacement in the optical axis can be reduced by as much as the reduced number of factors causing the shift or displacement in the optical axis.

Also, in the first embodiment, the metallic reflective film 70 is formed on a surface of the inner wall surface 12. This structure differs from the case where the laser emission light emitted from the semiconductor laser element 50 is directly irradiated to the surface of the inner wall surface 12 formed by the Si(100) substrate 10 and then reflected upward. That is, by employing the structure according to the first embodiment, the laser light is irradiated to the metallic film 70 on the inner wall surface 12 and reflected upward thereby. Hence, the direct effect of the heat generated during the irradiation of the laser light on the Si(100) substrate 10 (inner wall surface 12) can be suppressed as much as the laser light reflected thereby, and at the same time the laser light can be efficiently reflected by the metallic film 70.

Also, in the embodiment, the bottom face 16 of the recess 11 is integrally formed with the inner wall surfaces 12 to 15 in the Si(100) substrate 10, so that the structure of the semiconductor laser device 100 can be simplified accordingly.

Also, in the first embodiment, the inclination angle β of about 64.4 degrees relative to the bottom face 16 of the inner wall surface of the recess 11 is greater than the inclination angle α of about 45 degrees relative to the bottom face 16. As a result, the semiconductor laser element 50 can be placed on top of the bottom face 16 of the recess 11, via the submount 30, while the interval between the light emission facet 50a of the semiconductor laser element 50 and the inner wall surface 13 is assured to be wider than that between the laser emission facet 50a and the inner wall surface 12. Thus, a region assured in a rear part of the semiconductor laser element 50 (on a light emission facet 50c side) can be efficiently made use of, so that the through-hole electrode 22, the pad electrode 33, the through-hole 23 and the pad electrode 34 configured to electrically connect to the exterior can be easily formed.

Also, in the first embodiment, the nitride-based semiconductor laser element is used for the semiconductor laser element 50. When the semiconductor laser element 50 is a nitride-based semiconductor element, the following inconvenience is more likely to occur in contrast to a red or infrared semiconductor laser element formed of a GaAs group or the like. That is, since energy of the laser light is high, substances after a chemical reaction adhere to the light emission facet 50a and the like due to the chemical reaction between the laser light and moisture in the air and/or other organic materials. For this reason, sealing air-tightly with the sealing glass 60 as in the first embodiment is extremely effective. As a result, the reliability of the nitride-based semiconductor laser element (semiconductor laser element 50) can be improved.

Also, in the fabrication process according to the first embodiment, the Si(100) substrate 10 having the main surface tilted about 9.7 degrees relative to an approximately (100) place is used. Thus, when the recess 11 is formed in the Si(100) substrate 10 by wet etching, the four inner wall surfaces 12 to 15 can be formed simultaneously with the etching process. Hence, the more simplified the fabrication process is as in this first embodiment, the more efficiently the semiconductor laser device 100 is manufactured.

Also, in the fabrication process according to the first embodiment, a plurality of recesses 11 are simultaneously formed for the wafer-level Si(100) substrate 10. Thus, one-time etching results in the simultaneous formation of the plurality of recesses 11, so that the semiconductor laser device 100 can be further efficiently manufactured accordingly.

Also, in the fabrication process according to the first embodiment, the wafer-level sealing glass 60 is bonded, through thermocompression bonding, to the wafer-level Si(100) substrate 10 where the semiconductor laser element 50 is placed on each of the bottom face 16 of a plurality of recesses 11, thereby sealing the recess 11. As a result, the plurality of recesses 11 can be simultaneously sealed air-tightly through a bonding process of a single piece of sealing glass 60 and therefore the semiconductor laser device 100 can be further efficiently manufactured accordingly.

Second Embodiment

A second embodiment is now described with reference to FIG. 2 and FIG. 11 to FIG. 13. In a semiconductor laser device 200, according to the second embodiment, which differs from the semiconductor laser device 100 of the above-described first embodiment, a description is given of a case where the back side of the semiconductor laser element 50 is directly fixed onto the surface region of a bottom face 216 of a recess 211. FIG. 12 is a cross-sectional view taken along line 2000-2000 of FIG. 11. Each component identical to that of the first embodiment is given the identical reference numeral in Figures.

Figure 11:
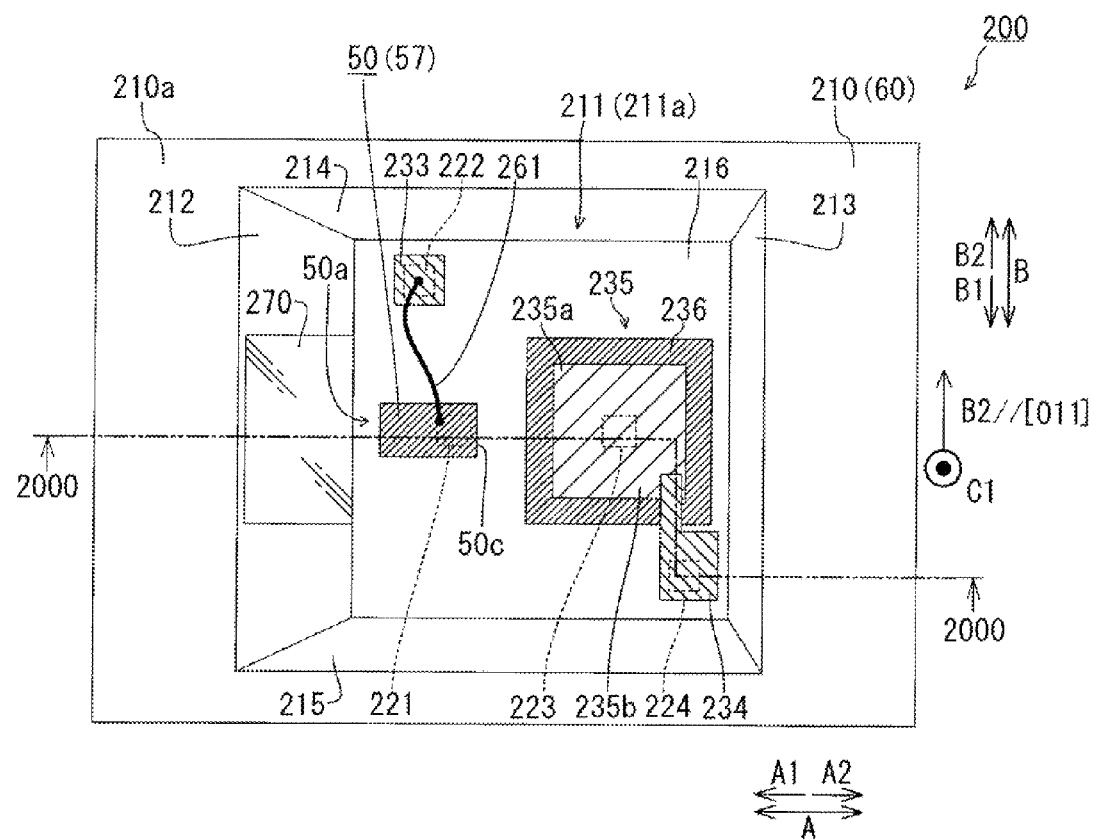
FIG. 11 is a top view showing a structure of a semiconductor laser device according to a second embodiment of the present invention.
Figure 12:
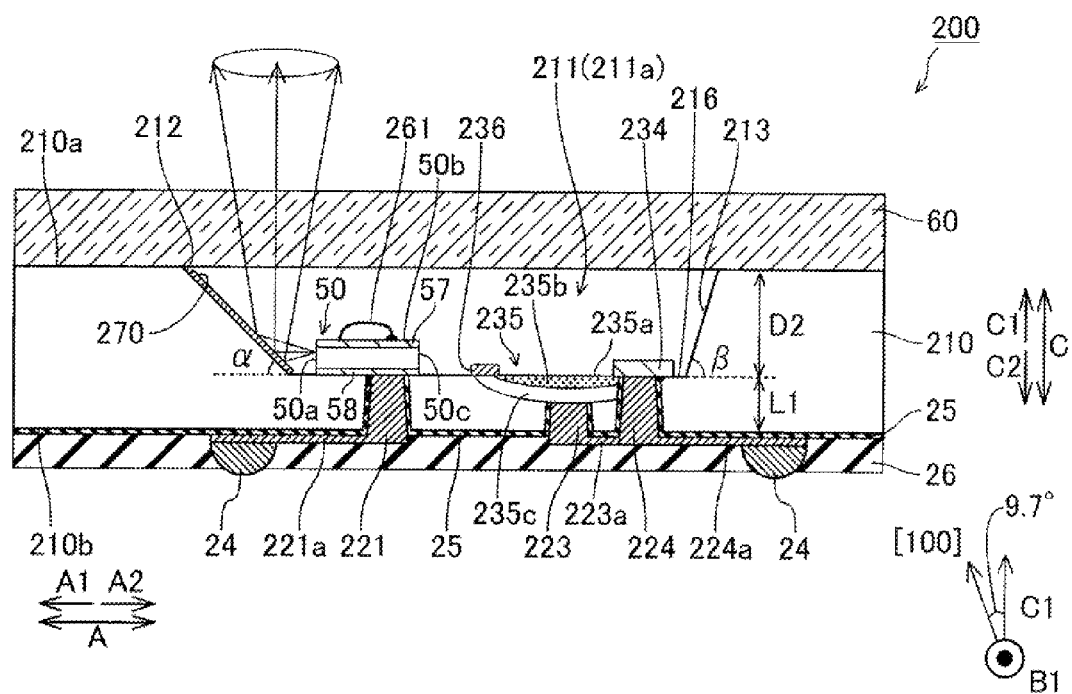
FIG. 12 is a cross-sectional view showing a structure of a semiconductor laser device according to a second embodiment of the present invention.

As shown in FIG. 11, the semiconductor laser device 200 according to the second embodiment of the present invention includes (1) a Si(100) substrate 210, having a high resistivity, in which a recess 211 dent from above (C1 side) toward below (C2 side) is formed, (2) a semiconductor laser element 50 bonded to a surface of a bottom face 216 of the recess 211, and (3) a translucent sealing glass 60 for blocking an opening 211a of the recess 211 wherein the sealing glass 60 is mounted on a top face 210a of the Si(100) substrate 210. Note that the Si(100) substrate 210 is an example of "semiconductor substrate" in claim phraseology (WHAT IS CLAIMED), whereas the opening 211a is an example of "first opening" in claim phraseology.

As shown in FIG. 12, in the second embodiment, the back side of the semiconductor laser element 50 (underside of an n-side electrode 58) is bonded, in a position closer to an A1 side (inner wall surface 212 side) from an approximate center in the recess 211, to the bottom face 216. In other words, no submount 30 is provided and the semiconductor laser element 50 is directly bonded on top of the bottom face 216 of the recess 211. Thus, the recess 211 is so formed that a depth D2 of the recess 211 is shallower (about 300 μm) as compared to the case where the submount 30 (see FIG. 2) is used in the above-described first embodiment. In a region where the semiconductor laser 50 is bonded to the bottom face 216, a through-hole electrode 221 penetrating from the bottom face 216 toward a back side 210b in a thickness direction of the Si(100) substrate 210 is provided via the insulating film 25. Thereby, the n-side electrode 58 of the semiconductor laser element 50 electrically conducts to the through-hole electrode 221 via an electrically conductive adhesion layer (not shown).

Also, in the second embodiment, a monitoring PD 235 is formed such that the monitoring PD 235 is embedded in the Si(100) substrate 210 in a position closer to an A2 side (inner wall surface 213 side) from an approximate center in the recess 211. The monitoring PD 235 is formed such that a light-receiving surface 235a is exposed on a bottom face 216 side surface. As a result, the arrangement is such that the laser light emitted from the light emission facet 50a to a light-reflecting surface 50c side of the semiconductor laser element 50 enters the light-receiving surface 235a of the monitoring PD 235. The monitoring PD 235 is formed such that the periphery of the light-receiving surface 235a is surrounded by the insulating film 236 (see FIG. 11).

As shown in FIG. 12, in the second embodiment, the inner wall surface 212 disposed counter to the light emission facet 50a of the semiconductor laser element 50 is formed such that the inner wall surface 212 extends at an inclination angle α of about 45 degrees relative to the bottom face 216. A metallic reflective film 270, formed of Al, having a thickness ranging from about 100 nm to about 500 nm is formed on a region in the inner wall surface 212 disposed counter to the light emission facet 50a, using an evaporation method or sputtering method. In this manner, the semiconductor laser device 200 is configured such that the laser light emitted from the light emission facet 50a of the semiconductor laser element 50 in the direction A1 is reflected upward in the inner wall surface 212 of the recess 211 (the metallic reflective film 270) and then transmits through the sealing glass 60 so as to be emitted to the exterior. The inner wall surfaces 212 to 215 are an example of "inner wall surface" in claim phraseology (WHAT IS CLAIMED). The inner wall surface 212 is an example of "first region of an inner wall surface" and "first tilted surface" in the claim phraseology, whereas the inner wall surface 213 is an example of "second region of an inner wall surface" and "second tilted surface" in the claim phraseology. In the second embodiment, a means for reflecting the laser light to the exterior is constituted by the inner wall surface 212 and the metallic reflective film 70.

Also, in the second embodiment, the inner wall surface 213 of the recess 211 disposed counter to a light-reflecting surface 50c side of the semiconductor laser element 50 is formed such that the inclination angle β (about 64.4 degrees) relative to the bottom face 216 is greater than the inclination angle for the inner wall surface 212 relative thereto. In other words, a larger flat region of the bottom face 216 can be assured, on the light-reflecting surface 50c side of the semiconductor laser element 50, by as much as the increased angle of the inclination angle β over the inclination angle β (β>α).

As shown in FIG. 11, a pad electrode 233 for use with wire bonding is formed in a region interposed between the semiconductor laser element 50 and the inner wall surface 214. A through-hole electrode 222 that penetrates the Si(100) substrate 210 from the bottom face 216 toward the back side 210b in a thickness direction is provided below the pad electrode 233. The through-hole electrode 222 is electrically connected to the pad electrode 233.

A through-hole electrode 223 that penetrates the Si(100) substrate 210 in a thickness direction is provided in a region of the bottom face 216 where the monitoring PD 235 is formed. Thereby, an n-type region 235c of the monitoring PD 235 conducts electrically to the through-hole electrode 223 in the Si(100) substrate 210, as shown in FIG. 12. A p-type region 235b of the monitoring PD 235 is formed on top of the n-type region 235c in such a manner that the light-receiving surface 235a is exposed inside the recess 211. As shown in FIG. 11, a sheet-like metallic wiring 234 made of Cu is formed in a region interposed the monitoring PD 235 and the inner wall surface 215. As shown in FIG. 12, a through-hole electrode 224 that penetrates the Si(100) substrate 210 from the bottom face 216 toward the back side 210b in a thickness direction is provided below the pad electrode 234. The through-hole electrode 224 is electrically connected to the metallic wiring 234.

Thus, as shown in FIG. 11, one end of a wire 261 is wire-bonded to the p-side pad electrode 57, whereas the other end of the wire 261 is wire-bonded to the pad electrode 233. One of end portions of the monitoring PD 235 which is disposed opposite to the through-hole electrode 224 of the metallic wiring 234 is bonded to the p-side region 235b in such a manner as to lie across the insulating film 236.

Figure 13:
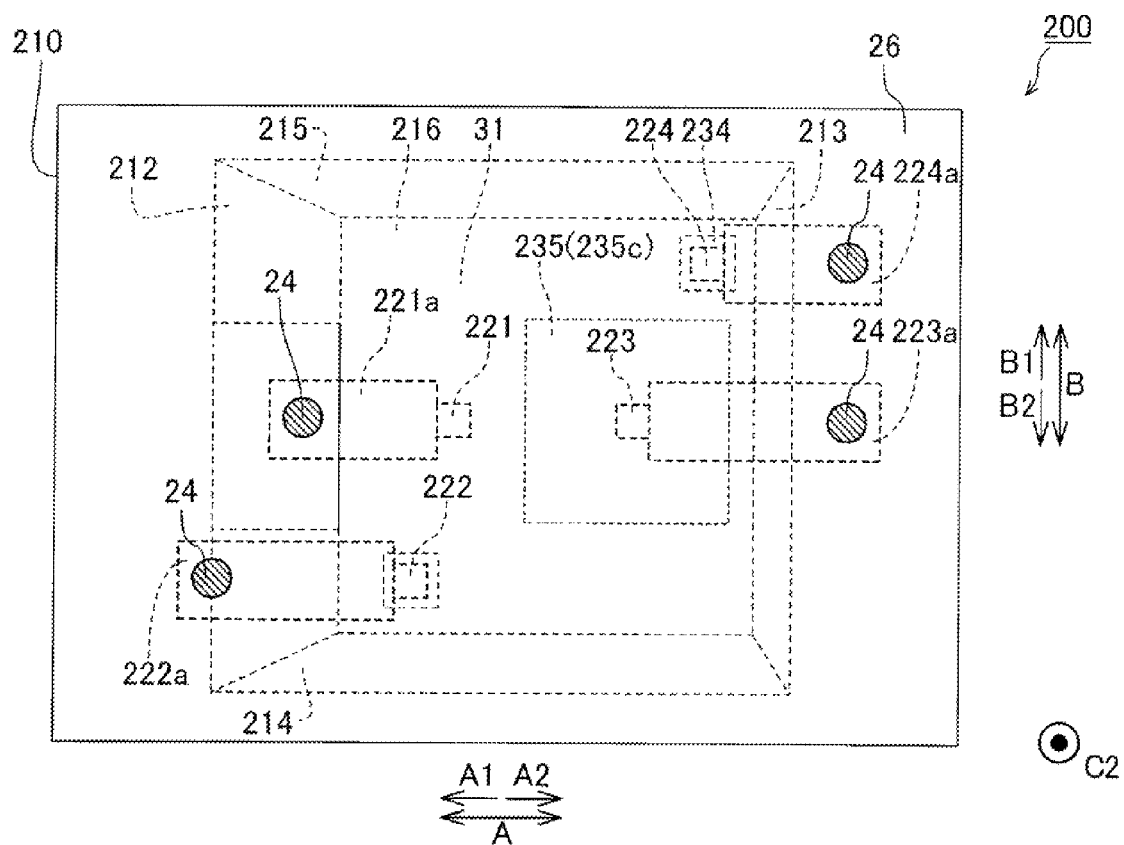
FIG. 13 is a bottom view showing a structure of a semiconductor laser device according to a second embodiment of the present invention.

As shown in FIG. 12, the through-hole electrode 221 has a leader wiring portion 221a that extends from a portion exposed on the back side 210b of the Si(100) substrate 210, along the back side 210b. Similarly, the through-hole electrodes 222 to 224 have leader wiring portions 222a to 224a (see FIG. 13), respectively, extending from portions exposed on the back side 210b, along the underside 10b. A solder ball 24 is formed on each end of the leader wiring portions 221a to 224a. Thus, as shown in FIG. 13, the arrangement is such that when the semiconductor laser device 200 is viewed from the underside thereof (C2 side), four solder balls 24 only are exposed on the surface of the protective film 26. Other structural components of the semiconductor laser device 200 according to the second embodiment is similar to those of the above-described first embodiment.

In the fabrication process of the semiconductor laser device 200 according to the second embodiment, after the recess 211 has been formed in the wafer-level Si(100) substrate 210 by the wet etching, a photodiode layer is formed such that the n-type region 235c and the p-type region 235b are embedded, in this order, in a predetermined region of the bottom face 216 of the recess 211 (a region on an A2 side of FIG. 11) from within the Si(100) substrate 210 toward the bottom face 216, using ion implantation. In this manner, the monitoring PD 235 is formed. In so doing, the insulating film 236 is formed on a part of the n-type region 235c and the p-type region 235b exposed on the bottom face 216 so as to ensure the insulation on the periphery (see FIG. 12). Then, as shown in FIG. 11, the back side (n-side electrode 58) of a single-chip semiconductor laser element 50 is directly bonded to the bottom face 216 so as to be placed inside the recess 211. Other fabrication processes carried out in the second embodiment are similar to those in the above-described first embodiment.

In the second embodiment, as described above, the semiconductor laser element 50 is directly bonded to the bottom face 216 of the recess 211. Thus the height as measured from the bottom face 216 to the top face 50b of the semiconductor laser element 50 can be reduced by as much as the space otherwise occupied by the submount 30 (see FIG. 2). That is, even though the recess 211 is formed at a shallower depth D2 (about 300 μm), the sealing glass 60 can easily block the opening 211a of the recess 211. Hence, the semiconductor laser device 200 can be further thinned.

Also, in the second embodiment, the semiconductor laser element 50 is directly bonded to the bottom face 216 of the recess 211, so that the irradiation range of the laser light irradiated to the inner wall surface 212 (metallic reflective film 270) can be further shifted toward the bottom face 216 side by as much as a degree to which the emission position of the laser light is further lowered (the direction C2). This structures allows the laser light having an elliptically-shaped pattern to be reliably irradiated to the inner wall surface 212 (metallic reflective film 270). In particular, when a semiconductor laser element that emits the laser light having a larger spread angle is to be used, the laser light can be reliably irradiated to the inner wall surface 212 (metallic reflective film 270) without the underside of the sealing glass 60 being directly irradiated with the upper edge of the laser light. Other advantageous effects achieved by the second embodiment are similar to those of the above-described first embodiment.

Third Embodiment

A third embodiment is now described with reference to FIG. 14 to FIG. 16. In a semiconductor laser device 300, according to the third embodiment, which differs from the semiconductor laser device 100 of the above-described first embodiment, a description is given of a case where a recess 311 in which the semiconductor laser element 50 is placed is provided such that a photo solder resist 350, or an insulator, blocks an opening 301b (see FIG. 16) in one side (C2 side) of a Si(100) substrate 310 having through-holes 301. FIG. 15 is a cross-sectional view taken along line 3000-3000 of FIG. 14. Each component identical to that of the first embodiment is given the identical reference numeral in FIG. 14. Note that the Si(100) substrate 310 is an example of "semiconductor substrate" in claim phraseology (WHAT IS CLAIMED), whereas the photo solder resist 350 is an example of "support base" in claim phraseology. Also, the opening 301b is an example of "second opening" in claim phraseology.

As shown in FIG. 15, the semiconductor laser device 300 according to the third embodiment of the present invention includes (1) a Si(100) substrate 310, having a high resistivity (insulation properties), in which a through-hole 301 penetrates in a thickness direction (direction C), (2) a photo solder resist 350 for forming the recess 311 by blocking an opening 301b (see FIG. 16) at the lower side (C2 side) of the through-hole 301 in such a manner that the photo solder resist 350 is bonded to an underside 310b of the Si(100) substrate 310 via an adhesive resin 351, (3) a semiconductor laser element 50 placed on a bottom face 316 of the recess 311 via a submount 30, and (4) a translucent sealing glass 60 for blocking an opening 311a at an upper side (C2 side) of the recess 311 wherein the sealing glass 60 is mounted on a top face 310a of the Si(100) substrate 310. Here, the photo solder resist is an insulating film using a photosensitive resin, by which an exposed part only is structurally altered so as not to be dissolved by a solvent and the like. Note that the opening 311a is an example of "first opening" in claim phraseology.

According to the third embodiment, in a fabrication process described later, anisotropic etching is, as shown in FIG. 15, performed on the Si(100) substrate 310 having a main surface (top face 310a) tilted about 9.7 degrees relative to an approximately (100) plane, thereby forming the four inner wall surfaces 312, 313, 314 and 315 (composed of Si(111) planes) in the Si(100) substrate 310. The use of the Si(100) substrate 310 having the main surface tilted about 9.7 degrees allows the formation of the inner wall surface 312 which is tilted at an inclination angle α of about 45 degrees relative to a top face 350a of the photo solder resist 350 (relative to the bottom face 316). At the same time, the use of the Si(100) substrate 310 allows the formation of the inner wall surface 313 which is tilted at an inclination angle β of about 64.4 degrees relative to the top face 350a (bottom face 316). The inner wall surfaces 314 and 315 (see FIG. 14) are each formed such that each of them is tilted at an inclination angle γ of about 54.7 degrees relative to the top face 350a (bottom face 316). The inner wall surfaces 312 to 315 are an example of "inner wall surface" in claim phraseology. The inner wall surface 312 is an example of "first region of an inner wall surface" and "first tilted surface" in the claim phraseology, whereas the inner wall surface 313 is an example of "second region of an inner wall surface" and "second tilted surface" in the claim phraseology.

In the third embodiment, the four inner wall surfaces 312, 313, 314 and 315 and the adhesive resin 351 formed on top (the surface on a C1 side) of the photo solder resist 350 constitute the recess 311. The adhesive resin 351 is used to join the Si(100) substrate 310 and the photo solder resist 350 together. As shown in FIG. 15, the bottom face 316 of the recess 311 is constituted substantially of a part of the upper face of the adhesive resin 351. The Si(100) substrate 310 has a thickness of about 500 μm; i.e., the distance between the top face 310a and the underside 310b of the Si(100) substrate 310 is about 500 μm.

In the third embodiment, a wiring electrode 331, made of Cu or the like, which is used to die-bond the submount 30 is formed in a region (a region constituting the bottom face 316 of the recess 311) exposed inside the recess 311, wherein said region exposed inside the recess 311 is a part of the upper face of the photo solder resist 350 (adhesive resin 351). With such an arrangement described as above, the back side (C2-side surface) of the submount 30 is bonded, in a position closer to an A1 side (inner wall surface 312 side) from an approximate center in the recess 311, to the surface of the wiring electrode 331 via an electrically conductive adhesion layer (not shown). In other words, the submount 30 to which the semiconductor laser element 50 is bonded is placed on top of a "support base", in the claim phraseology, which is constituted by the photo solder resist 350 and the wiring electrode 331 formed on the solder resist 350. The wiring electrode 331 exposed inside the recess 311 has a plane area larger than that of the submount 30, and the submount 30 is placed within a region where the wiring electrode 331 is formed. The wiring electrode 331 has a leader wiring portion 331a that extends from, a position in which the submount 30 is placed, along the direction A1. The surface of the wiring electrode 331 exposed on the bottom surface 316 is an example of "bottom face" in the claim phraseology.

As shown in FIG. 15, in the third embodiment, too, the semiconductor laser element 50 is placed on the submount 30 in the state where the top face 50b is lowered below the top face 310a of the Si(100) substrate 310 (C2 side). The plate-like (flat) sealing glass 60 blocks the opening 311a of the recess 311 with the sealing glass 60 covered from above the top face 310a, so that the interior of the recess 311 on which the semiconductor element 50 is placed is sealed hermetically.

In the third embodiment, too, the metallic reflective film 70 is formed on top of the inner wall surface 312 in a region thereof disposed counter to the light emission facet 50a. Thus, the semiconductor laser device 300 is configured such that the laser light emitted from the light emission facet 50a of the semiconductor laser element 50 in the direction A1 is reflected upward (direction C1) in the inner wall surface 312 of the recess 311 (the metallic reflective film 70) and then transmits through the sealing glass 60 so as to be emitted to the exterior. Note that a means for reflecting the laser light to the exterior is constituted by the inner wall surface 312 and the metallic reflective film 70.

Figure 14:
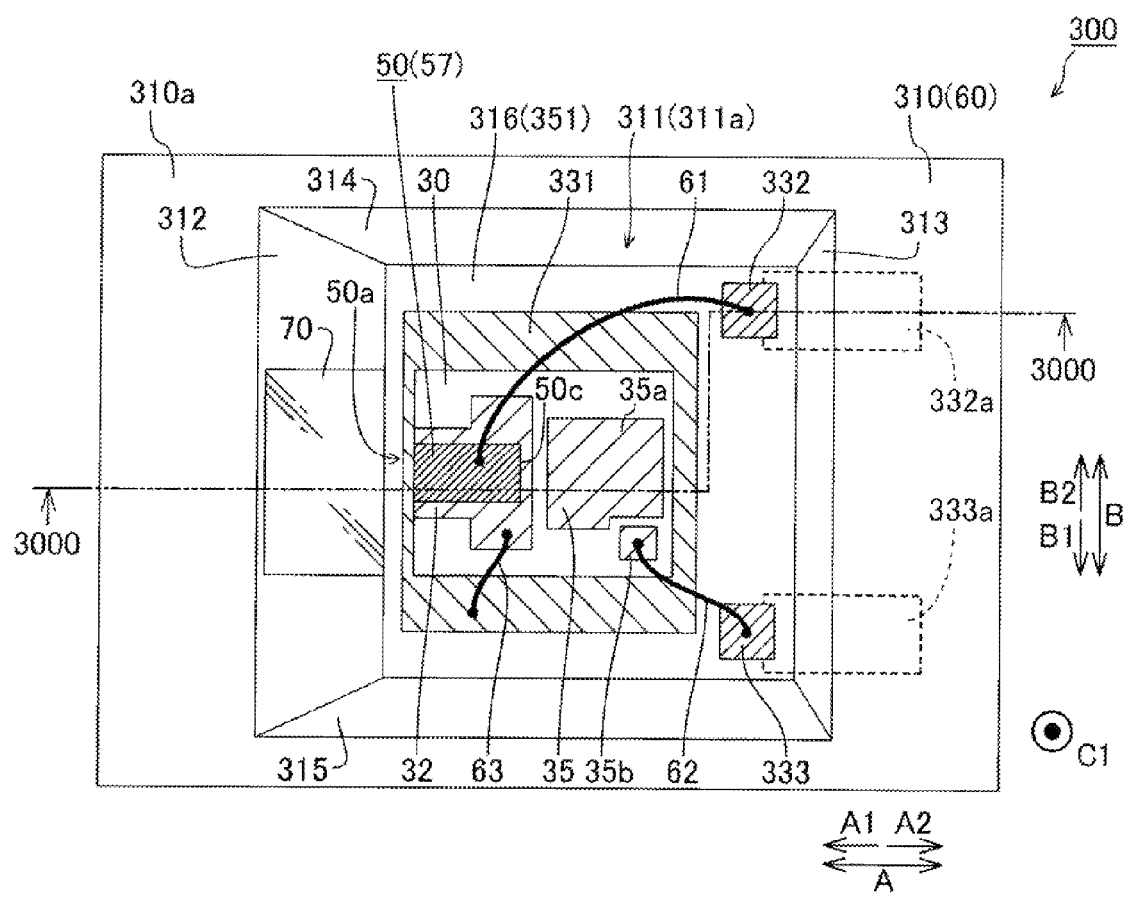
FIG. 14 is a top view showing a structure of a semiconductor laser device according to a third embodiment of the present invention.
Figure 15:
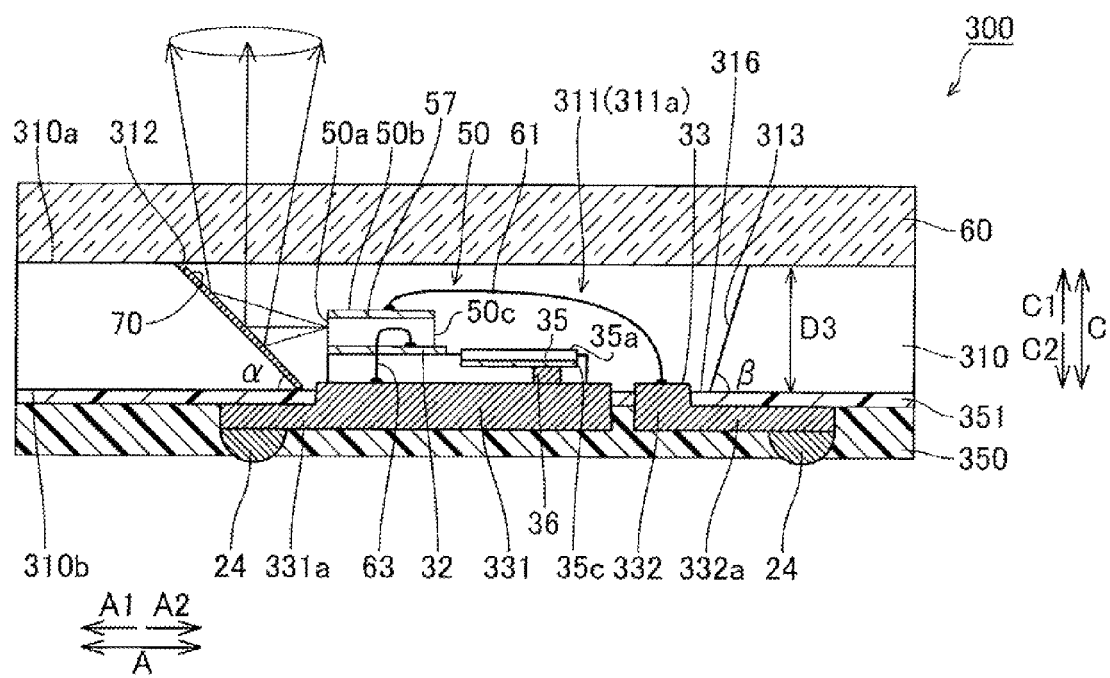
FIG. 15 is a cross-sectional view showing a structure of a semiconductor laser device according to a third embodiment of the present invention.

As shown in FIG. 14, a wiring electrode 332 and a wiring electrode 333 both for use with wire bonding are formed in a region of the bottom face 316 of the recess 311 where the wiring electrode 331 is not formed; each of the wiring electrode 332 and the wiring electrode 333 is of a rectangular shape whose dimensions are about 100 μm×about 100 μm. In other words, the wiring electrode 333 is formed in such a manner as to be exposed in a region, interposed between the submount 30 and the inner wall surface 313, which is situated nearer the inner wall surface 314 (B2 side), whereas the wiring electrode 333 is formed in such a manner as to be exposed in a region situated nearer the inner wall surface 315 (B1 side). The wiring electrodes 332 and 333 have leader wiring portions 332a and 333a, respectively, extending along the direction A2.

Thus, in the semiconductor laser element 50, one end of the wire 61 is wire-bonded to the p-side pad electrode 57, and the other end of the wiring 61 is wire-bonded to the wiring electrode 332. In the monitoring PD 35, one end of the wire 62 is bonded to the pad electrode 35b connected to the p-type region, and the other end of the wire 62 is wire-bonded to the wiring electrode 333. The solder ball 24 made of Sn—Ag—Cu solder is formed in each end of the leader wiring portions 331a, 332a and 333a. Note that the other structural components of the third embodiment are similar to those of the above-described first embodiment.

Now, with reference to FIG. 14 through FIG. 20, a description will be given of a manufacturing process of a semiconductor laser device 300 according to the third embodiment.

Figure 16:
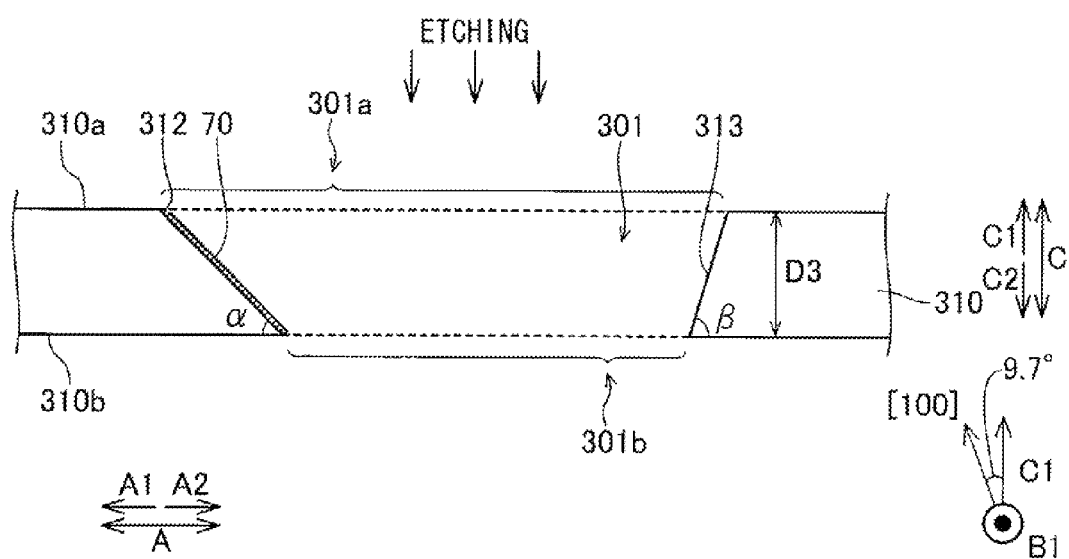
FIG. 16 is a cross-sectional view for explaining a fabrication process of a semiconductor laser device according to a third embodiment of the present invention.

As shown in FIG. 16, a wafer-level Si(100) substrate 310 having a thickness D3 of about 500 μm and having the main surface (top face 310a) tilted about 9.7 degrees relative to the approximately (100) plane is first prepared. Then, wet etching (anisotropic etching) is performed, using an etchant such as TMAH, on the Si(100) substrate 310 where an etching mask (not shown) having a predetermined mask pattern is formed on the top face 310a, thereby forming a through-hole 301 penetrating from the top face 310a to the underside 310b. As a result, a plurality of through-holes 310 each having openings 301a and 301b are formed in the wafer-level Si(100) substrate 310. The opening 301a is an example of "first opening" in the claim phraseology.

In this case, as the etching proceeds along the crystal orientation of Si, the four inner wall surfaces 312, 313, 314 and 315 are formed in the through-hole 301. The inner wall surface 312 is an etched surface (tilted surface) tilted at an inclination of about 45 degrees (angle α) relative to the top face 310a. The inner wall surface 313 is an etched surface (tilted surface) tilted at an inclination of about 64.4 degrees (angle β) relative to the top face 310a. The inner wall surfaces 314 and 315 (see FIG. 14) is each an etched surface tilted at an inclination of about 54.7 degrees (angle γ) relative to the top face 310a (see FIG. 7).

Then, a metallic reflective film 70 is formed on a region in the inner wall surface 312 disposed counter to the light emission facet 50a (see FIG. 15) in a state where the semiconductor laser element 50 is being placed, by the use of an evaporation method or sputtering method.

Figure 17:
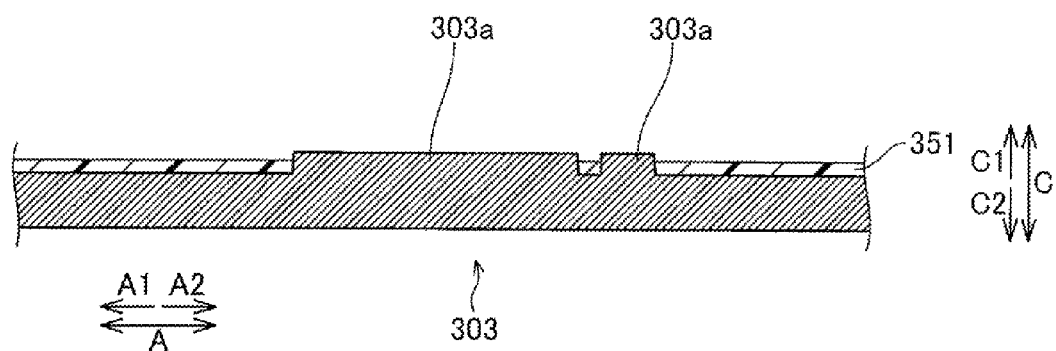
FIG. 17 is a cross-sectional view for explaining a fabrication process of a semiconductor laser device according to a third embodiment of the present invention.

On the other hand, as shown in FIG. 17, a flat plate-like copper plate 303 having a thickness of about 100 μm is prepared. An etching mask (not shown) having a predetermined mask pattern is formed on top of the copper plate 303 and then the wet etching is done to the copper plate 303, using an etchant such as a ferric chloride solution. This process etches the copper plate 303 from above and below and forms a protrusion 303a whose flat portion has a thickness of about 60 μm and whose protruded portion above an upper surface of the flat portion thereof. (C1-side surface of the flat portion thereof) has a height of about 20 μm.

Then, the thermosetting, epoxy-based adhesive resin 351 is glued to top of the copper plate 303 by a laminate process using a roll laminator or hot press machine. In so doing, the adhesive resin 351 is glued thereto at a temperature of 100° C. or below which does not cause the adhesive resin 351 to become completely hardened. Then, a part of the adhesive resin 351 covering the protrusion 303a is removed by an $O_2$ plasma treatment or polishing.

Figure 18:
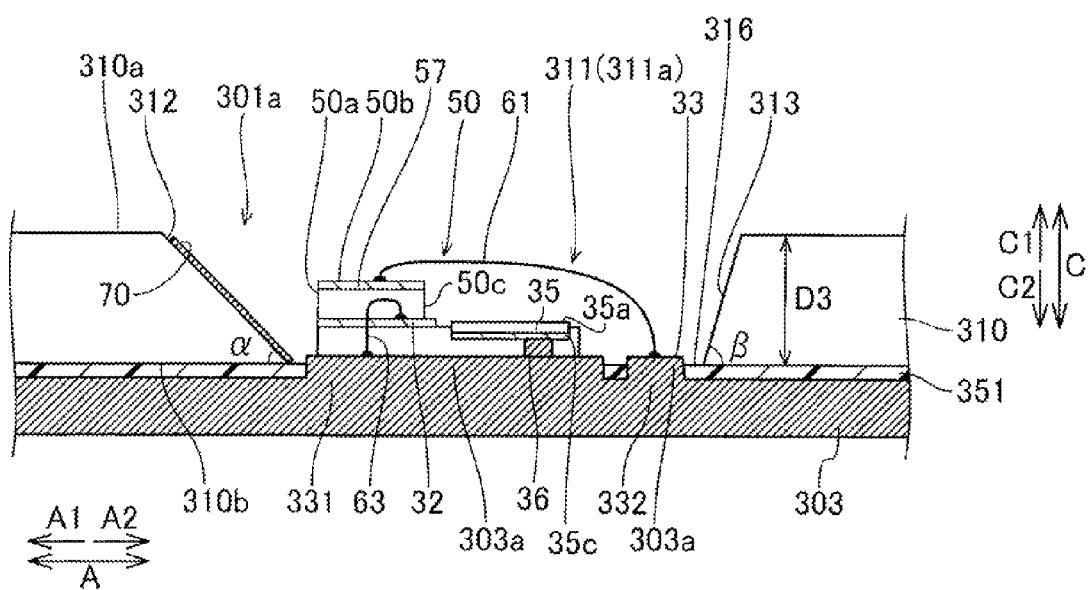
FIG. 18 is a cross-sectional view for explaining a fabrication process of a semiconductor laser device according to a third embodiment of the present invention.

Then, as shown in FIG. 18, the copper plate 303 is glued to the underside 310b of the Si(100) substrate 310 having the through-hole 301 via the adhesive resin 351. Then, the Si(100) substrate 310 and the copper plate 303 are heated and press-bonded for five minutes under the conditions of a temperature of about 200° C. and a pressure of about 1 MPa so as to be finally bonded together. Thereby, the opening 301b (see FIG. 16) of the Si(100) substrate 310 is closed up, and the recess 311 is formed. Also, the opening 301a of the Si(100) substrate 310 remains as the opening 311a above (C1 side) of the recess 311.

Then, the submount 30 to which the semiconductor element 50 has already been bonded is bonded on top of the wiring electrode 331. Then, the p-side pad electrode 57 of the semiconductor laser element 50 is connected to the wiring electrode 332 using the wire 61, and the pad electrode 35b connected to the p-type region of the monitoring PD 35 is connected to the wiring electrode 333 using the wire 62. Also, the pad electrode 32 and the pad electrode 31 are connected using the wire 63 (FIG. 14). It is to be noted here that a metallic film made of Au or the like may be formed in the surface of the wiring electrodes 332 and 333 before the wires 61 and 62 are wire-bonded to the wiring electrodes 332 and 333.

Figure 19:
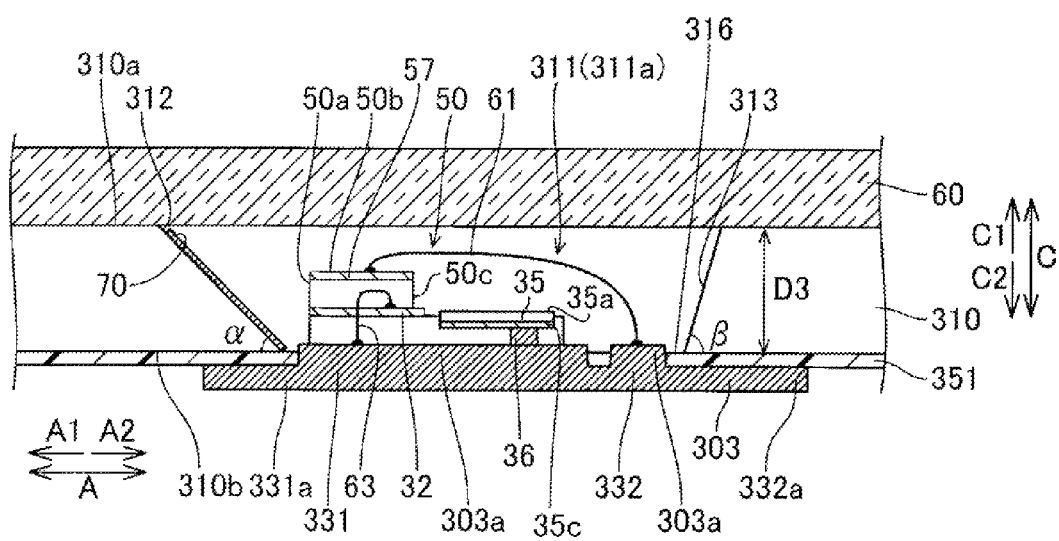
FIG. 19 is a cross-sectional view for explaining a fabrication process of a semiconductor laser device according to a third embodiment of the present invention.

Then, as shown in FIG. 19, the wafer-level sealing glass 60 having a thickness of about 500 μm is affixed to the recess 311 of the Si(100) substrate 310 from above (C1 side), using thermocompression bonding. In so doing, the Si(100) substrate 310 and the sealing glass 60 are bonded together under conditions of a temperature ranging from about 200° C. to about 250° C., using a thermosetting adhesive resin (not shown) or the like. As a result, the sealing glass 60 is bonded to the Si(100) substrate 310 in the top face 310a surrounding the opening 311a of the recess 311 and therefore the interior of the recess 311 is sealed hermetically.

Then, to form a wiring pattern, the underside of the copper plate 303 is etched. Thereby, the thickness of the copper plate 303 except for the protrusion 303a becomes approximately 20 μm. Further, an etching mask (not shown) having a predetermined mask pattern is formed on the underside of the copper plate 303 and then the wet etching is done to the copper plate 303, using a ferric chloride solution. This process results in the formation of wiring electrodes 331 to 333 (see FIG. 19), having predetermined patterns thereon, constituted by leader wiring portions 331a, 332a and 333a. At this time, the adhesive resin 351 is partially exposed from below the removed copper plate 303.

Then, to cover the underside of the wiring electrodes 331 to 333, the photo solder resist 350 having a thickness of about 30 μm is formed on the underside of the wiring electrodes 331 to 333 and the exposed adhesive resin 351. In so doing, the photo solder resist 350 in the form of a film may be glued through a lamination process or the photo solder resist 350 in the form of a liquid may be applied. Then, a part of the underside of the photo solder resist 350 is removed, and a solder ball 24 is formed on each end of the leader wiring portions 331a, 332a and 333a (see FIG. 14) exposed from the photo solder resist 350.

Figure 20:
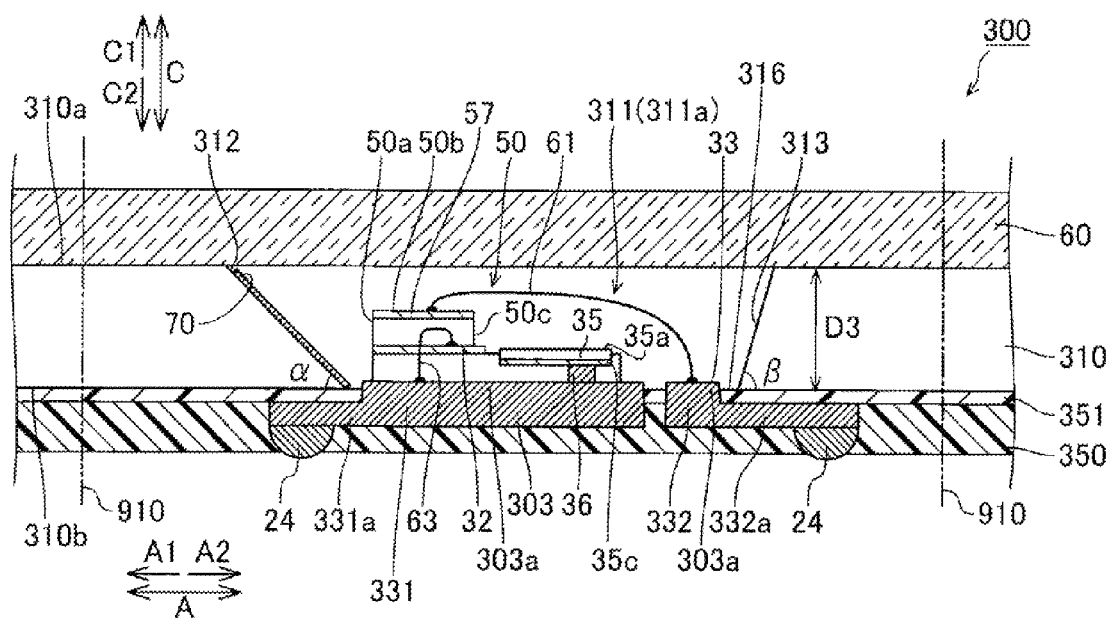
FIG. 20 is a cross-sectional view for explaining a fabrication process of a semiconductor laser device according to a third embodiment of the present invention.

Finally, in a region outside the region where the recess 311 is formed, both the sealing glass 60 and the Si(100) substrate 310 are cut (diced) along a demarcation lines 910 of FIG. 20 in the direction C using a diamond blade. In this manner, the semiconductor laser device 300 as shown in FIG. 14 is formed.

By employing the semiconductor laser device 300 according to the third embodiment, the semiconductor laser device 300 is, as described above, provided with (i) the Si(100) substrate 310 in which the through-hole 301 penetrating in a thickness direction is formed, (ii) the sealing glass 60, mounted on the top face 310a of the Si(100) substrate 310, for sealing the opening 301a of the through-hole 301, (iii) the photo solder resist 350, mounted on the underside 310b of the Si(100) substrate 310, for sealing the opening 310b of the through-hole 301, and (iv) the semiconductor laser element 50 placed on the surface of the wiring electrode 331 formed in the photo solder resist 350 exposed in the opening 301b, via the submount 30. Thereby, the top face 50b of the semiconductor laser element 50 placed on the surface of the wiring electrode 331 exposed in the opening 301b does not protrude outside the opening 301a (311a) of the through-hole 301 (C1 side in FIG. 15). Hence, the semiconductor laser element 300 can be operated under the conditions where the semiconductor laser element 300 is easily air-tightly sealed by the photo solder resist 350 and the sealing glass 60. As a result, the semiconductor laser element 50 is not subject to the moisture in the air and the organic materials existent on the periphery of the semiconductor laser device 300 and therefore the reduction in reliability of the semiconductor laser element 50 can be suppressed.

Also, in the third embodiment, the structure is such that the laser light emitted from the semiconductor laser element 50 is reflected by the metallic reflective film 70 formed on the surface of the inner wall surface 312 of the through-hole 301 and then transmits through the sealing glass 60 so as to be emitted externally. Hence, a part (i.e., the inner wall surface 312) of the through-hole 301 of the Si(100) substrate 310 fixed to the photo solder resist 350 on which the semiconductor laser element 50 is placed via the submount 30 may serve also as a means for reflecting the laser light. In other words, since the accuracy of the optical axis of the laser light reflected by the metallic reflective film 70 formed on the inner wall surface 312 depends only on the installation error caused when the semiconductor laser element 50 is to be placed on the surface of the wiring electrode 331 formed on the photo solder resist 350 via the submount 30, the magnitude of the shift or displacement in the optical axis can be reduced by as much as the reduced number of factors causing the shift or displacement in the optical axis.

Also, in the third embodiment, the semiconductor laser device 300 includes the Si(100) substrate 310 in which the through-hole 301 is formed, the photo solder resist 350 for sealing the opening 301b of the through-hole 301, and the semiconductor laser device 50 placed on the surface of the wiring electrode 331 exposed inside the opening 301b. Thereby, the "support base" (which is a generic term of the photo solder resist 350) where the semiconductor laser element 50 is placed may be formed as another member using a material different from the material of the Si(100) substrate 310. Hence, the strength of the semiconductor laser device 300 can be further increased. Also, in the fabrication process, the Si(100) substrate 310, in which the through-hole 301 is formed, and the flat plate-like photo solder resist 350 are bonded together through the medium of the adhesive resin 351, so that a package in which to place the semiconductor laser element 50 can be easily formed.

Also, in the fabrication process according to the third embodiment, when the wet etching is performed on the Si(100) substrate 310, the inner wall surfaces 312, 313, 314 and 315 are formed by the formation of the through-hole 301 that penetrates the Si(100) substrate 310. Thus, the fabrication process does not suffer a variation in the etching depth that would otherwise occur if, for example, the wet etching is stopped inside the substrate. Also, the semiconductor laser element 50 placed on the photo solder resist 350 (copper plate 303) can be placed in the recess 331 with excellent installation accuracy. This enables suppressing efficiently the displacement in the optical axis of the laser light caused by an installation angle (a vertical angle relative to a cavity direction or width direction) and the variation in the distance between the light emission facet 50a and the metallic reflective film 70, throughout the manufacturing process.

Also, in the third embodiment, the semiconductor laser element 50 is placed on the wiring electrode 331 (copper plate 303) having excellent thermal conductivity, via the submount 30, so that the heat generated by the semiconductor laser element 50 can be released efficiently through the medium of the wiring electrode 331 (copper plate 303).

Also, in the fabrication process according to the third embodiment, the Si(100) substrate 310 having the main surface tilted about 9.7 degrees relative to an approximately (100) plane is used. Thus, when the through-hole 301 is formed in the Si(100) substrate 310 by wet etching, the four inner wall surfaces 312 to 315 can be formed simultaneously with the etching process. Hence, the more simplified the fabrication process is as in this third embodiment, the more efficiently the semiconductor laser device 300 is manufactured.

Also, in the fabrication process according to the third embodiment, performing one-time etching on the wafer-level Si(100) substrate 310 allows the simultaneous formation of a plurality of through-holes 301. Thus, the semiconductor laser device 300 can be further efficiently manufactured accordingly.

Also, in a fabrication process according to the third embodiment, the wafer-level sealing glass 60 is bonded, through thermocompression bonding, to a wafer where the semiconductor laser element 50 is placed on each of the bottom face 16 of a plurality of recesses 311 (a wafer where the photo solder resist 350 is bonded to the Si(100) substrate 310), thereby sealing the recess 311. As a result, the plurality of recesses 311 can be simultaneously sealed air-tightly through a bonding process of a single piece of sealing glass 60 and therefore the semiconductor laser device 300 can be manufactured further efficiently accordingly. Other advantageous effects achieved by the third embodiment are similar to those of the above-described first embodiment.

Fourth Embodiment

Figure 21:
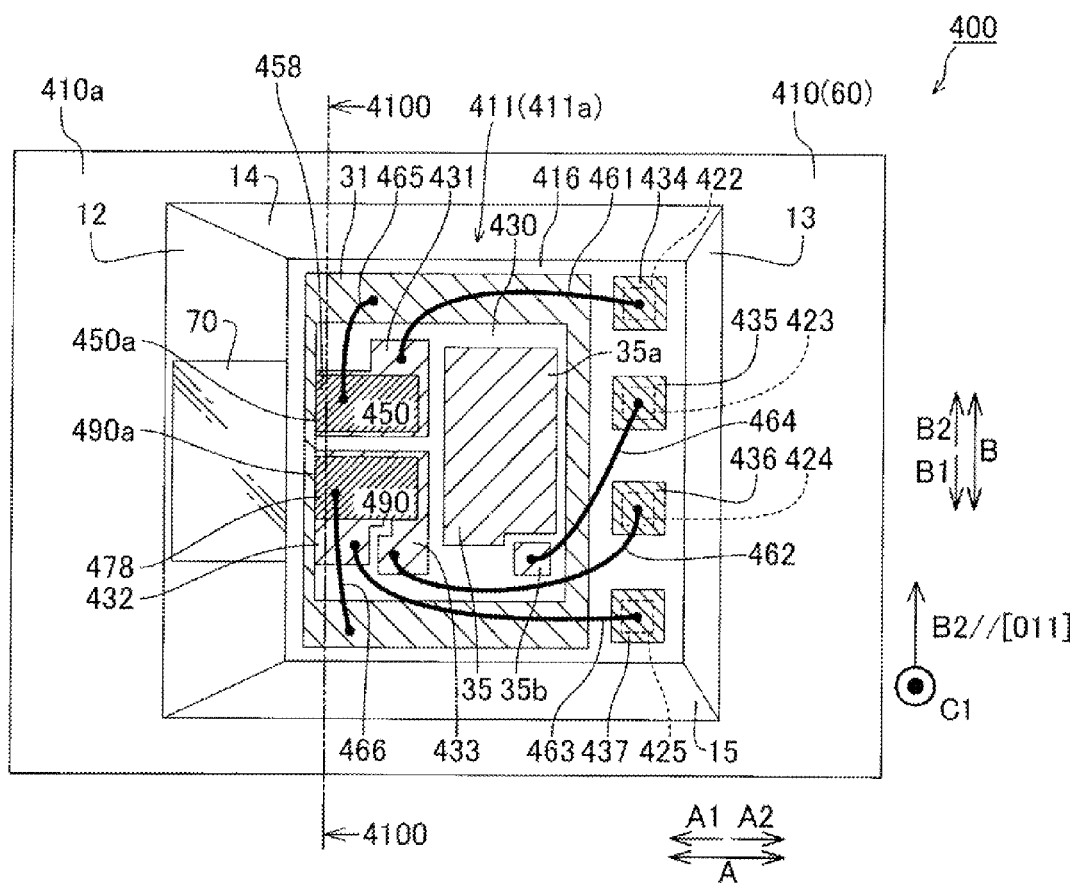
FIG. 21 is a top view showing a structure of a three-wavelength semiconductor laser device according to a fourth embodiment of the present invention.
Figure 22:
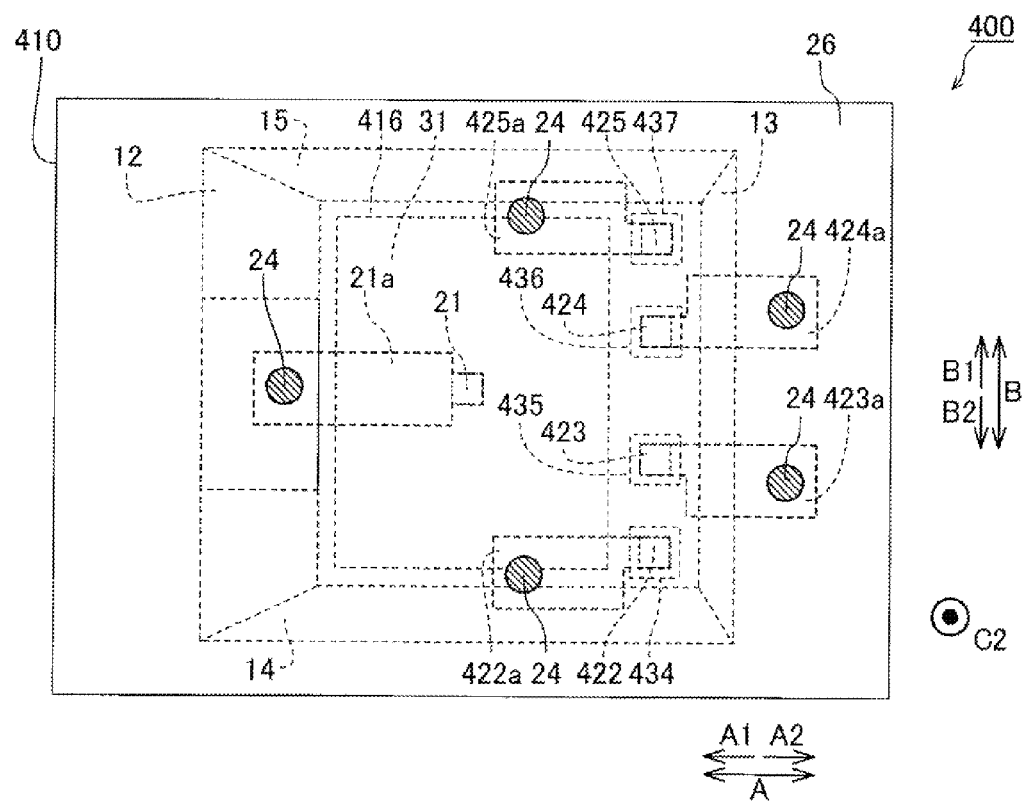
FIG. 22 is a bottom view showing a structure of a three-wavelength semiconductor laser device according to a fourth embodiment of the present invention.
Figure 23:
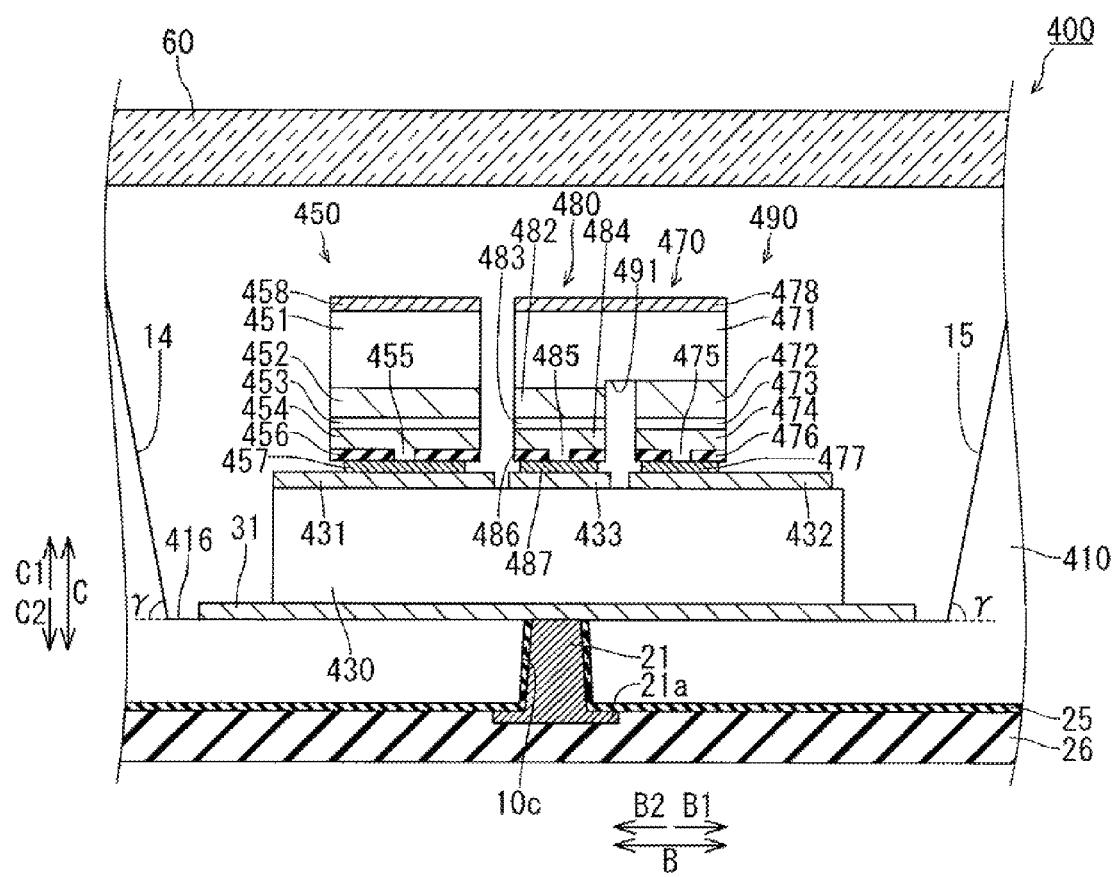
FIG. 23 is a cross-sectional view showing a structure of a three-wavelength semiconductor laser device according to a fourth embodiment of the present invention.

A description is first given of a structure of a three-wavelength semiconductor laser device 400 according to a fourth embodiment with reference to FIG. 1 and FIG. 21 to FIG. 23. In the three-wavelength semiconductor laser device 400 according to the fourth embodiment, which differs from the semiconductor laser device 100 of the above-described first embodiment, a description is given of a case where a blue-violet semiconductor laser element 450 and a two-wavelength semiconductor laser element 490 comprised of a red and an infrared semiconductor laser element are placed in a recess 411. FIG. 23 is a cross-sectional view taken along line 4100-4100 of FIG. 21. Each component identical to that of the first embodiment is given the identical reference numeral in FIG. 21 to FIG. 23.

As shown in FIG. 21, the three-wavelength semiconductor laser device 400 according to the fourth embodiment of the present invention includes (1) a Si(100) substrate 410 in which the recess 411 having a similar structure to that of the above first embodiment is formed, (2) the blue-violet semiconductor laser element 450 and the two-wavelength semiconductor laser element 490 placed on a bottom face 416 of the recess 411 via a submount 430, and (3) a translucent sealing glass 60 for blocking an opening 411a of the recess 411 wherein the sealing glass 60 is mounted on a top face 410a of the Si(100) substrate 410. Thereby, the three-wavelength semiconductor laser device 400 is configured such that the laser light emitted from each of light emission facets 450a and 490a of the blue-violet semiconductor laser element 450 and the two-wavelength semiconductor laser element 490, respectively, in the direction A1 is reflected upward (direction C1) in the inner wall surface 12 of the recess 411 (the metallic reflective film 70) and then transmits through the sealing glass 60 so as to be emitted to the outside. Note that the Si(100) substrate 410 is an example of "semiconductor substrate" in claim phraseology (WHAT IS CLAIMED). The blue-violet semiconductor laser element 450 is an example of "semiconductor laser element" and "nitride-based semiconductor laser element" in the claim phraseology, whereas the two-wavelength semiconductor laser element 490 is an example of "semiconductor laser element" in the claim phraseology. Also, the opening 411a is an example of "first opening" in claim phraseology.

A description is give herein of each semiconductor laser element. As shown in FIG. 23, in the blue-violet semiconductor laser element 450, (i) an n-type cladding layer 452 made of a Si-doped n-type AlGaN, (ii) an active layer 453 having an MQW structure where a quantum well layer made of InGaN of high In composition and a barrier layer made of GaN are alternately stacked, and (iii) a p-type cladding layer 454 made of a Mg-doped p-type AlGaN are first formed on an underside of an n-type GaN substrate 451 in this order. Also, formed is a current blocking layer 456, made of $SiO_2$, which covers an underside of the p-type cladding layer 454, excluding a ridge 455, and the both sides of the ridge 455. Also, a p-side pad electrode 457 made of Au and the like is formed on an underside of the ridge 455 of the p-type cladding layer 454 and the current blocking layer 456. Also, an n-side electrode 458 where an Al layer, a Pt layer and an Au layer are stacked in the order of being closer to the n-type GaN substrate 451 are formed on an approximately entire top face of the n-type GaN substrate 451.

As shown in FIG. 23, the two-wavelength semiconductor laser element 490 is configured such that a red semiconductor laser element 470 and an infrared semiconductor laser element 480 are located side by side with a recess 491, having a predetermined groove width, disposed therebetween and are formed on a common n-type GaAs substrate 471. The red semiconductor laser element 470 and the infrared semiconductor laser element 480 are each an example of "semiconductor laser element" in claim phraseology.

More specifically, the red semiconductor laser element 470 is configured such that (i) an n-type cladding layer 472 made of AlGaInP, (ii) an active layer 473 having an MQW structure where a quantum well layer made of GaInP and a barrier layer made of AlGaInP are alternately stacked, and (iii) a p-type cladding layer 474 made of AlGaInP are formed on an underside of an n-type GaAs substrate 471. Also, formed is a current blocking layer 476, made of $SiO_2$, which covers a top face of the p-type cladding layer 474, excluding a ridge 475, and the both sides of the ridge 475. Also, a p-side pad electrode 477 where a Pt layer having a thickness of about 200 μm and an Au layer having a thickness of about 3 μm is formed on an underside of the ridge 475 and the current blocking layer 476. Also, an n-side electrode 478 where an AuGe layer, a Ni layer and an Au layer are stacked in the order of being closer to the n-type GaAs substrate 471 are formed on a top face of the n-type GaAs substrate 471.

The infrared semiconductor laser element 480 is configured such that (i) an n-type cladding layer 482 made of AlGaAs, (ii) an active layer 483 having an MQW structure where a quantum well layer made of AlGaAs of low Al composition and a barrier layer made of AlGaAs of high Al composition are alternately stacked, and (iii) a p-type cladding layer 484 made of AlGaAs are formed on an underside of the n-type GaAs substrate 471. Also, formed is a current blocking layer 486, made of $SiO_2$, which covers a top face of the p-type cladding layer 484, excluding a ridge 485, and the both sides of the ridge 485. Also, a p-side pad electrode 487 is formed on an underside of the ridge 485 and the current blocking layer 486.

As shown in FIG. 21, a pad electrode 431 used to die-bond the blue-violet semiconductor laser element 450 and pad electrodes 432 and 433 used to die-bond the two-wavelength semiconductor laser element 490 are formed on predetermined regions on a top surface of the submount 430 on an A1 side. As shown in FIG. 23, the pad electrode 432 is electrically connected to the p-side electrode 477 of the red semiconductor laser element 470, and the pad electrode 433 is so patterned as to be electrically connected to the p-side electrode 477 of the red semiconductor laser element 470.

In a region of the bottom face 416 where the pad electrode 31 is not formed, pad electrodes 434, 435, 436 and 437 for use with wire bonding are formed, in this order, toward a B1 side from a B2 side. Through-hole electrodes 422 to 425 that penetrate the Si(100) substrate 410 in a thickness direction are provided underneath the pad electrodes 434 to 437, respectively, and each of the respective through-hole electrodes is electrically connected to each of the respective through-hole electrodes.

Thus, one end of a wire 461 is wire-bonded to the pad electrode 431, whereas the other end of the wire 461 is wire-bonded to the pad electrode 434. Also, one end of a wire 462 is wire-bonded to the pad electrode 433, whereas the other end of the wire 462 is wire-bonded to the pad electrode 436. Also, one end of a wire 463 is wire-bonded to the pad electrode 432, whereas the other end of the wire 463 is wire-bonded to the pad electrode 437. Also, one end of a wire 464 is wire-bonded to the p-type region 35b, whereas the other end of the wire 464 is wire-bonded to the pad electrode 435. Also, one end of a wire 465 is wire-bonded to the n-side pad electrode 458, whereas the other end of the wire 465 is wire-bonded to the pad electrode 31. Also, one end of a wire 466 is wire-bonded to the n-side pad electrode 478, whereas the other end of the wire 466 is wire-bonded to the pad electrode 31.

As shown in FIG. 22, solder balls 24 are arranged such that spherical parts of the solders ball 24 are partially exposed from a protective film 26 in a state where the solder balls formed of Sn—Ag—Cu solder are formed on one ends of leader wiring portions 422a, 423a, 424a and 425a that conduct to the through-hole electrodes 422 to 425 in addition to the through-hole electrode 21. Thereby, the structure is such that the three-wavelength semiconductor laser device 400 can be mounted on a wiring substrate in an optical pickup device 600 described later.

Other structural components and other fabrication processes for the three-wavelength semiconductor laser device 400 are almost identical to those of the above-described first embodiment except that the blue-violet semiconductor laser element 450 and the two-wavelength semiconductor laser element 490, in place of the semiconductor laser element 50 (see FIG. 1), are bonded on top of the submount 430, which is placed on the bottom face 416 in the recess 411 of the Si(100) substrate 410, while the semiconductor laser elements 450 and 490 are arranged side by side laterally (direction B of FIG. 21).

Figure 24:
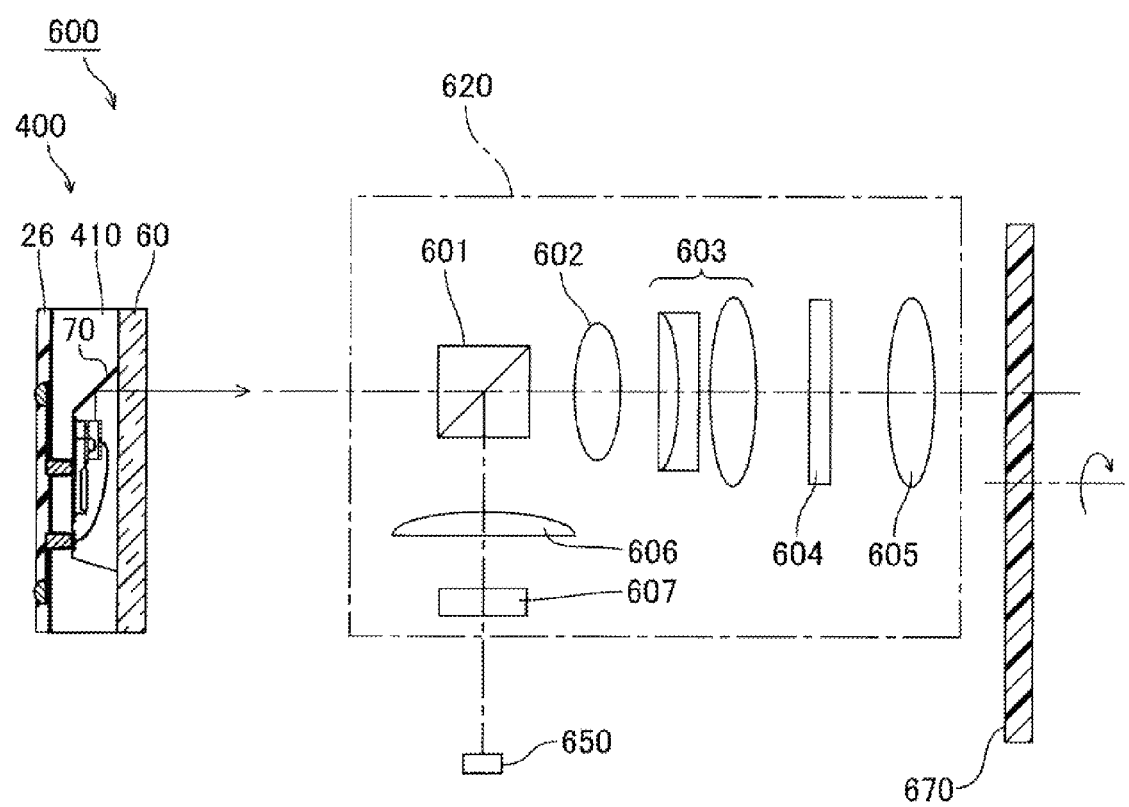
FIG. 24 is an schematic illustration showing a structure of an optical pickup device incorporating a three-wavelength semiconductor laser device according to a fourth embodiment of the present invention.

A description is now given of an optical pickup device 600 equipped with the three-wavelength semiconductor laser device 400 according to the fourth embodiment of the present invention, with reference to FIG. 24.

In other words, as shown in FIG. 24, the optical pickup device 600 includes a three-wavelength semiconductor laser device 400, an optical system 620 and a photo detector 650. The optical system 620 includes a polarization beam splitter (BS) 601, a collimator lens 602, a beam expander 603, a λ/4 plate 604, an objective lens 605, a cylindrical lens 606, and an optical axis correcting element 607.

In the optical system 620, the polarization BS 601 not only permits total transmission of the laser light emitted from the three-wavelength semiconductor laser device 400 but also permits total reflection of the returned laser light from an optical disk 670. The collimator lens 670 converts the laser light transmitted through the polarization BS 601 from the three-wavelength semiconductor laser device 400, into the parallel light. The beam expander 603 is constituted by a concave lens, a convex lens, and an actuator (not shown). The actuator varies the distance between the concave lens and the convex lens in response to a servo signal fed from a not-shown servo circuit. Thereby, the wave-front state of laser light emitted from the three-wavelength semiconductor laser device 400 is corrected.

The λ/4 plate 604 converts a linearly-polarized laser light into the circularly-polarized light wherein the linearly-polarized laser light has been converted to an approximately parallel light by the collimator lens 602. Also, the λ/4 plate 604 converts the circularly-polarized laser light returned from the optical disk into a linearly-polarized light. The polarization direction of the linearly-polarized light in this case is orthogonal to the linearly-polarized laser light emitted from the three-wavelength semiconductor laser device 400. As a result, the laser light returned from the optical disk 670 is almost totally reflected by the polarization BS 601. The objective lens 605 has the laser light, transmitted through the λ/4 plate 604, focus on a surface (recording layer). The objective lens 605 is capable of moving in a focus direction, a tracking direction and a tilt direction by a not-shown objective lens actuator in response to a servo signal (i.e., a tracking servo signal, a focus servo signal and a tilt servo signal) sent from the servo circuit.

The cylindrical lens 606, the optical axis correcting element 607 and the photo detector 650 are aligned along the optical axis of the laser light totally reflected by the polarization BS 601. The cylindrical lens 606 imparts astigmatism to the incident laser light. The optical axis correcting element 607, which is constituted by diffraction grating elements, is arranged so that the zero-order diffracted light spot for each of blue-violet laser light, red laser light and infrared laser light transmitted through the cylindrical lens 606 agrees on a detection region of the photo detector 650 described later.

Also, the photo detector 650 outputs an reproduction signal, based on the intensity distribution of the received laser light. Here, the photo detector 650 has a detection region of a predetermined pattern to obtain a focus error signal, a tracking error signal and a tilt error signal together with the reproduction signal. The actuator of the beam expander 603 and the objective lens actuator are feedback-controlled by the focus error signal, the tracking error signal and the tilt error signal. In this manner, the optical pickup device 600 equipped with the three-wavelength semiconductor device 400 is configured.

According to the fourth embodiment, as described above, the three-wavelength semiconductor laser device 400, including the blue-violet semiconductor laser element 450, comprises the Si(100) substrate 410, in which the recess 411 having the opening 411a and the bottom face 416 surrounded by the four inner wall surfaces 12 to 15 is formed, and the sealing glass 60, mounted on the top face 410a of the Si(100) substrate 410, for sealing the opening 411a, and thereby the blue-violet semiconductor laser element 450 and the two-wavelength semiconductor laser element 490 are placed on the bottom face 416 of the recess 411 surrounded by the four inner wall surfaces 12 to 15, via the submount 430, and do not protrude outside the opening 411a. Hence, the three-wavelength semiconductor laser device 400 can be operated under the conditions where the three-wavelength semiconductor laser device 400 is easily air-tightly sealed by the recess 411 in the Si(100) substrate 410 and the sealing glass 60. As a result, the three-wavelength semiconductor laser device 400 is not subject to the moisture in the air and the organic materials existent on the periphery of the laser element and therefore the optical pickup apparatus 600 can be achieved whereby the reduction in reliability of the three-wavelength semiconductor laser device 400 is suppressed.

Also, in the fourth embodiment, the three-wavelength semiconductor laser device 400 as described above is used in the optical pickup device 600, so that the optical pickup device 600 can be realized whereby the magnitude of the shift or displacement in the optical axis is reduced. Other advantageous effects achieved by the fourth embodiment are similar to those of the above-described first embodiment.

Fifth Embodiment

Figure 25:
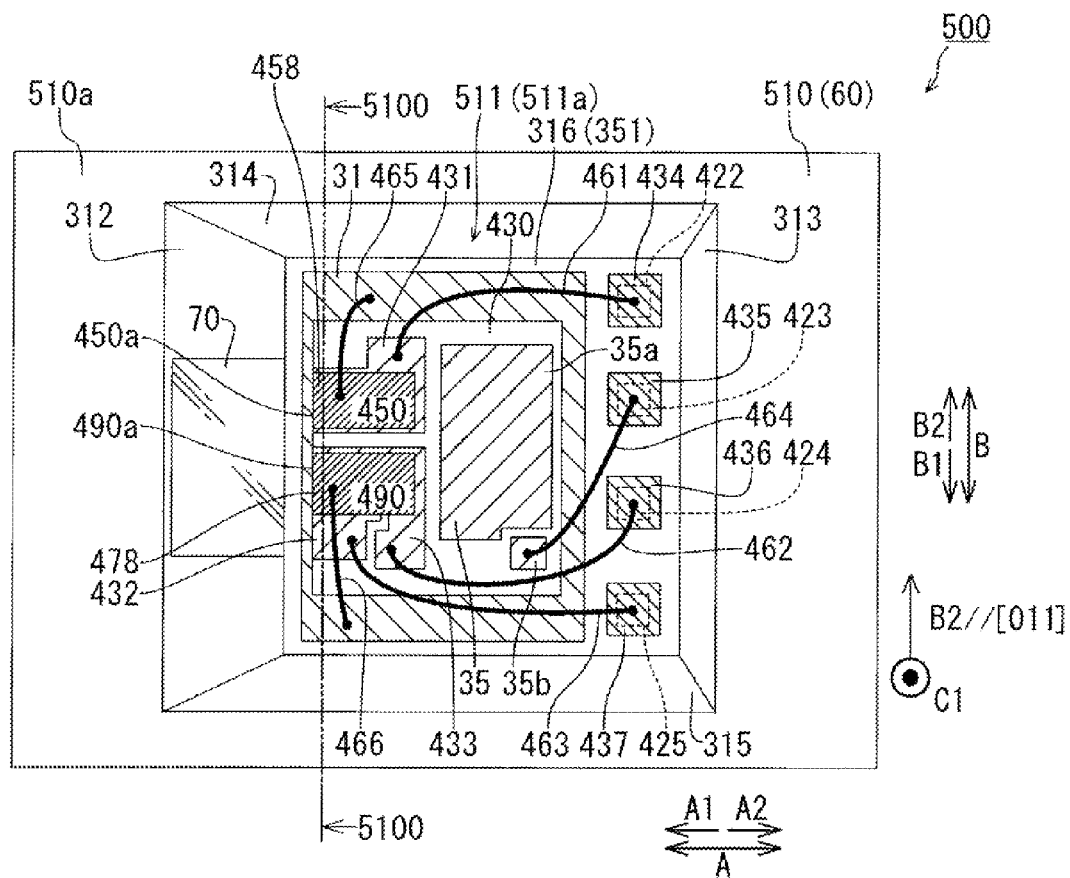
FIG. 25 is a top view showing a structure of a three-wavelength semiconductor laser device according to a fifth embodiment of the present invention.
Figure 26:
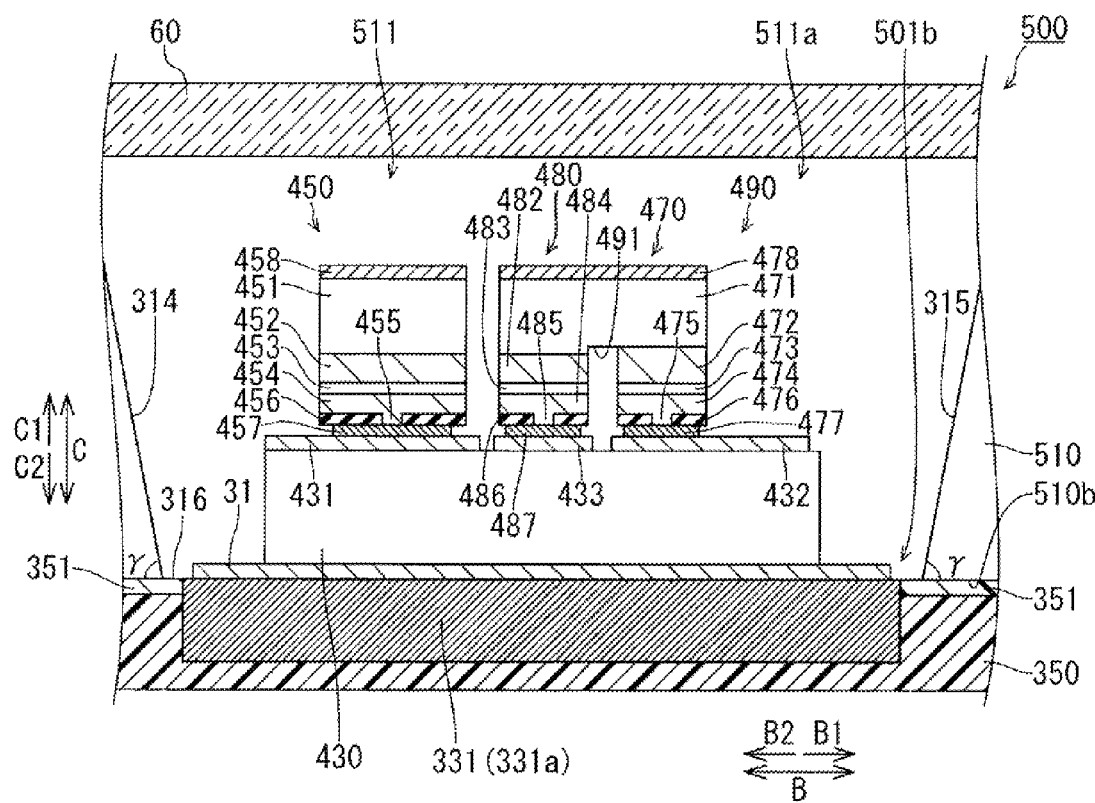
FIG. 26 is a cross-sectional view showing a structure of a three-wavelength semiconductor laser device according to a fifth embodiment of the present invention.

A description is first given of a structure of a three-wavelength semiconductor laser device 500 according to a fifth embodiment with reference to FIG. 25 and FIG. 26. In the three-wavelength semiconductor laser device 500 according to the fifth embodiment, which differs the above-described fourth embodiment, a description is given of the three-wavelength semiconductor laser device 500 configured such that it is placed within the package described in the above third embodiment. FIG. 26 is a cross-sectional view taken along line 5100-5100 of FIG. 25. Each component identical to that of the third embodiment and the fourth embodiment is given the identical reference numeral in FIG. 25 and FIG. 26.

As shown in FIG. 25 and FIG. 26, the three-wavelength semiconductor laser device 500 according to the fifth embodiment of the present invention includes (1) a Si(100) substrate 510 in which a through-hole 501 having a similar structure to that of the above third embodiment is formed, and (2) a photo solder resist 350 (see FIG. 26) for forming a recess 511 by blocking an opening 501*b* (see FIG. 26) at the lower side (C2 side) of the through-hole 501 in such a manner that the photo solder resist 350 is bonded to an underside 510*b* of the Si(100) substrate 510 via the adhesive resin 351; thereby, a package is so structured that the blue-violet semiconductor laser element 450 and the two-wavelength semiconductor laser element 490 are placed therein via the submount 430.

The three-wavelength semiconductor laser device 500 further includes a translucent sealing glass 60 (see FIG. 26) for blocking an opening 511*a* above (C1 side) of the recess 511 wherein the sealing glass 60 is mounted on a top face 510*a* of the Si(100) substrate 510. Thereby, the three-wavelength semiconductor laser device 400 is configured such that the laser light emitted from each of light emission facets 450*a* and 490*a* of the blue-violet semiconductor laser element 450 and the two-wavelength semiconductor laser element 490, respectively, in the direction A1 is reflected upward (direction C1) in the inner wall surface 312 of the recess 511 (the metallic reflective film 70) and then transmits through the sealing glass 60 so as to be emitted to the outside. Note that the Si(100) substrate 510 is an example of "semiconductor substrate" in claim phraseology (WHAT IS CLAIMED). Also, the opening 511*a* and the opening 501*b* are examples of "first opening" and "second opening" in claim phraseology, respectively.

Other structural components and other fabrication processes for the three-wavelength semiconductor laser device 500 are almost identical to those of the above-described fourth embodiment except that the submount 430, to which the blue-violet semiconductor laser element 450 and the two-wavelength semiconductor laser element 490 are bonded, is placed on the bottom face 316 of the recess 511.

Figure 27:
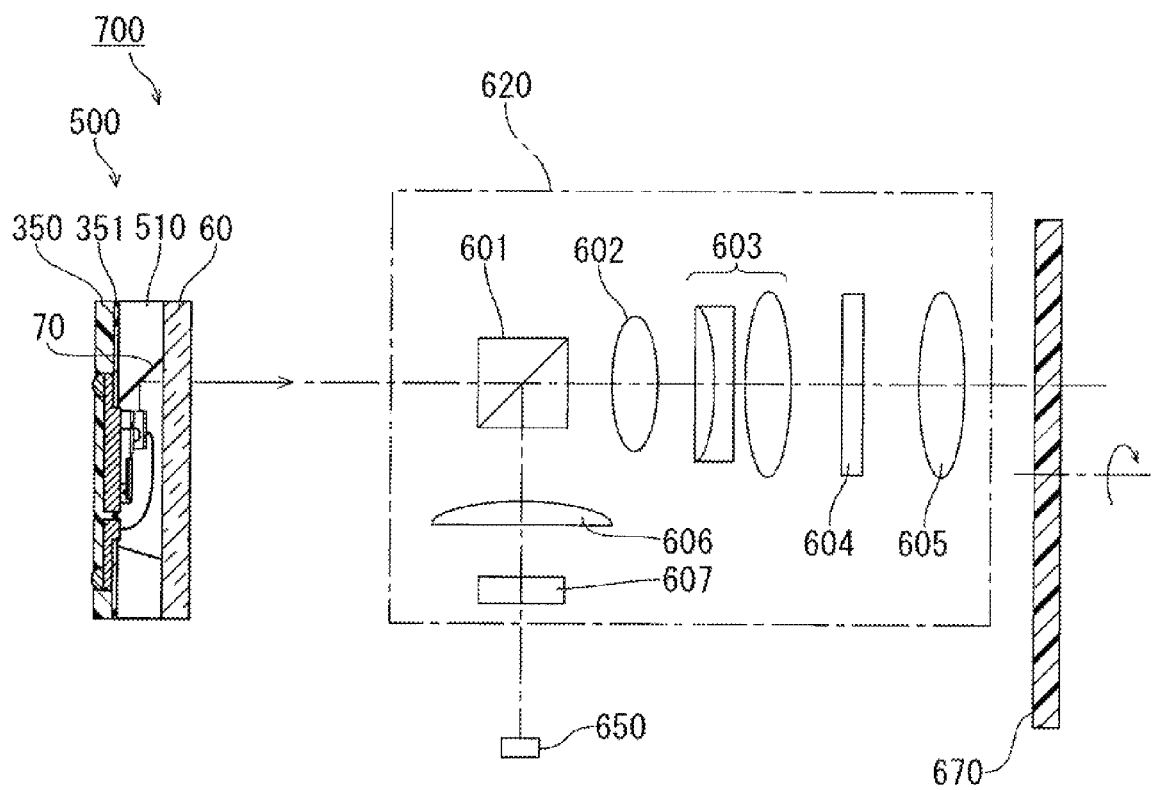
FIG. 27 is a schematic illustration showing a structure of an optical pickup device incorporating a three-wavelength semiconductor laser device according to a fifth embodiment of the present invention.

A description is now given of an optical pickup device 700 equipped with the three-wavelength semiconductor laser device 500 according to the fifth embodiment of the present invention, with reference to FIG. 27.

In other words, as shown in FIG. 27, the optical pickup device 700 includes a three-wavelength semiconductor laser device 500, an optical system 620 and a photo detector 650. The optical system 620 includes a polarization beam splitter (BS) 601, a collimator lens 602, a beam expander 603, a λ/4 plate 604, an objective lens 605, a cylindrical lens 606, and an optical axis correcting element 607. The structures and functions of the optical system 620 and the photo detector 650 that constitute the optical pickup device 700 are similar to those described in the fourth embodiment.

According to the fifth embodiment, as described above, the three-wavelength semiconductor laser device 500 comprises the Si(100) substrate 510, in which the through-hole penetrating 501 in the thickness direction is formed, the sealing glass 60, mounted on the top face 510*a* of the Si(100) substrate 510, for sealing the opening 511*a* of the through-hole 501, and the photo solder resist 350, mounted on the underside 510*b* of the Si(100) substrate 510, for sealing the opening 511*a* of the through-hole 501. Thereby, the blue-violet semiconductor laser element 450 and the two-wavelength semiconductor laser element 490 are placed on the bottom face 316 of the recess 511 surrounded by the four inner wall surfaces 312 to 315, via the submount 430, and do not protrude outside the opening 511*a*. Hence, the three-wavelength semiconductor laser device 500 can be operated under the conditions where the three-wavelength semiconductor laser device 500 is easily air-tightly sealed by the recess 511 in the Si(100) substrate 510 and the sealing glass 60. As a result, the optical pickup device 700 can be achieved whereby the reduction in reliability of the three-wavelength semiconductor laser device 500 is suppressed.

Also, in the fifth embodiment, the three-wavelength semiconductor laser device 500 as described above is used in the optical pickup device 700, so that the optical pickup device 600 can be realized whereby the magnitude of the shift or displacement in the optical axis is reduced. Other advantageous effects achieved by the fifth embodiment are similar to those of the above-described third embodiment.

The embodiments disclosed above and below should not be considered as limiting and are merely exemplary. The scope of the present invention is stated by not only the above-described embodiments by also the scope defined by WHAT IS CLAIMED, and it is to be understood that changes and variations may be made without departing from the spirit or scope of the appended claims.

For example, in the above-described first to fifth embodiments, a description has been given of an example where the means for reflecting the laser light is constituted by the inner wall surface 12 (212 and 312) disposed counter to the light emission facet of the semiconductor laser element and the metallic reflective film 70 (270) formed on the surface of the inner wall surface. However, this should not be considered as limiting. In a modification, a structure may be such that the laser light is reflected by only the inner wall surface 12 (212 and 312) disposed counter to the light emission facet of the semiconductor laser element. In other words, the light emitted from the light emission facet of the semiconductor laser element is reflected upward by the inner wall surface (212 or 312) and then transmitted through the sealing glass 60 so as to be emitted to the exterior.

In the above-described first to fifth embodiments, a description has been given of an example where the metallic reflective film 70 (270) is formed on the inner wall surface 12 (212 and 312) disposed counter to the light emission facet of the semiconductor laser element. However, this should not be considered as limiting. In a modification, the metallic reflective film may be formed on the surfaces of all four inner wall surfaces of the recess 11 (211, 311 and 411)

In the above-described first to fifth embodiments, a description has been given of an example where the metallic reflective film 70 (270) made of Ag or Al is formed on the inner wall surface 12 (212 and 312) disposed counter to the light emission facet of the semiconductor laser element. However, this should not be considered as limiting. In a modification, the "metallic film" as cited in the claim phraseology may be made of a material other than Ag or Al, as long as the material exhibits high reflectivity.

In the above-described first to fifth embodiments, a description has been given of an example where anisotropic etching is performed on the Si(100) substrate 10 having a main surface tilted about 9.7 degrees relative to an approximately (100) plane and thereby the inner wall surface 12 (212 and 312) tilted at an inclination of about 45 degrees relative to a laying surface of the laser element, such as the bottom face 16, is formed. However, this should not be considered as limiting. In a modification, the inner wall surface may be formed using a Si(100) substrate having a main surface other than the main surface tilted about 9.7 degrees relative thereto. In such a case, the placement angle for the semiconductor laser device is selected, as appropriate, in response to the tilt angle of the inner wall surface formed by the anisotropic etching. More specifically, the placement angle is so selected that the laser light emits in a manner such that the laser light after the reflection emits from the outer surface of the sealing glass 60 in a direction approximately vertical thereto. The placement angle meant here is a vertical angle related to the cavity direction.

In the above-described first to fifth embodiments, a description has been given of an example where the inner wall surface 13 (213, 312) disposed counter to a light-reflecting surface side of the semiconductor laser element is configured such that the inner wall surface 13 (213, 312) forms a tilted surface which is tilted at an inclination of about 64.4 degrees relative to the laying surface of the laser element, such as the bottom face 16 (316). However, this should not be considered as limiting. In a modification, the inner wall surface may be tilted at an inclination of other than the approximate 64.4 degrees; for example, the inner wall surface may be one approximately vertical to the bottom face 16. By employing the structure according to this modification, a region in a rear part of the semiconductor laser element in the recess (light-reflecting surface side) can be further efficiently made use of.

In the above-described first to fifth embodiments, a description has been given of the semiconductor laser device where the semiconductor laser element is placed in the recess having the four inner wall surfaces and it is hermetically sealed by the sealing glass 60. However, this should not be considered as limiting. In a modification, an arrangement may be such that a recess having inner wall surfaces number of which is other than four, such as three or six inner wall surfaces, is formed in the Si substrate and the semiconductor laser element is placed in such a recess.

In the above-described first embodiment, a description has been given of an example where the semiconductor laser element 50 is bonded on top of the submount 30 using the junction-up method. However, this should not be considered as limiting. In a modification, the semiconductor laser element 50 may be bonded on top of the submount 30 using a junction-down method, instead. In other words, since the semiconductor laser device 50 is placed on the bottom face 16 via the submount 30 even when the junction-down method is used, the light emission position of the laser light can be kept at an appropriate position on the bottom face 16 in a height direction.

In the above-described fourth and fifth embodiments, a description has been given of an example where the three-wavelength semiconductor laser device 400 is constructed such that the blue-violet semiconductor laser element 450 and the two-wavelength semiconductor laser element 490 are placed side by side laterally (direction B) on top of the single submount 430. However, this should not be considered as limiting. In a modification, an arrangement may be such that a two-wavelength laser element bonded to the two-wavelength element is placed above the blue-violet semiconductor laser element and on the submount 430.

In the above-described fourth and fifth embodiments, a description has been given of an example where the three-wavelength semiconductor laser device 400 (500) is constructed of the blue-violet semiconductor laser element 450, the red semiconductor laser element 470 and the infrared semiconductor laser element 480. However, this should not be considered as limiting. In a modification, an RGB three-wavelength semiconductor laser device may be constituted by a red semiconductor laser element, a green semiconductor laser element and a blue semiconductor laser element. The RGB three-wavelength semiconductor laser device according to this modification may be used as a light source for a projector apparatus and the like.

In the above-described first to fifth embodiments, a description has been given of an example where the Au—Sn solder is used as the electrically conductive adhesion layer used to bond the semiconductor laser element or the submount. However, this should not be considered as limiting and, for example, an electrically conductive adhesion layer formed of Pb-free solder, high-Pb solder, In or the like may be used.

Sixth Embodiment

A sixth embodiment relates to a semiconductor device in which a semiconductor element is sealed hermetically.

The background technology of the sixth embodiment is now described.

In recent years, with miniaturization and higher performance in electronic devices, demand has been ever greater for further miniaturization of semiconductor devices used in the electronic devices. Where the semiconductor element in the semiconductor device needs to be protected against external heat and moisture, it can be protected against them if the semiconductor element is configured air-tightly.

According to Reference (3) listed in the following Related Art List, a package structure is disclosed where a hermetically sealed semiconductor element and solder balls functioning as external connection terminals are connected by way of a via wiring formed on a substrate (see FIG. 3 of Reference (3)).

RELATED ART LIST (3) Japanese Unexamined Patent Application Publication No. 2004-255487.

Problems to be resolved by the sixth embodiment is now described. In the conventional structure where the via wiring or through-holes for electrodes are provided in the substrate, a process of forming the through-holes in the substrate to connect the hermetically sealed semiconductor element to the external connection terminals is required for each semiconductor device. This causes the manufacturing time of the semiconductor devices, in which the semiconductor elements are sealed hermetically, to increase and eventually results in a cost hike thereof, which in turn poses the hindrance to the miniaturization of the semiconductor devices.

The sixth embodiment has been made to resolve the foregoing problems, and a purpose thereof is to provide a technology capable of reduced the size and the manufacturing cost of the semiconductor device in which the semiconductor element is sealed hermetically.

Means for resolving the problems in the second embodiment are now described. One mode of carrying out the sixth embodiment relates to a semiconductor device. The semiconductor device comprises: an insulating resin layer; a wiring layer disposed on one main surface of the insulating resin layer; a bump protruding on a side of the insulating resin layer, the bump being formed integrally with the wiring layer; a semiconductor element in which an element electrode electrically connected to the bump is formed; a support member having an opening formed such that at least the semiconductor element is exposed, the support member disposed on the other main surface of the insulating resin layer; and a sealing member provided on the support member in such a manner as to block the opening.

By employing this mode of carrying out the sixth embodiment, the hermetically sealed semiconductor element and the external connection terminals can be electrically connected through the medium of the bumps integrally formed with the wiring layer, without forming the through-holes for electrodes in the wiring substrate (element mounting board). As a result, the size of the semiconductor device in which the semiconductor element is sealed hermetically can be reduced and at the same time the manufacturing cost thereof can be reduced.

In this mode of carrying out the sixth embodiment, the semiconductor element may be provided on top of the bump. At least a part of top surface of the bump may overlap with an underside of the support member near the opening. The support member may have an inner wall surface which is tilted relative to the main surface of the insulating resin layer. The semiconductor device may be a laser element, and the sealing member may have translucency. Further, a laser light emitted from the laser element may be reflected by inner wall surface of the support member or a film provided on the inner wall surface and may transmit through the sealing member.

Example 1

Figure 28:
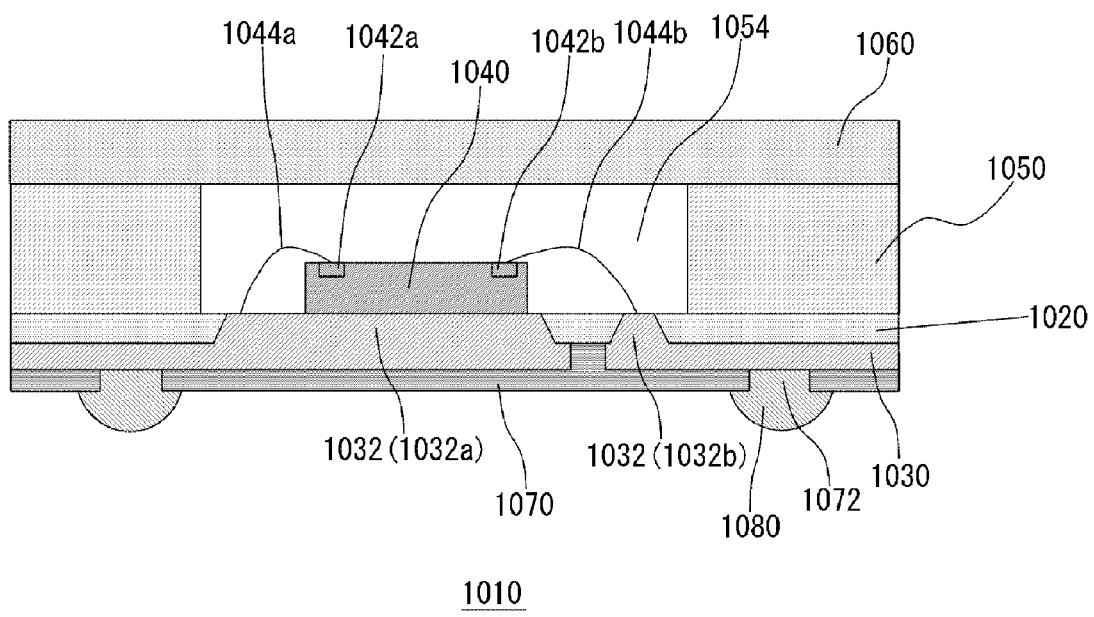
FIG. 28 is a cross-sectional view showing schematically a structure of a semiconductor device according to a first example of a sixth embodiment.
Figure 29:
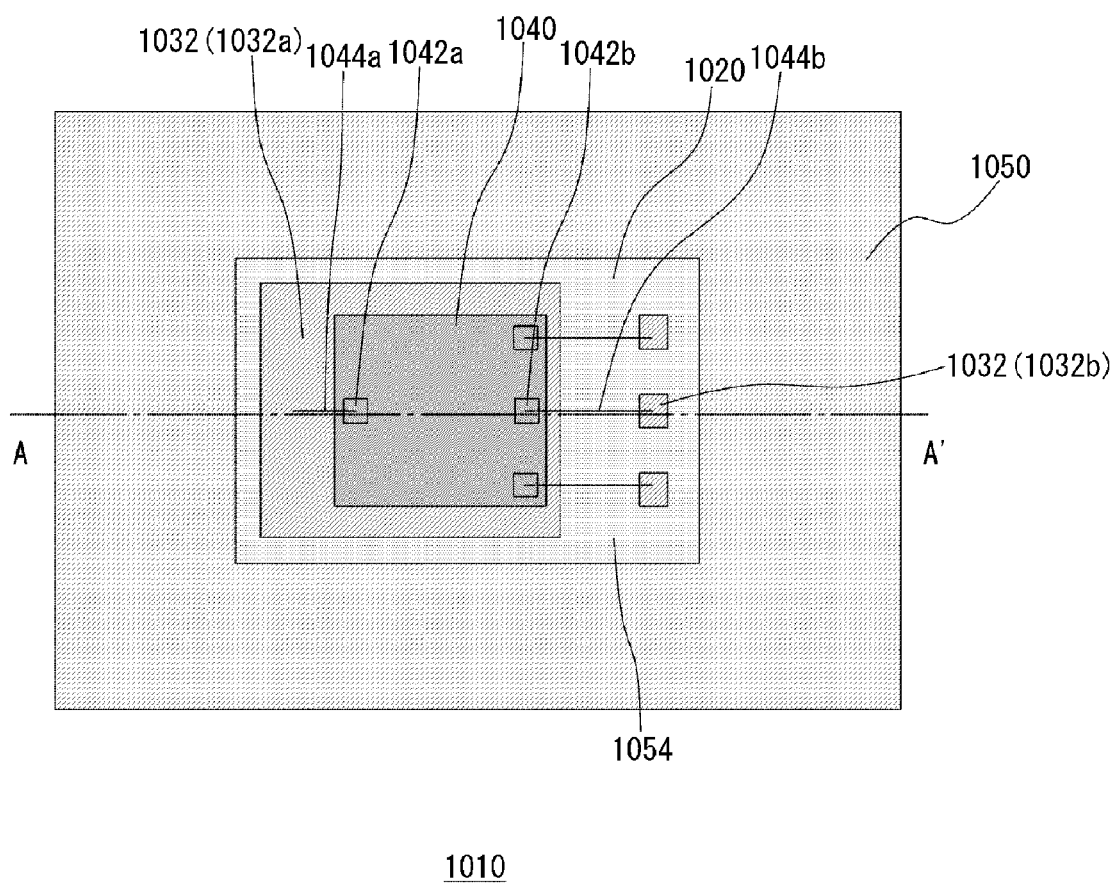
FIG. 29 is a plain view showing schematically a structure of a semiconductor device according to a first example of a sixth embodiment.

FIG. 28 is a cross-sectional view showing schematically a structure of a semiconductor device 1010 according to a first example of the sixth embodiment. FIG. 29 is a plain view showing schematically a structure of the semiconductor device 1010 according to the first example thereof. FIG. 28 is a cross-sectional view taken along line A-A' of FIG. 29. Note that a sealing member 1060 described later is omitted in FIG. 29. The semiconductor device 1010 is configured such that the semiconductor element 1040 is sealed air-tightly. A description is hereunder given of a structure of the semiconductor device 1010

An insulating resin layer 1020 is made of insulating resin. The material used for the insulating resin layer 1020 is, for instance, a melamine derivative, such as BT resin, or a thermosetting resin, such as liquid-crystal polymer, epoxy resin, PPE resin, polyimide resin, fluorine resin, phenol resin or polyamide bismaleimide.

A wiring layer 1030 is provided on one main surface of the insulating resin layer 1020 on a side thereof opposite to the semiconductor element 1040, as a conductive layer, and is formed of a conducive material, preferably a rolled metal or more preferably a rolled copper. Such rolled copper performs excellently as a material for rewiring because it has greater mechanical strength than a copper-made metallic film formed by plating or the like.

A protrusion 1032 penetrating the insulating resin layer 1020 is protrudingly provided in a predetermined position of the wiring layer 1030. In this example, the wiring layer 1030 and the protrusion 1032 are formed integrally with each other and thereby the connection between the wiring layer 1030 and the protrusion 1032 is assured. The overall shape of the protrusion 1032 is narrower toward the tip portion thereof. In other words, the side surface of the protrusion 1032 is tapered. The height of the protrusion 1032 is about 20 μm to about 25 μm, for instance.

There are two kinds of protrusions 1032. That is, there are (1) a protrusion 1032a that functions as not only an electrical connection member but also a mounting part having an area capable of mounting the semiconductor element 1040 described later, and (2) a protrusion 1032b that mainly functions as the electrical connection member. Where the semiconductor element 1040 is mounted on the protrusion 1032a, the protrusion 1032 is formed of a highly heat-radiant metal, so that the heat radiation of the semiconductor device 1010 can be improved.

A protective layer 1070 is provided on a main surface of the wiring layer 1030 opposite to the insulating resin layer 1030. This protective layer 1070 protects the wiring layer 1030 against oxidation or the like. The protective layer 1070 may be a photo solder resist layer, for instance. An opening 1072 is formed in a predetermined region of the protective layer 1070, and the wiring layer 1030 is partially exposed there. A solder ball 1080, which functions as an external connection electrode, is formed within the opening 1070. And the solder ball 1080 and the wiring layer 1030 are electrically connected to each other. The position in which the solder ball 1080 is formed, namely, the area in which the opening 1072 is formed is, for instance, an end where circuit wiring is extended through a rewiring (wiring layer 1030).

An element mounting board is formed by the above-described insulating resin layer 1020, the wiring layer 1030 and the protrusion 1032.

The semiconductor element 1040 is bonded to the protrusion 1032a using an adhesive applied thereto. Examples of the semiconductor element 1040 used in the semiconductor device 1010 according to the present example may be an MEMS (miro electro mechanical systems) device, a laser element, an device requiring vacuum sealing or hermetical sealing such as an optical element other than the laser elements, a device such as an organic device in which the resin sealing cannot be used, and so forth. Note here that, in the embodiments and examples of the present invention, MEMS may be used for those other than the semiconductor elements.

An element electrode 1042a and an element electrode 1042b corresponding respectively to the protrusion 1032a and the protrusion 1032b are provided on an electrode forming face of the semiconductor element 1040. The element electrode 1042a and the protrusion 1032a are connected to each other by a wire bonding using a gold wire 1044a. The element electrode 1042b and the protrusion 1032b are connected to each other by a wire bonding using a gold wire 1044b.

A support member 1050 is provided on one main surface of the insulating resin layer 1020 on a semiconductor element 1040 side. As shown in FIG. 29, an opening 1054, through which the semiconductor element 1040 is exposed, is provided in a central region of the support member 1050. Though, in this example, the outer shape of the support member 1050 and the outer shape of the opening 1054 are both rectangular in a plain view, the outer shapes thereof should not be considered as limiting. The material used for the support member 1050 is not limited to any particular one as long as it has airtightness or shape retainability; for example, it may be a resin material such as epoxy resin or an inorganic material such as a Si substrate. Though an inner wall of the support member 1050 facing the opening 1054 is positioned vertically to the main surface of the insulating resin layer 1020 on a semiconductor element 1040 side, it may be tapered and inclined relative to the main surface of the insulating resin layer 1020 on a semiconductor element 1040 side. If the inner wall of the support member 1050 facing the opening 1054 is tapered, a larger space will be assured between the semiconductor element 1040 and the side surface of the support member 1050. As a result, the inner wall of the support member 1050 does not pose the hindrance to the mounting of the semiconductor element 1040 and therefore the semiconductor element 1040 can be packaged with ease.

The sealing member 1060 is so provided on the support member 1050 as to block and close up the opening 1054 in the support member 1050. For example, the planar shape of the sealing member 1060 is approximately the same as the shape of the support member 1050, and the sealing member 1060 and the support member 1050 are bonded together on a contact surface of the sealing member 1060 and the support member 1050 by an adhesive. The material used for the sealing member 1060 is not limited to any particular one as long as it has airtightness or shape retainability; for example, it may be a resin material such as epoxy resin, an inorganic material such as a glass substrate and a Si substrate, or metallic material such as a copper sheet. The opening 1050 in the support member 1050 is hermetically sealed with the sealing member 1060. If no electromagnetic waves including visible light, infrared light and ultraviolet light needs to be propagated between the semiconductor element 1040 and the exterior of the semiconductor device 1010, the sealing member 1060 may not have permeability for the electromagnetic waves.

As described above, the semiconductor device 1010 according to the present example achieves a structure in which the semiconductor element 1040 is mounted such that the semiconductor element 1040 is air-tightly sealed in the opening in the support member 1050. In the present example, the hermetically sealed semiconductor element 1040 and the solder balls 1080 functioning as external connection terminals are electrically connected to each other through the medium of the protrusion 1032 formed integrally with the wiring layer 1030. Hence, a high-cost process otherwise required for the forming of the through-hole in the wiring substrate in the conventional practice is eliminated, so that the manufacturing cost of the semiconductor device 1010 can be reduced while the size of thereof is reduced.

(Method for Fabricating a Semiconductor Device)

Referring to FIG. 30 to FIG. 34, a description will now be given of a method for fabricating a semiconductor device according to the first example of the sixth embodiment.

Figure 30A:
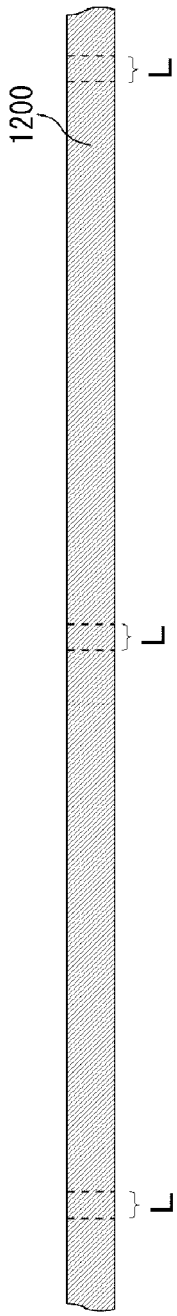
FIGS. 30A to 30D are cross-sectional views showing a sequence of processes in a method for fabricating a semiconductor device according to a first example of a sixth embodiment.

As shown in FIG. 30A, a copper sheet 1200 is first prepared as a metallic sheet having a thickness greater than at least the sum of the height of the protrusion 1032 and the thickness of the wiring layer 1030. The thickness of the copper sheet 1200 is about 100 μm, for instance. A rolled metal used for the copper sheet 1200 is a rolled copper.

Figure 30B:
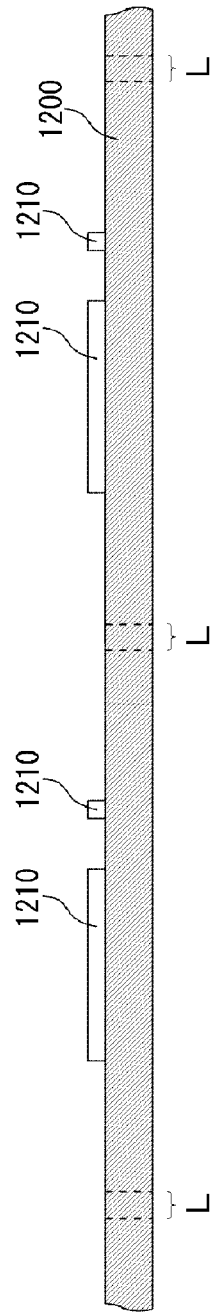

Then, as shown in FIG. 30B, resists 1210 are formed selectively in alignment with a pattern that corresponds to a predetermined formation region of the protrusions 28 as shown in FIG. 28 in each demarcated region surrounded by scribe lines L, using a lithography method. More specifically, a resist film of predetermined film thickness is affixed to the copper sheet 1200 by a laminating apparatus, and it is then subjected to exposure using a photo mask having the pattern of protrusions 1032. After this, the resists 1210 are selectively formed on the copper sheet 1200 by a development. To improve the adhesion of the resists 1210 to the copper sheet 1200, it is desirable that a pretreatment, such as grinding and cleaning, be performed as necessary on the surface of the copper sheet 1200 before the lamination of the resist film thereon. To protect the copper sheet 1200, it is desirable that a resist protective film (not shown) is formed on the entire surface (underside in FIG. 30B) opposite to the surface on which the resists 1210 have been provided.

Figure 30C:
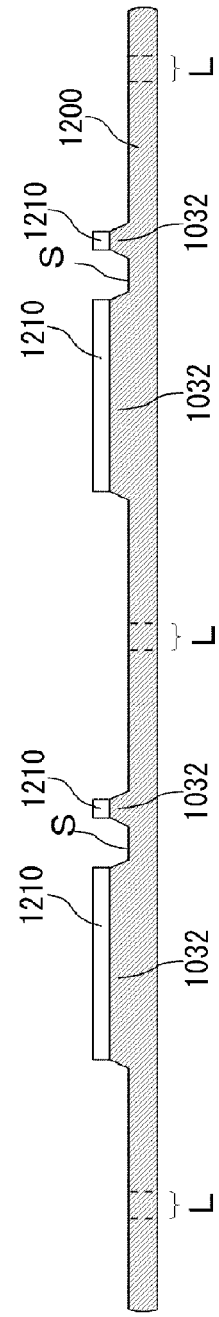

Then, as shown in FIG. 30C, using the resists 1210 as a mask, the protrusions 1032 of a predetermined pattern protruding from a surface of the copper sheet 1200 is formed by performing the wet etching on the copper sheet 1200, in which a chemical such as ferric chloride solution or the like is used. In this case, the protrusion 1032 is formed such that the protrusion 1032 has a tapered side surface whose diameter (dimension) decreases as the side surface of the bump electrode 110 approaches the tip end thereof.

Figure 30D:
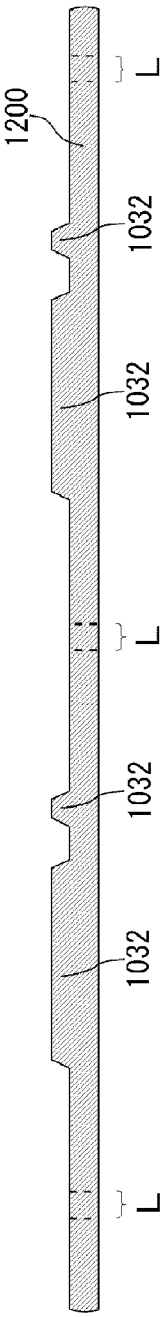

Then, as shown in FIG. 30D, the resists 1210 and the resist protective film are removed using a stripping agent. The bump protrusions 1032 are integrally formed on the copper sheet 1032 through a process as described above.

Then, as shown FIG. 31A, the insulating resin layer 1020 is stacked in the surface of the copper sheet 1200 on a side where the protrusions 1032 are provided, using a roll laminator or hot press machine. For example, a thermosetting, epoxy-based adhesive resin film may be used as the insulating resin layer 1020. The insulating resin layer 1020 to be laminated may have a thickness enough to cover the top surface of the protrusion 1032. Since the support member 1050 is bonded in a process described later, the temperature of the epoxy-based adhesive resin film at the time it is stacked on the copper sheet 1200 is preferably a temperature of 100° C. or below which does not cause the epoxy-based adhesive resin film to become completely hardened.

Then, as shown in FIG. 31B, the insulating resin layer 1020 is turned into thin film by the use of $O_2$ plasma etching so that the top surface of the protrusion 1032 is exposed and the top surface of the protrusion 1032 is coplanar with the top face of the insulating resin layer 1020.

Then, as shown in FIG. 32A, the support member 1050 having the opening 1054 is mounted on the insulating resin layer 1020, and the support member 1050 and the insulating resin layer 1020 are glued together by heating and press-bonding them for five minutes under the conditions of a temperature of about 200° C. and a pressure of about 1 MPa, for instance. If the insulating resin layer 1020 is hardened, the support member 1050 and the insulating resin layer 1020 may be bonded using an adhesive.

Then, as shown in FIG. 32B, the semiconductor element 1040 is bonded to the protrusion 1032a and then the element electrode 1042a, provided on the semiconductor element 1040, and the protrusion 1032a are connected to each other by the wire bonding using the gold wire 1044a. The element electrode 1042b, provided on the semiconductor element 1040, and the protrusion 1032b are connected to each other by the wire bonding using the gold wire 1044b.

Then, as shown in FIG. 32C, the sealing member 1060 is placed on top of the support member 1050 in such a manner as to block and close up the opening in the support member 1050, thereby bonding the support member 1050 and the sealing member 1060 together.

Figure 33A:
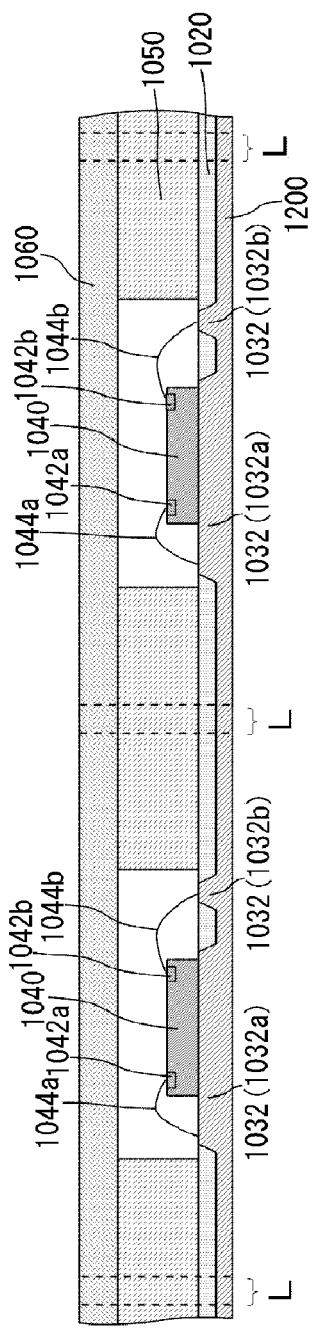
FIGS. 33A to 33C are cross-sectional views showing a sequence of processes in a method for fabricating a semiconductor device according to a first example of a sixth embodiment.

Then, as shown in FIG. 33A, the surface of the copper sheet 1200 on a side opposite to the side where the protrusions 1032 are provided is etched back using a chemical such as ferric chloride solution or the like, and the copper sheet 1200 is turned into thin film thereby. As a result, formed is a copper sheet 1200 which is so processed as to have a predetermined thickness (thickness of the wiring 1030) and with which predetermined protrusions are provided integrally. The thickness of the copper sheet 1200 according to the present example is about 20 μm.

Figure 33B:
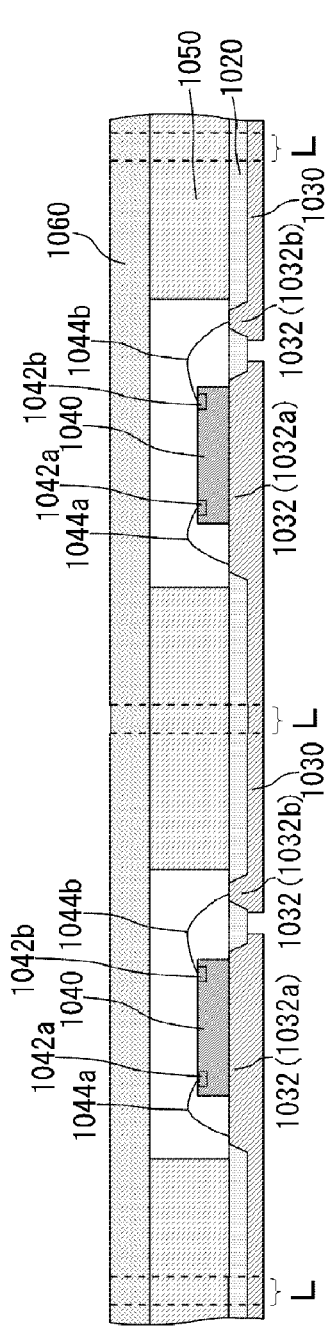

Then, as shown in FIG. 33B, a wiring layer (rewiring) 1030 is formed by processing the copper sheet 1200 into a predetermined pattern using a lithography and etching technique. As a result, formed is a wiring layer 1030 which is so processed as to have a predetermined thickness and with which predetermined protrusions 1032 are provided integrally.

Figure 33C:
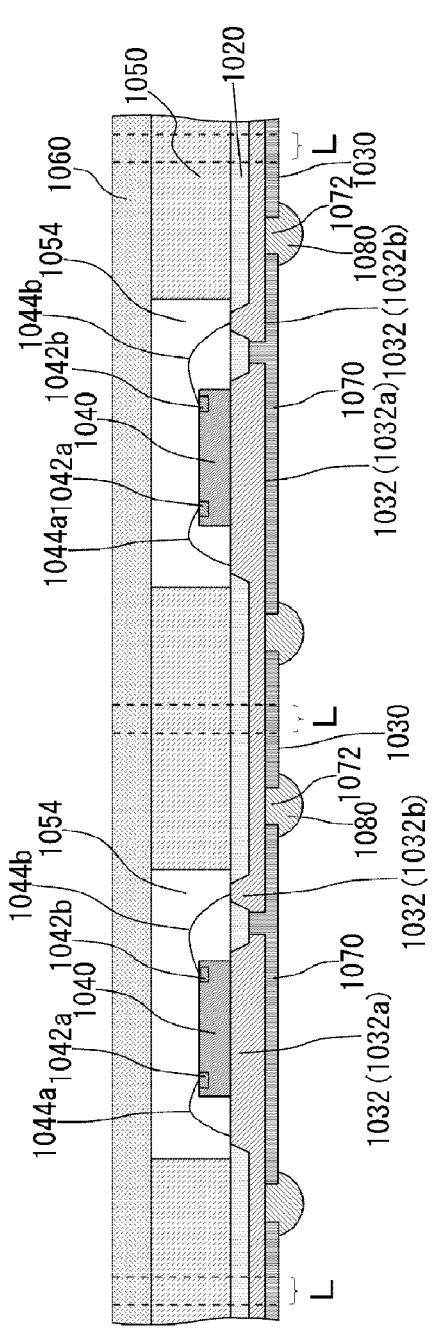

As shown in FIG. 33C, a protective layer (photo solder resist layer) 1070 is laminated on an underside of the wiring layer 1030 and the exposed insulating resin layer 1020, and then openings 1072 are provided in predetermined regions (solder ball mounting regions) of the protective layer 1070, using a photolithography method. The protective layer 1070 functions as a protective film for the wiring pattern 1030. An epoxy resin or the like may be used for the protective layer 1070, and the thickness of thereof is about 30 μm, for instance. Further, the solder balls 1080 are mounted in these openings 1072 in the protective layer 1070 by using a screen printing method. More specifically, the solder balls 1080 are formed by printing soldering paste, which is a pasty mixture of resin and solder material, in desired positions through a screen mask and then heating the printed paste to a solder melting point.

Figure 34:
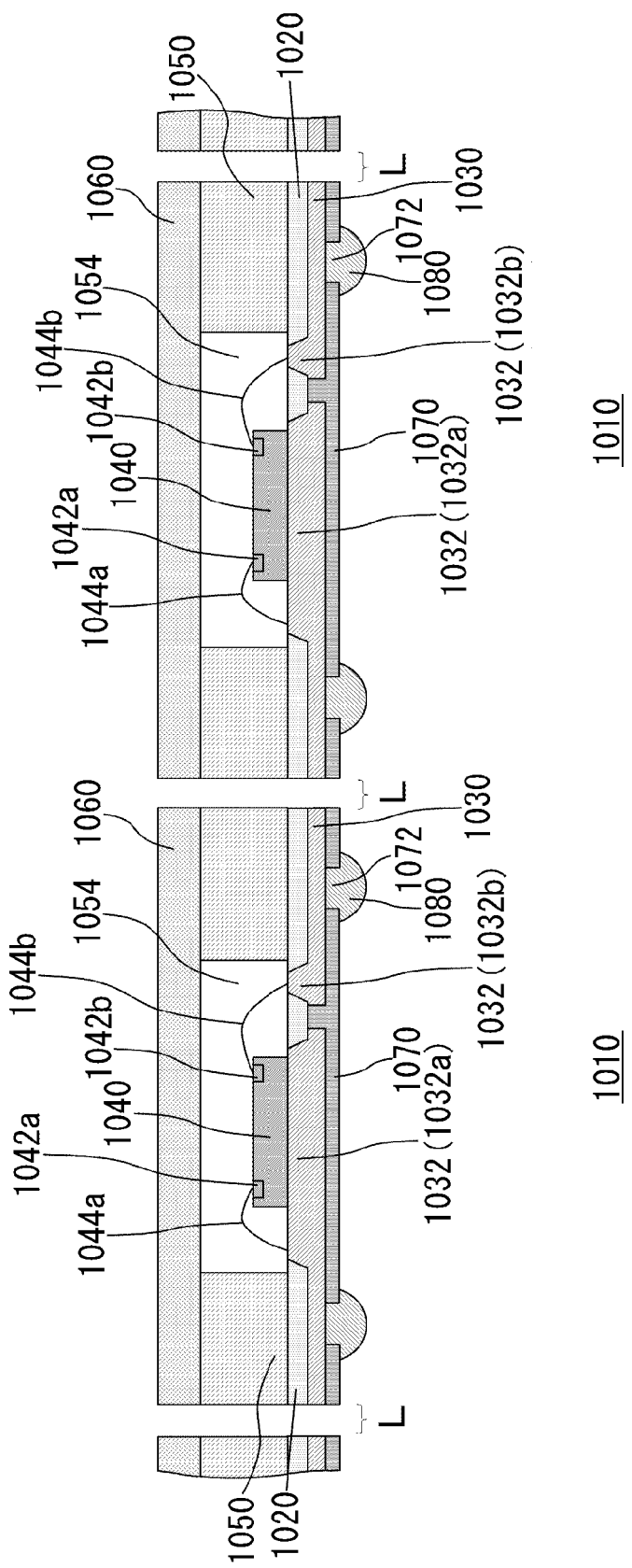
FIG. 34 is a cross-sectional view showing a sequence of processes in a method for fabricating a semiconductor device according to a first example of a sixth embodiment.

Then, as shown in FIG. 34, the semiconductor device 1010 is diced into individual modules along the scribe lines L.

The semiconductor device 1010 according to the first embodiment can be manufactured through the processes as described above. By employing the above-described fabrication method for fabricating the semiconductor device 1010, the semiconductor 1010 in which the semiconductor elements 1040 are sealed hermetically can be manufactured at low cost, without carrying out the process of forming the through-holes in the element mounting substrate on which the semiconductor element 1040 is mounted.

Also, the formation of the protrusions 1032 and the wiring layer 1030 for each semiconductor device 1010 and the process of sealing the semiconductor element 1040 with the sealing member 1060 are performed all together before the semiconductor device 1010 is divided into individual semiconductor modules. Therefore, the manufacturing time and the production cost can both be reduced.

In the above-described fabrication method, the semiconductor element 1040 is mounted on the protrusion 1032a before it is hermetically sealed with the sealing member 1060. However, a process flow may be such that the support member 1050 and the sealing member 1060 are bonded to each other in advance and then the copper sheet 1200 on which the semiconductor element 1040 is mounted is glued to the protrusion 1032a. Also, the support member 1050 may be glued to the copper sheet 1200 after the semiconductor element 1040 has been mounted on the protrusion 1032. Also, the thinning process by etching back the copper sheet 1200 (see FIG. 33A) may be performed after a process of removing the resists 1210 to form the protrusions 1032 or after a process of turning the insulating resin layer 1020 into thin film (FIG. 31B).

Example 2

Figure 35:
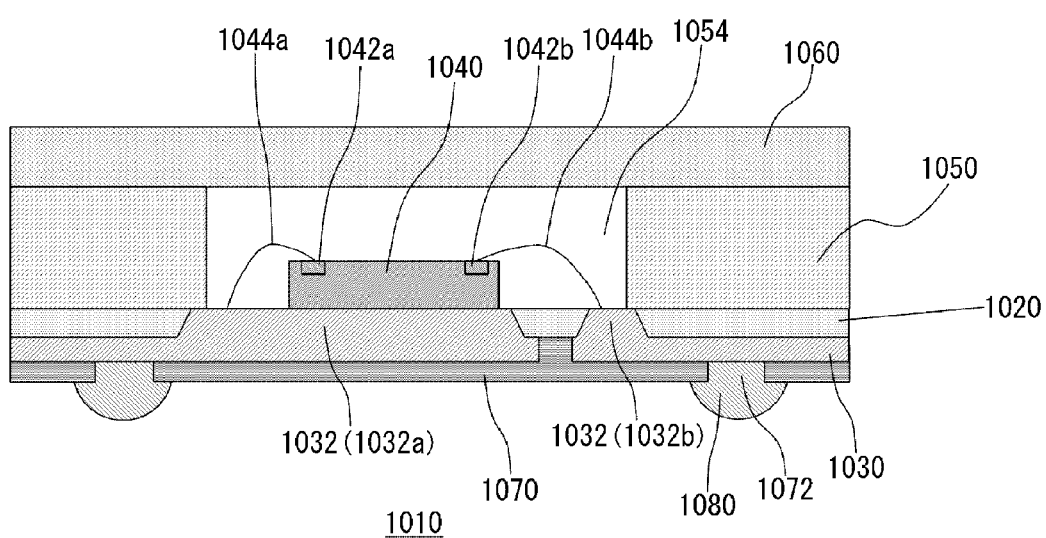
FIG. 35 is a cross-sectional view showing a sequence of processes in a method for fabricating a semiconductor device according to a second example of a sixth embodiment.
Figure 36:
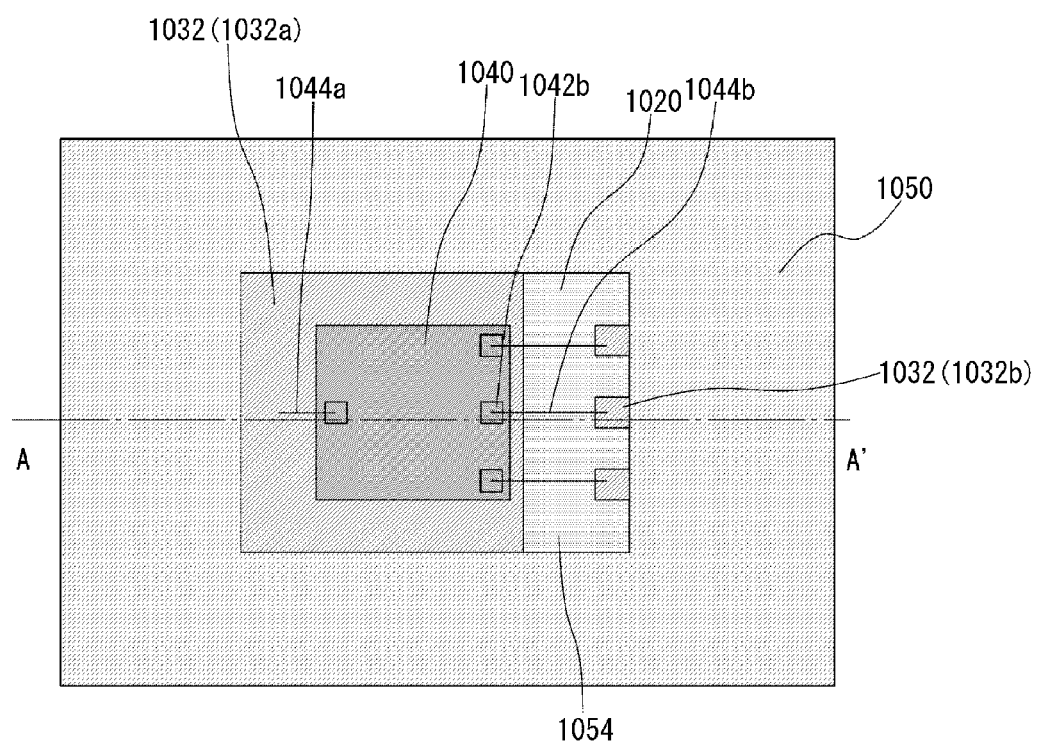
FIG. 36 is a plain view showing schematically a structure of a semiconductor device according to a second example of a sixth embodiment.

FIG. 35 is a cross-sectional view showing schematically a structure of a semiconductor device 1010 according to a second example of the sixth embodiment. FIG. 36 is a plain view showing schematically a structure of the semiconductor device 1010 according to the second example thereof. FIG. 35 is a cross-sectional view taken along line A-A' of FIG. 36. Note that a sealing member 1060 described later is omitted in FIG. 36. The basic structure of the semiconductor device 1010 of this second example is the same as that of the first example. The description of the same components as those of the first example will be omitted as appropriate.

In the semiconductor device 1010 according to the first example, the insulating resin layer 1020 is exposed in a space between the top surface of the protrusion 1032 and the side wall of the support member 1050. In contrast thereto, in the semiconductor device 1010 according to the second example, at least a part of the top surface of the protrusion 1032 extends across underneath the support member 1050. In other words, a part of top surface of the protrusion 1032 overlaps with a part of underside of the support member 1050 near the side wall. This structure prevents a part of the insulating resin layer 1020 from oozing out onto the top surface of the protrusion 1032 when the support member 1020 is mounted on the insulating resin layer 1020. Since this structure suppresses the top surface of the protrusion 1032 from being covered by the insulating resin layer 1020, the connection reliability between the protrusion 1032 and the gold wire 1044 with the gold wire being wire-bonded to the protrusion 1032 can be improved.

Example 3

Figure 37:
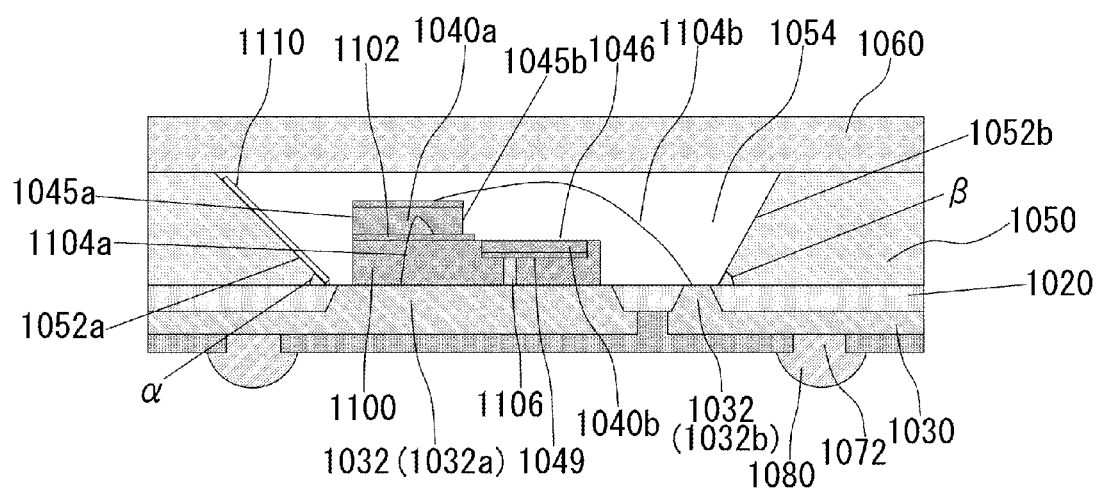
FIG. 37 is a cross-sectional view showing schematically a structure of a semiconductor device according to a third example of a sixth embodiment.
Figure 38:
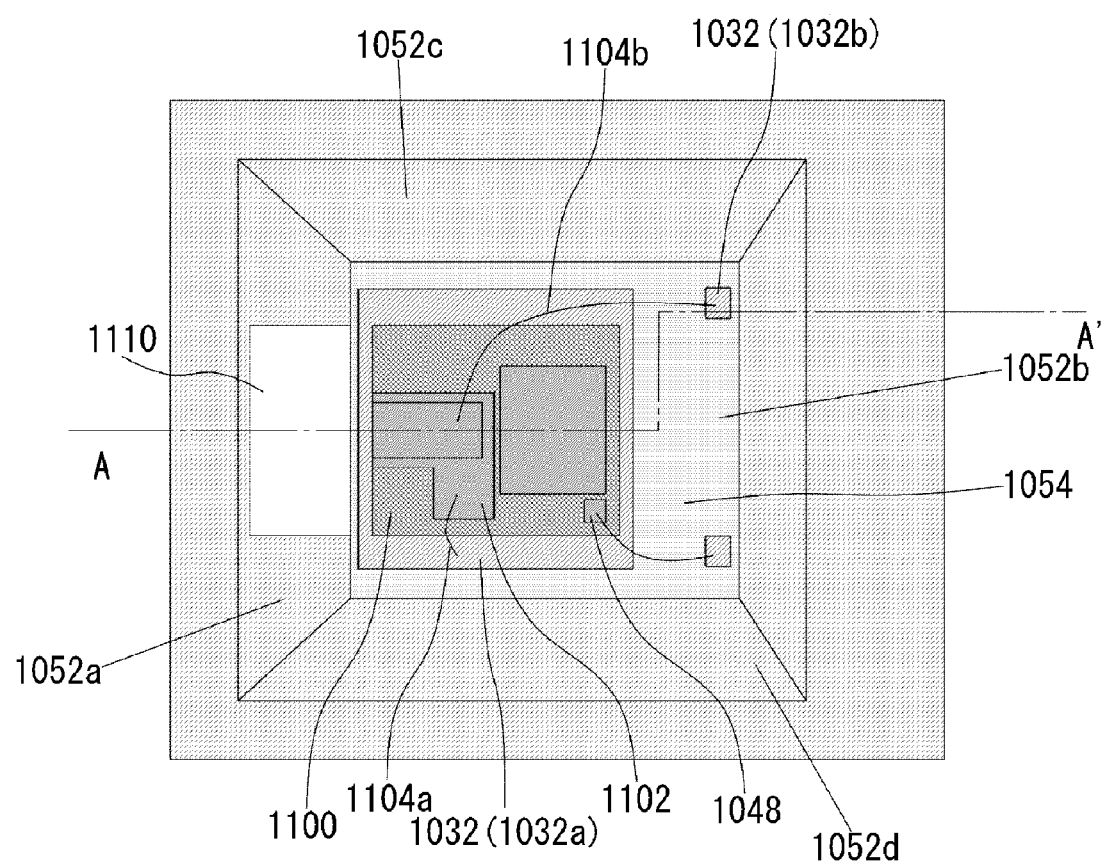
FIG. 38 is a plain view showing schematically a structure of a semiconductor device according to a third example of a sixth embodiment.

FIG. 37 is a cross-sectional view showing schematically a structure of a semiconductor device 1010 according to a third example of the sixth embodiment. FIG. 38 is a plain view showing schematically a structure of the semiconductor device 1010 according to the third example thereof. FIG. 37 is a cross-sectional view taken along line A-A' of FIG. 38. Note that a sealing member 1060 described later is omitted in FIG. 38. The basic structure of the semiconductor device 1010 of this third example is the same as that of the first example. The description of the same components as those of the first example will be omitted as appropriate.

The semiconductor device 1010 according to the third example is a semiconductor laser device equipped with a semiconductor laser element. The semiconductor device 1010 is usable as a light source for an optical disk system and an optical communication system. In particular, when a semiconductor laser element emitting a laser light in the visible light band of about 380 nm to about 780 nm is used, it can be used as the light source for the recording and playback/reproduction of various types of optical disks for use in CD, DVD, BD and so forth.

In the third example, a submount 1100 is bonded to the protrusion 1032a through the medium of an electrically conductive adhesion layer (not shown) made of Au—Sn solder. The top surface of the protrusion 1032a has a plane area larger than that of the submount 1100, and the submount 1100 is placed within a region of the top surface of the protrusion 1032a. The thickness of the submount 1100 is about 200 μm, for instance. The material for the submount 1100 is Si, AlN (aluminum nitride) or the like.

A pad electrode 1102 is formed on a predetermined region of a top surface of the submount 1100. The pad electrode 1102 and the top surface of the protrusion 1032a are connected to each other by a wire bonding using a gold wire 1104a.

The semiconductor element 1040a is mounted on top of the pad electrode 1102 in a state where the top surface of the semiconductor element 1040a is positioned below the top face of the support member 1050. The semiconductor element 1040*a* is a nitride-based semiconductor laser element having a known element structure. An n-side electrode (not shown) of the semiconductor element 1040*a* and the pad electrode 1102 formed on the top surface of the submount 1100 are bonded together via an electrically conductive adhesion layer (not shown). Thereby, the n-side electrode of the semiconductor element 1140 is electrically connected to the protrusion 1032*a*. Also, a p-side electrode of the semiconductor element 1040*a* and the top surface of the protrusion 1032*b* are connected to each other by a wire bonding using a gold wire 1104*b*.

The semiconductor element 1040*a* has a light emission facet 1045*a* and a light-reflecting surface 1045*b* which are disposed counter to each other. The light emission facet 1045*a* is provided on a metallic reflective film 1110 (described later) side. The light emission facet 1045*a* and the light-reflecting surface 1045*b* are distinguished by the magnitudes of light intensities of the laser light emitted from the respective facets to a pair of resonator facets formed in the semiconductor laser element 1040*a*. In other words, the laser light emission facet where the light intensity of the laser light emitted from the facet is relatively larger is the light emission facet 1045*a*, and the laser light emission facet where the light intensity thereof is relatively smaller is the light-reflecting surface 1045*b*. Note that the light emission facet 1045*a* of the semiconductor element 1040*a* and a facet side of the metallic reflective film 1110 of the submount 1100 are both positioned on the same plane.

Also, another semiconductor element 1040*b* is assembled into a predetermined region of the top surface of the submount 1100. In this third example, the semiconductor element 1040*b* is a monitoring photodiode (PD). The semiconductor element 1040*b* is formed on the submount 1100 in such a manner that a light-receiving surface 1046 of the semiconductor element 1040*b* is exposed on a top surface side of the submount 1100. The light-receiving surface of the semiconductor element 1040*b* can receive the laser light emitted from a light-reflecting surface 1045*b* side of the semiconductor element 1040*a*.

The semiconductor element 1040*b* has an electrode 1048 connected to a p-type region and an n-type region 1049, and the n-type region 1049 is electrically connected to a top surface of the protrusion 1032*a* located on a lower surface side of the submount 1100. In other words, both the n-side electrode of the semiconductor element 1040*a* and the n-type region 1049 of the semiconductor element 1040*b* are electrically connected to the protrusion 1032*a*. Also, an electrode connected to a p-type region of the semiconductor element 1040*b* and the top surface a protrusion 1032*c* are connected to each other by a wire bonding using a gold wire 1104*c*.

The support member 1050 according to the third example is formed of a Si(100) substrate having a main surface (top face) tilted about 9.7 degrees relative to a (100) plane. In the third example, anisotropic etching is performed on the Si(100) substrate using TMAH (tetramethylammonium hydroxide solution), thereby forming four inner wall surfaces 1052*a*, 1052*b*, 1052*c* and 1052*d*. In other words, an opening 1054 surrounded by the inner wall surfaces 1052*a*, 1052*b*, 1052*c* and 1052*d* are formed. The inner wall surfaces 1052*a* and 1052*b* are provided counter to each other, with the semiconductor laser element 1040*a* disposed therebetween, along the cavity direction of the semiconductor element 1040*a*. The inner wall surfaces 1052*c* and 1052*d* are provided counter to each other in the width direction (in a direction orthogonal to the cavity direction) of the semiconductor laser element 1040*a*. The inner wall surface 1052*a* is tilted at an inclination angle $\alpha$ of about 45 degrees relative to the main surface of the insulating resin layer 1020. The inner wall surface 1052*b* is tilted at an inclination angle $\beta$ of about 64.4 degrees relative to the main surface of the insulating resin layer 1020. The inner wall surface 1052*c* and the inner wall surface 1052*d* are each tilted at an inclination angle of about 54.7 degrees relative to the main surface of the insulating resin layer 1020.

As shown in FIG. 38, in the present embodiment, a metallic reflective film 1110 having a thickness ranging from about 100 nm to about 500 nm is formed on top of the inner wall surface 1052 in an approximately central region thereof. The metallic reflective film 1110 is formed of a material, such as Ag or Al, having a high reflectivity. The metallic reflective film 1110 may be film-formed using the evaporation method or sputtering method.

The sealing member 1060 is placed on support member 1050 in such a manner as to block the opening 1054 provided in the support member 1050. By employing this structure, the space where the semiconductor element 1040*a* and the semiconductor element 1040*b* are placed are sealed air-tightly. In the present embodiment, the sealing member 1060 has a translucency. More specifically, the sealing member 1060 is formed of a plate-like (flat) sealing glass made of a borosilicate glass (hard glass) having a thickness of about 500 μm. The planar shape of the sealing glass 1060 is approximately identical to the outer shape of the support member 1050.

In the semiconductor laser device 1010 according to the present example, the laser light emitted from the light emission facet 1045 of the semiconductor element 1040*a* is reflected upward by the metallic reflective film 1110 provided in the inner wall surface 1052*a* of the support member 1050. The laser light reflected by the metallic reflective film 1110 transmits through the sealing member 1060 so as to be emitted to the outside.

By employing the semiconductor device according to the present example, a semiconductor device where the semiconductor laser element is sealed air-tightly is achieved. In the present example, the air-tightly sealed semiconductor element 1040*a* and semiconductor element 1040*b* are electrically connected to the solder ball 1080, which functions as an external connection terminal, via the bump 1032 integrally formed with the wiring layer 1030. Thus, a high-cost process for forming the through-hole in the wiring substrate in the conventional practice is no longer required, so that the manufacturing cost of the semiconductor device 1010 (semiconductor laser device) can be reduced while the size thereof is reduced.

The present invention is not limited to the above-described embodiments and examples, and it is understood by those skilled in the art that various modifications such as changes in design may be made based on their knowledge and the embodiments and example added with such modifications are also within the scope of the present invention.

For example, the element electrode 1042 provided in the semiconductor element 1040 is connected to the bump 1032*t* by a wire bonding, in the above-described Example 1 and Example 2. In a modification, the element electrode 1042 and the bump 1032 may be flip-chip connected to each other in a manner such that an electrode forming face of the semiconductor element 1040 is placed downward.

What is claimed is:

1. A semiconductor device, comprising:
   an insulating resin layer;
   a wiring layer disposed on one main surface of said insulating resin layer;
   a bump protruding on a side of said insulating resin layer, the bump being formed integrally with said wiring layer;

a semiconductor element in which an element electrode electrically connected to said bump is formed;

a support member having an opening formed such that at least said semiconductor element is exposed, said support member disposed on the other main surface of said insulating resin layer; and a sealing member provided on said support member in such a manner as to block the opening, wherein a space is provided between an inner wall of the support member and a side surface of the semiconductor element, and a space in the opening in which the semiconductor element is placed is air-tightly sealed by the sealing member, wherein said semiconductor device is a laser element, and said sealing member has translucency, wherein a laser light emitted from the laser element is reflected by inner wall surface of said support member or a film provided on the inner wall surface and transmits through said sealing member.

2. The semiconductor device according to claim 1, wherein said semiconductor element is provided on top of said bump.

3. The semiconductor device according to claim 1, wherein at least a part of top surface of said bump overlaps with an underside of said support member near the opening.

4. The semiconductor device according to claim 2, wherein at least a part of top surface of said bump overlaps with an underside of said support member near the opening.

5. The semiconductor device according to claim 1, wherein said support member has an inner wall surface which is tilted relative to the main surface of said insulating resin layer.

6. The semiconductor device according to claim 2, wherein said support member has an inner wall surface which is tilted relative to the main surface of said insulating resin layer.

7. The semiconductor device according to claim 2, wherein said semiconductor device is a laser element, and said sealing member has translucency.

8. The semiconductor device according to claim 7, wherein a laser light emitted from the laser element is reflected by inner wall surface of said support member or a film provided on the inner wall surface and transmits through said sealing member.

9. The semiconductor device according to claim 1, wherein the support member and the sealing member are separate members.

10. A semiconductor device, comprising:

an insulating resin layer;

a wiring layer disposed on one main surface of said insulating resin layer;

a bump protruding on a side of said insulating resin layer, the bump being formed integrally with said wiring layer;

a semiconductor element in which an element electrode electrically connected to said bump is formed;

a support member having an opening formed such that at least said semiconductor element is exposed, said support member disposed on the other main surface of said insulating resin layer; and a sealing member provided on said support member in such a manner as to block the opening, wherein the an underside of the semiconductor element is in contact with a top surface of the bump, wherein said semiconductor device is a laser element, and said sealing member has translucency, wherein a laser light emitted from the laser element is reflected by inner wall surface of said support member or a film provided on the inner wall surface and transmits through said sealing member.

* * * * *